US011587968B2

(12) United States Patent
Ohura et al.

(10) Patent No.: US 11,587,968 B2
(45) Date of Patent: Feb. 21, 2023

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventors: Masashi Ohura, Tokyo (JP); Shin Iwabuchi, Kanagawa (JP); Atsushi Okuyama, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 227 days.

(21) Appl. No.: 16/758,553

(22) PCT Filed: Oct. 26, 2018

(86) PCT No.: PCT/JP2018/039814
§ 371 (c)(1),
(2) Date: Apr. 23, 2020

(87) PCT Pub. No.: WO2019/093151
PCT Pub. Date: May 16, 2019

(65) Prior Publication Data
US 2020/0350346 A1 Nov. 5, 2020

(30) Foreign Application Priority Data
Nov. 9, 2017 (JP) .............................. JP2017-216077

(51) Int. Cl.
*H01L 27/30* (2006.01)
*H01L 27/146* (2006.01)

(52) U.S. Cl.
CPC ........ *H01L 27/1463* (2013.01); *H01L 27/307* (2013.01)

(58) Field of Classification Search
CPC ............. H01L 27/1464; H01L 27/1463; H01L 27/14614; H01L 27/14603;
(Continued)

(56) References Cited

U.S. PATENT DOCUMENTS

2014/0054662 A1* 2/2014 Yanagita ............. H01L 27/1462
438/73
2016/0211288 A1 7/2016 Yanagita et al.
(Continued)

FOREIGN PATENT DOCUMENTS

JP 2007311648 A 11/2007
JP 2013-175494 9/2013
(Continued)

OTHER PUBLICATIONS

Merriam-Websteer OnLine Definition of Protrude. No Date.*
(Continued)

*Primary Examiner* — Hrayr A Sayadian
(74) *Attorney, Agent, or Firm* — Sheridan Ross P.C.

(57) ABSTRACT

The present technology relates to a solid-state imaging device capable of suppressing deterioration in dark characteristics, and an electronic apparatus. The device includes a photoelectric conversion section; a trench between the photoelectric conversion sections in adjacent pixels; and a PN junction region on a sidewall of the trench and including a P-type region and an N-type region, the P-type region having a protruding region. The device can include an inorganic photoelectric conversion section having a pn junction and an organic photoelectric conversion section having an organic photoelectric conversion film that are stacked in a depth direction within a same pixel; and a PN junction region on a sidewall of the inorganic photoelectric conversion section. The PN junction region can further include a first P-type region and an N-type region; and a second P-type
(Continued)

region. The present technology can be applied to, for example, a back-illuminated CMOS image sensor.

5 Claims, 53 Drawing Sheets

(58) Field of Classification Search
CPC ........... H01L 27/14689; H01L 27/1469; H01L 21/76; H01L 27/1461; H01L 27/14647; H01L 27/307; H01L 27/14667; H01L 27/14636; H01L 27/14634; H04N 5/361; H04N 5/369
USPC .......................................................... 257/40
See application file for complete search history.

(56) References Cited

U.S. PATENT DOCUMENTS

| | | |
|---|---|---|
| 2016/0336372 A1 | 11/2016 | Yanagita et al. |
| 2017/0170217 A1 | 6/2017 | Yanagita et al. |
| 2017/0271385 A1 | 9/2017 | Yanagita et al. |
| 2018/0240847 A1* | 8/2018 | Ota ........................ H04N 5/359 |
| 2019/0043901 A1* | 2/2019 | Honda .................. H01L 27/146 |
| 2022/0020799 A1* | 1/2022 | Uchida ............... H01L 27/1463 |

FOREIGN PATENT DOCUMENTS

| | | | |
|---|---|---|---|
| JP | 2015153772 A | 8/2015 | |
| JP | 2015-162603 | 9/2015 | |
| WO | WO 2016/143531 | 9/2016 | |
| WO | WO 2017/187957 | 11/2017 | |
| WO | WO-2017187957 A1 * | 11/2017 | ............. H01L 21/76 |
| WO | WO-2018163838 A1 * | 9/2018 | ....... H01L 27/14614 |

OTHER PUBLICATIONS

International Search Report and Written Opinion prepared by the Japanese Patent Office dated Dec. 27, 2018, for International Application No. PCT/JP2018/039814.

* cited by examiner

FIG. 37
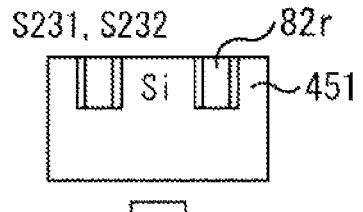
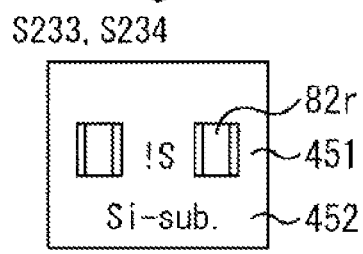
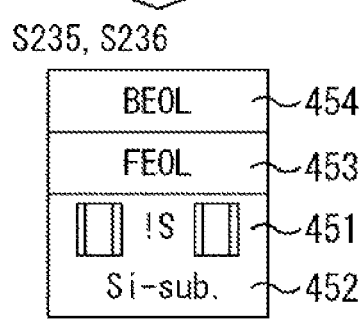
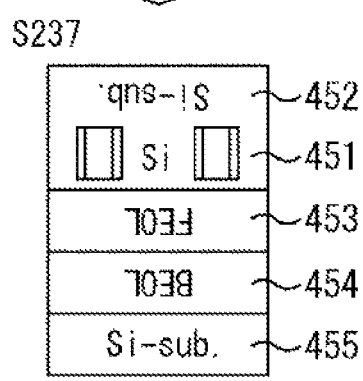
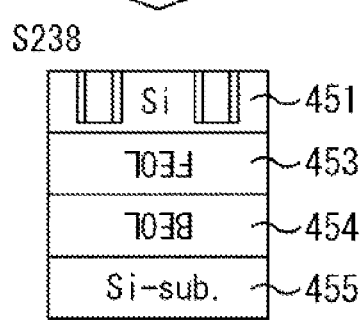

FIG. 39
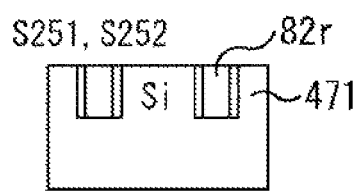
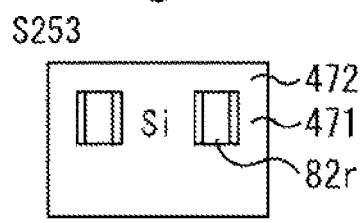
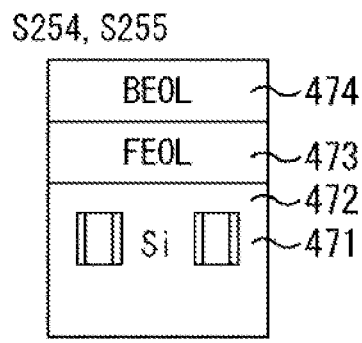
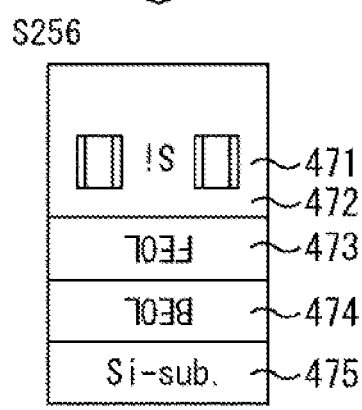
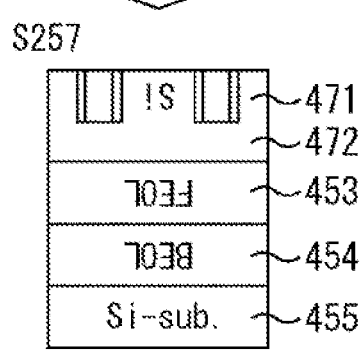

SOLID-STATE IMAGING DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2018/039814 having an international filing date of 26 Oct. 2018, which designated the United States, which PCT application claimed the benefit of Japanese Patent Application No. 2017-216077 filed 9 Nov. 2017, the entire disclosures of each of which are incorporated herein by reference.

TECHNICAL FIELD

The present technology relates to a solid-state imaging device and an electronic apparatus, and more particularly to a solid-state imaging device and an electronic apparatus in which a P-type solid-phase diffusion layer and an N-type solid-phase diffusion layer are formed on a sidewall of an inter-pixel light-shielding wall formed between pixels such that a strong electric field region is formed to retain electric charge and a saturation charge amount Qs of each pixel is thus increased.

BACKGROUND ART

Traditionally, there is known a technology in which, for the purpose of increasing a saturation charge amount Qs of each pixel of a solid-state imaging device, a P-type diffusion layer and an N-type diffusion layer are formed on a sidewall of a trench formed between pixels for forming a strong electric field region to retain electric charge (for example, see Patent Document 1).

CITATION LIST

Patent Document

Patent Document 1: Japanese Patent Application Laid-Open No. 2015-162603

SUMMARY OF THE INVENTION

Problems to be Solved by the Invention

However, in the structure disclosed in Patent Document 1, pinning on the light entrance side of a silicon (Si) substrate weakens. As a result, generated electric charge flows into a photodiode, which may deteriorate dark characteristics. For example, white spot may appear or dark current may be generated.

The present technology has been made in view of the above circumstances, and is intended to suppress deterioration in dark characteristics.

Solutions to Problems

A solid-state imaging device according to one aspect of the present technology includes: a photoelectric conversion section that performs photoelectric conversion; a trench that penetrates a semiconductor substrate in a depth direction and that is formed between the photoelectric conversion sections provided in adjacent pixels; and a PN junction region formed on a sidewall of the trench, the PN junction region including a P-type region and an N-type region, in which the P-type region has a protruding region protruding to a lower side of the N-type region.

A first electronic apparatus according to one aspect of the present technology is equipped with the first solid-state imaging device described above.

A second solid-state imaging device according to one aspect of the present technology includes: an inorganic photoelectric conversion section having a pn junction, and an organic photoelectric conversion section having an organic photoelectric conversion film, the inorganic photoelectric conversion section and the organic photoelectric conversion section being stacked in a depth direction from a light-receiving surface side within a same pixel; and a PN junction region formed on a sidewall of the inorganic photoelectric conversion section, the PN junction region including a P-type region and an N-type region.

A second electronic apparatus according to one aspect of the present technology is equipped with the second solid-state imaging device described above.

A third solid-state imaging device according to one aspect of the present technology includes: a photoelectric conversion section that performs photoelectric conversion; a trench formed in a semiconductor substrate without penetrating the semiconductor substrate; a PN junction region formed on a sidewall of the trench, the PN junction region including a first P-type region and an N-type region; and a second P-type region formed on a light-receiving surface side of the photoelectric conversion section.

A third electronic apparatus according to one aspect of the present technology is equipped with the third solid-state imaging device described above.

The first solid-state imaging device according to one aspect of the present technology includes: a photoelectric conversion section that performs photoelectric conversion; a trench that penetrates a semiconductor substrate in a depth direction and that is formed between the photoelectric conversion sections provided in adjacent pixels; and a PN junction region formed on a sidewall of the trench, the PN junction region including a P-type region and an N-type region, in which the P-type region has a protruding region protruding to a lower side of the N-type region.

The first electronic apparatus according to one aspect of the present technology is equipped with the first solid-state imaging device.

The second solid-state imaging device according to one aspect of the present technology includes: an inorganic photoelectric conversion section having a pn junction, and an organic photoelectric conversion section having an organic photoelectric conversion film, the inorganic photoelectric conversion section and the organic photoelectric conversion section being stacked in a depth direction from a light-receiving surface side within a same pixel; and a PN junction region formed on a sidewall of the inorganic photoelectric conversion section, the PN junction region including a P-type region and an N-type region.

The second electronic apparatus according to one aspect of the present technology is equipped with the second solid-state imaging device.

The third solid-state imaging device according to one aspect of the present technology includes: a photoelectric conversion section that performs photoelectric conversion; a trench formed in a semiconductor substrate without penetrating the semiconductor substrate; a PN junction region formed on a sidewall of the trench, the PN junction region including a first P-type region and an N-type region; and a second P-type region formed on a light-receiving surface side of the photoelectric conversion section.

The third electronic apparatus according to one aspect of the present technology is equipped with the third solid-state imaging device.

Effects of the Invention

According to the present technology, deterioration in dark characteristics can be prevented.

Note that the effects described herein are not necessarily limitative, and any of the effects described in the present disclosure may be exhibited.

BRIEF DESCRIPTION OF DRAWINGS

FIG. 37 is a view for describing the second manufacturing process of a pixel.

FIG. 39 is a view for describing the third manufacturing process of a pixel.

FIG. 45 is a plan view showing a configuration example in a case where two pixels share an FD and the like.

MODE FOR CARRYING OUT THE INVENTION

Hereinafter, the best mode for carrying out the present technology (hereinafter, referred to as an embodiment) will be described in detail with reference to the drawings.

Since the present technology can be applied to an imaging device, a case in which the present technology is applied to an imaging device will be described here as an example. Note that, here, the description will be given by taking an imaging device as an example, but the present technology is not limited to being applied to an imaging device, and is applicable to electronic apparatus in general which uses an imaging device for an image capturing section (photoelectric conversion section), such as: an imaging device including a digital still camera, a video camera, and the like; a mobile terminal device having an imaging function such as a mobile phone; and a copier that uses an imaging device for an image reader. It should be noted that a module-type configuration mounted on an electronic apparatus, that is, a camera module, may be defined as an imaging device.

Figure 1:
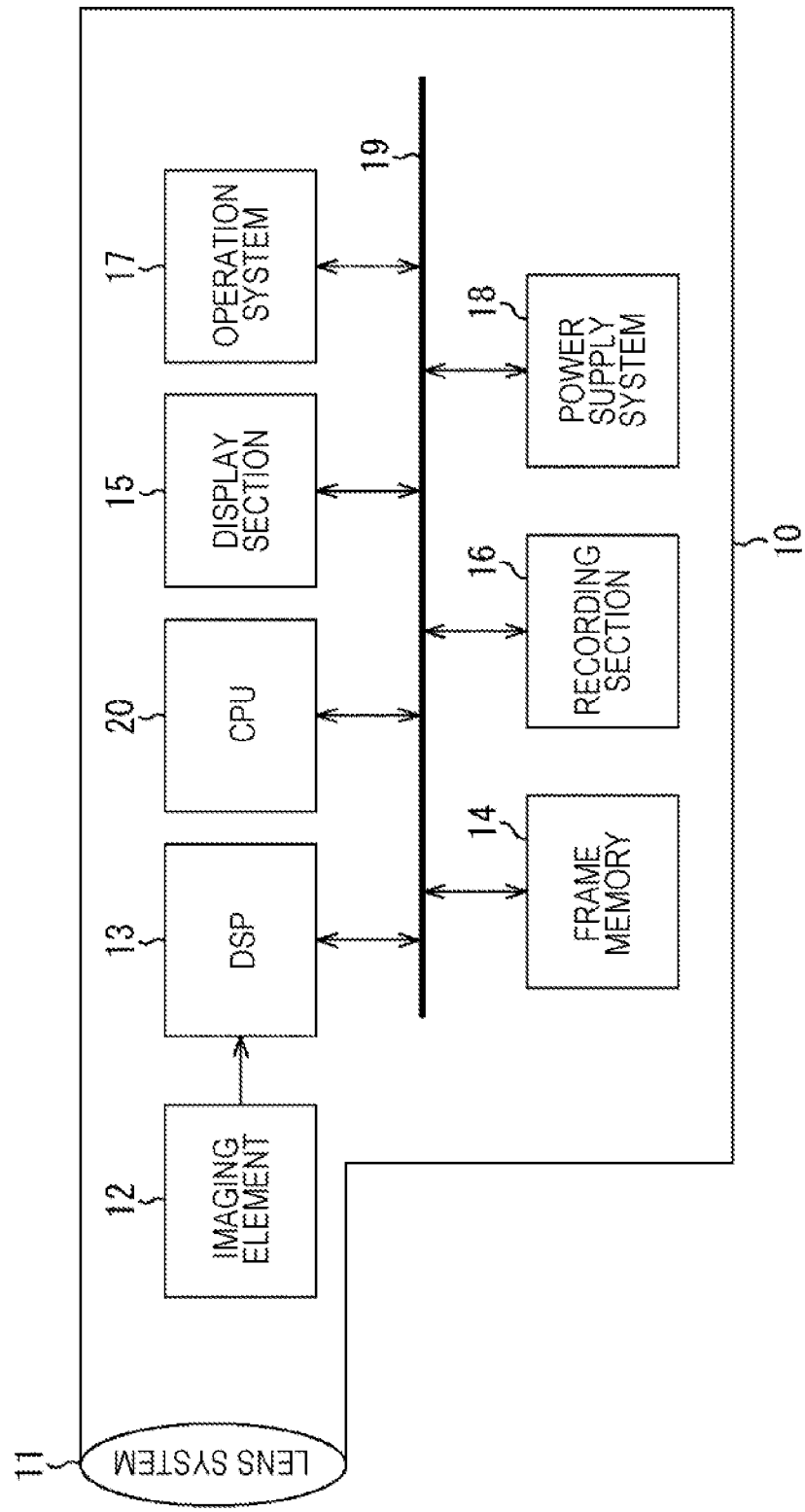
FIG. 1 is a diagram showing a configuration example of an imaging device.

FIG. 1 is a block diagram illustrating a configuration example of an imaging device that is an example of an electronic apparatus according to the present disclosure. As shown in FIG. 1, an imaging device 10 includes an optical system including a lens group 11 and the like, an imaging element 12, a DSP circuit 13 serving as a camera signal processor, a frame memory 14, a display section 15, a recording section 16, an operation system 17, a power supply system 18, and the like.

Then, in this configuration, the DSP circuit 13, the frame memory 14, the display section 15, the recording section 16, the operation system 17, and the power supply system 18 are interconnected via a bus line 19. A CPU 20 controls each section in the imaging device 10.

The lens group 11 captures incident light (image light) from a subject and forms an image on an imaging surface of the imaging element 12. The imaging element 12 converts the amount of incident light formed into an image on the imaging surface by the lens group 11 into an electric signal on a pixel-by-pixel basis and outputs the electric signal as a pixel signal. As the imaging element 12, an imaging element (image sensor) including pixels described below can be used.

The display section 15 includes a panel-type display section such as a liquid crystal display section or an organic electro luminescence (EL) display section, and displays a moving image or a still image captured by the imaging element 12. The recording section 16 records the moving image or the still image captured by the imaging element 12 on a recording medium such as a video tape or a digital versatile disk (DVD).

The operation system 17 issues operation commands for various functions of the imaging device according to an operation performed by a user. The power supply system 18 appropriately supplies various power supplies, which are operation power supplies for the DSP circuit 13, the frame memory 14, the display section 15, the recording section 16, and the operation system 17, to these power supply targets.

<Configuration of Imaging Element>

Figure 2:
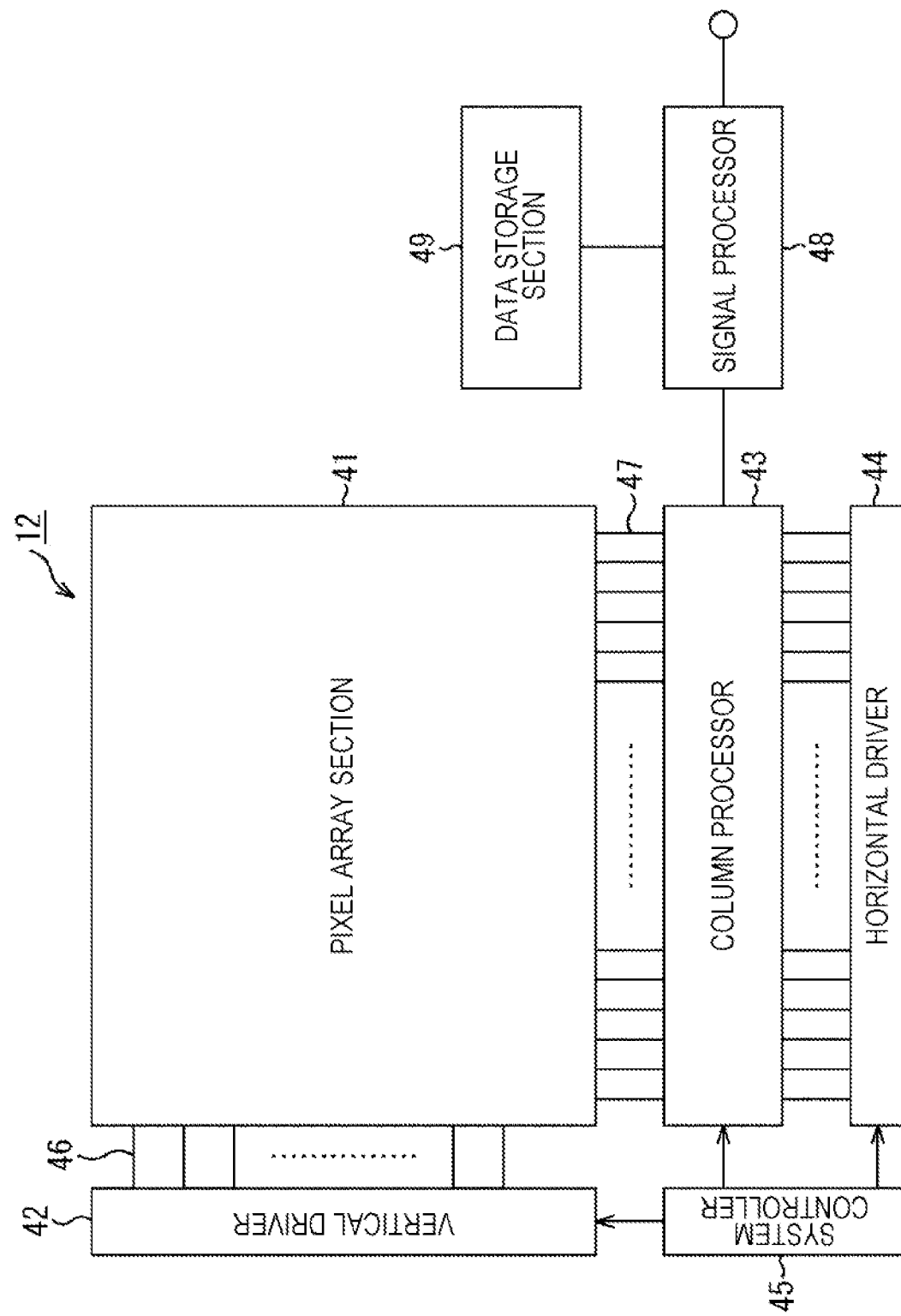
FIG. 2 is a diagram showing a configuration example of an imaging element.

FIG. 2 is a block diagram showing a configuration example of the imaging element 12. The imaging element 12 can be a complementary metal oxide semiconductor (CMOS) image sensor.

The imaging element 12 includes a pixel array section 41, a vertical driver 42, a column processor 43, a horizontal driver 44, and a system controller 45. The pixel array section 41, the vertical driver 42, the column processor 43, the horizontal driver 44, and the system controller 45 are formed on a semiconductor substrate (chip) not shown.

In the pixel array section 41, unit pixels (for example, the pixel 50 in FIG. 3) are two-dimensionally arrayed in a matrix, each unit pixel having a photoelectric conversion element that generates photoelectric charges in an amount corresponding to the amount of incident light and stores the generated photoelectric charges therein. Note that, in the following, photoelectric charges in an amount corresponding to the amount of incident light may be simply referred to as "electric charges", and the unit pixel may be simply referred to as "pixel".

The pixel array section 41 is also provided with pixel drive lines 46 and vertical signal lines 47 with respect to the pixels arrayed in a matrix. The pixel drive lines 46 are formed for each row along the horizontal direction (arraying direction of pixels in each pixel row) in the figure, and the vertical signal lines 47 are formed for each column along the vertical direction (arraying direction of pixels in each column) in the figure. One ends of the pixel drive lines 46 are connected to output ends of the vertical driver 42 corresponding to the respective rows.

The imaging element 12 further includes a signal processor 48 and a data storage section 49. The signal processor 48 and the data storage section 49 may be implemented by an external signal processor, for example, a digital signal processor (DSP), provided on a separate substrate from the imaging element 12 or implemented by a process of software, or may be provided on the same substrate as the imaging element 12.

The vertical driver 42 is a pixel driver that includes a shift register, an address decoder, and the like, and that drives all pixels in the pixel array section 41 simultaneously or drives the pixels in the pixel array section 41 on, for example, a row-by-row basis. Although the specific configuration of the vertical driver 42 is not shown, the vertical driver 42 has a configuration including a read scanning system and a sweep scanning system. Alternatively, the vertical driver 42 has a configuration in which a batch sweep and a batch transfer are performed.

The read scanning system selectively scans the unit pixels in the pixel array section 41 sequentially on a row-by-row basis in order to read signals from the unit pixels. In a case of row driving (a rolling shutter operation), when a sweep operation is performed, a sweep scanning operation is performed on a read row which is subjected to a read scanning operation by the read scanning system, prior to the read scanning operation by the time corresponding to a shutter speed. Furthermore, in a case of global exposure (a global shutter operation), a batch sweep operation is performed prior to a batch transfer operation by the time corresponding to a shutter speed.

Due to the sweeping operation described above, unnecessary electric charges are swept (reset) from the photoelectric conversion elements of the unit pixels in the read row. Then, a so-called electronic shutter operation is performed in such a manner that unnecessary electric charges are swept (reset). In this case, the electronic shutter operation means an operation in which photoelectric charges in the photoelectric conversion element are removed and exposure is started anew (accumulation of the photoelectric charges is started).

The signal which is read by the read operation of the read scanning system corresponds to an amount of light which is received immediately before the read operation or received after the electronic shutter operation. In a case of row driving, a period from the reading time by the preceding read operation or the sweeping time by the electronic shutter operation to the reading time by the current read operation is set to an accumulation period (an exposure period) of photoelectric charges in the unit pixel. In a case of the global exposure, a period from a batch sweep to a batch transfer is set to the accumulation period (the exposure period).

Pixel signals output from the unit pixels in the pixel row selectively scanned by the vertical driver 42 are supplied to the column processor 43 through the corresponding vertical signal lines 47. The column processor 43 performs, for each pixel column of the pixel array section 41, a predetermined signal process on pixel signals output from the unit pixels in the selected row through the vertical signal lines 47, and temporarily stores the pixel signals which have been subjected to the predetermined signal process.

Specifically, the column processor 43 performs at least a noise removal process, for example, a correlated double sampling (CDS) process as a signal process. Due to the correlated double sampling by the column processor 43, fixed pattern noise unique to pixels, such as reset noise and variation in threshold value of an amplifier transistor, is removed. Note that the column processor 43 may have, for example, an analog-digital (AD) conversion function in addition to the noise removal function, and output a signal level in digital form.

The horizontal driver 44 includes a shift register, an address decoder, and the like, and selects one by one a unit circuit corresponding to each column of pixels in the column processor 43. Due to the selective scanning by the horizontal driver 44, the pixel signals subjected to the signal process by the column processor 43 are sequentially output to the signal processor 48.

The system controller 45 includes a timing generator that generates various types of timing signals, and the like, and controls drives of the vertical driver 42, the column processor 43, the horizontal driver 44, and the like on the basis of various types of timing signals generated by the timing generator.

The signal processor 48 has at least an addition process function, and performs various signal processes such as an addition process on the pixel signal output from the column processor 43. The data storage section 49 temporarily stores data necessary for the signal process by the signal processor 48.

<Structure of Unit Pixel>

Next, a specific structure of each of the unit pixels 50 arrayed in a matrix in the pixel array section 41 will be described. The pixel 50 described below can reduce a possibility of deterioration in dark characteristics, that is, for example, generation of white spots or occurrence of dark current, which is caused because pinning on the light entrance side of a silicon (Si) substrate (Si substrate 70 in FIG. 3) weakens, and a generated electric charge thus flows into a photodiode (PD 71 in FIG. 3).

<Configuration Example of Pixel According to First Embodiment>

Figure 3:
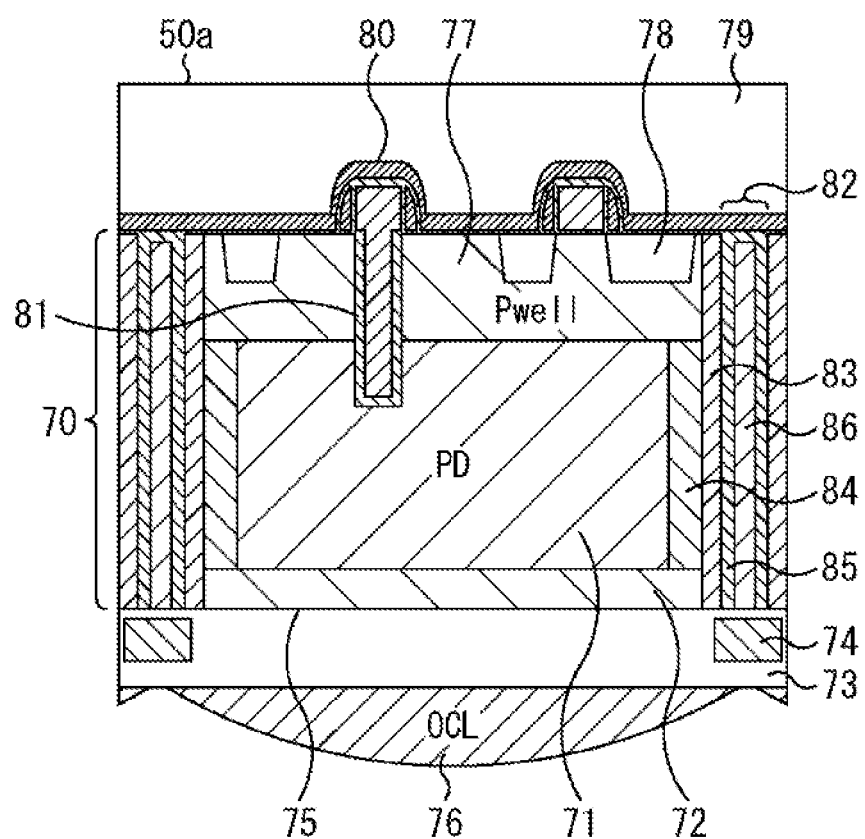
FIG. 3 is a vertical sectional view showing a first configuration example of a pixel to which the present technology is applied.
Figure 4:
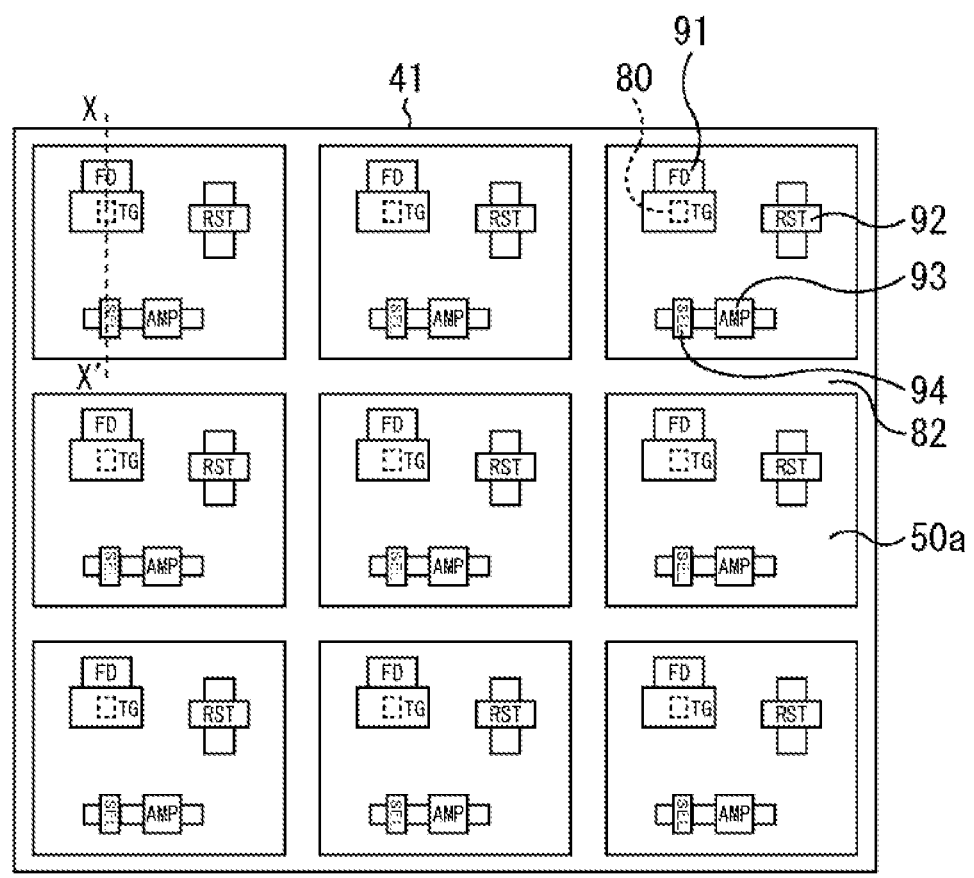
FIG. 4 is a plan view of a front surface side of the pixel to which the present technology is applied according to a first embodiment.

FIG. 3 is a vertical sectional view of a pixel 50a according to the first embodiment of the pixel 50 to which the present technology is applied, and FIG. 4 is a plan view of the front surface side of the pixel 50a. Note that FIG. 3 corresponds to a position along a line X-X' in FIG. 4.

In the following, the pixel 50 will be described as a back-illuminated type as an example. However, the present technology can also be applied to a front-illuminated type.

The pixel 50 shown in FIG. 3 has a photodiode (PD) 71 which is a photoelectric conversion element of each pixel formed inside the Si substrate 70. A P-type region 72 is formed on the light entrance side (in the figure, lower side that is the back surface side) of the PD 71, and a planarized film 73 is formed further below the P-type region 72. The boundary between the P-type region 72 and the planarized film 73 is defined as a backside Si interface 75.

A light-shielding film 74 is formed in the planarized film 73. The light-shielding film 74 is provided to prevent light from leaking into an adjacent pixel, and is formed between adjacent PDs 71. The light-shielding film 74 includes, for example, a metal material such as tungsten (W).

An on-chip lens (OCL) 76 for converging incident light to the PD 71 is formed on the planarized film 73 and on the back surface side of the Si substrate 70. An inorganic material can be used for the OCL 76. For example, SiN, SiO, or SiOxNy ($0<x\le1$, $0<y\le1$) can be used.

Although not shown in FIG. 3, a cover glass or a transparent plate such as a resin plate may be bonded on the OCL 76. Further, although not shown in FIG. 3, a color filter layer may be formed between the OCL 76 and the planarized film 73. Furthermore, in the color filter layer, a plurality of color filters may be provided for each pixel, and the colors of the color filters may be arranged, for example, in a Bayer arrangement.

An active region (Pwell) 77 is formed on the side (in the figure, upper side that is the front surface side) reverse to the light entrance side of the PD 71. In the active region 77, a device isolation region (hereinafter, referred to as shallow trench isolation (STI)) 78 for isolating a pixel transistor or the like is formed.

A wiring layer 79 is formed on the front surface side (upper side in the figure) of the Si substrate 70 and on the active region 77, and a plurality of transistors is formed in the wiring layer 79. FIG. 3 shows an example in which a transfer transistor 80 is formed. The transfer transistor (gate) 80 is a vertical transistor. That is, in the transfer transistor (gate) 80, a vertical transistor trench 81 is opened, and a transfer gate (TG) 80 for reading electric charge from the PD 71 is formed therein.

Further, pixel transistors such as an amplifier (AMP) transistor, a selection (SEL) transistor, and a reset (RST) transistor are formed on the front surface side of the Si substrate 70. The arrangement of these transistors will be described with reference to FIG. 4, and the operation will be described with reference to a circuit diagram in FIG. 5.

A trench is formed between the pixels 50a. This trench is referred to as deep trench isolation (DTI) 82. The DTI 82 is formed between the adjacent pixels 50a, and penetrates the Si substrate 70 in the depth direction (in the figure, vertical direction, that is, a direction from the front surface to the back surface). Further, the DTI 82 also functions as a light-shielding wall between pixels so that unnecessary light does not leak to the adjacent pixels 50a.

A P-type solid-phase diffusion layer 83 and an N-type solid-phase diffusion layer 84 are formed between the PD 71 and the DTI 82 in order from the DTI 82 toward the PD 71. The P-type solid-phase diffusion layer 83 is formed along the DTI 82 so as to be in contact with the backside Si interface 75 of the Si substrate 70. The N-type solid-phase diffusion layer 84 is formed along the DTI 82 so as to be in contact with the P-type region 72 of the Si substrate 70.

It should be noted that the solid-phase diffusion layer refers to a layer in which a P-type layer and an N-type layer generated by impurity doping are formed in accordance with a method to be described later. However, in the present technology, the method is not limited to a solid-phase diffusion method, and a P-type layer and an N-type layer generated by another method, such as ion implantation, may be provided between the DTI 82 and the PD 71. Further, the PD 71 in the embodiment includes an N-type region. The photoelectric conversion is performed in a partial area or entire area of the N-type region.

The P-type solid-phase diffusion layer 83 is formed so as to be in contact with the backside Si interface 75, while the N-type solid-phase diffusion layer 84 does not contact the backside Si interface 75. Therefore, there is a gap between the N-type solid-phase diffusion layer 84 and the backside Si interface 75.

With such a configuration, the PN junction region between the P-type solid-phase diffusion layer 83 and the N-type solid-phase diffusion layer 84 forms a strong electric field region, and retains electric charge generated in the PD 71. According to such a configuration, the P-type solid-phase diffusion layer 83 and the N-type solid-phase diffusion layer 84 formed along the DTI 82 form a strong electric field region, and can retain electric charge generated in the PD 71.

In a case where the N-type solid-phase diffusion layer 84 is formed along the DTI 82 so as to be in contact with the backside Si interface 75 of the Si substrate 70, pinning of electric charge weakens in the portion where the N-type solid-phase diffusion layer 84 is in contact with the backside Si interface 75 of the Si substrate 70 on the light entrance surface side, resulting in that the generated electric charge flows into the PD 71. As a result, dark characteristics may deteriorate. For example, a white spot may appear, or a dark current may occur.

However, in the pixel 50a shown in FIG. 3, the N-type solid-phase diffusion layer 84 does not contact the backside Si interface 75 of the Si substrate 70, and is formed along the DTI 82 so as to be in contact with the P-type region 72 of the Si substrate 70. With such a configuration, it is possible to prevent weakening of the pinning of electric charge, and therefore, deterioration in dark characteristics due to the electric charge flowing into the PD 71 can be prevented.

In addition, in the pixel 50a shown in FIG. 3, a sidewall film 85 including SiO2 is formed on the inner wall of the DTI 82, and a filler 86 including polysilicon is embedded inside the sidewall film 85.

The pixel 50a according to the first embodiment has a configuration in which the P-type region 72 is provided on the back surface side, and the PD 71 and the N-type solid-phase diffusion layer 84 do not exist near the backside Si interface 75. As a result, weakening of pinning near the backside Si interface 75 does not occur. Therefore, deterioration in dark characteristics due to the electric charge flowing into the PD 71 can be prevented.

Note that, regarding the DTI 82, SiN may be used for the sidewall film 85 instead of SiO2. Further, doping polysilicon may be used instead of polysilicon used for the filler 86. In a case of being filled with doping polysilicon or in a case of being doped with an N-type or P-type impurity after being filled with polysilicon, application of a negative bias to the resultant filler makes it possible to strengthen pinning on the sidewall of the DTI 82, and thus, the dark characteristics can be further improved.

Figure 5:
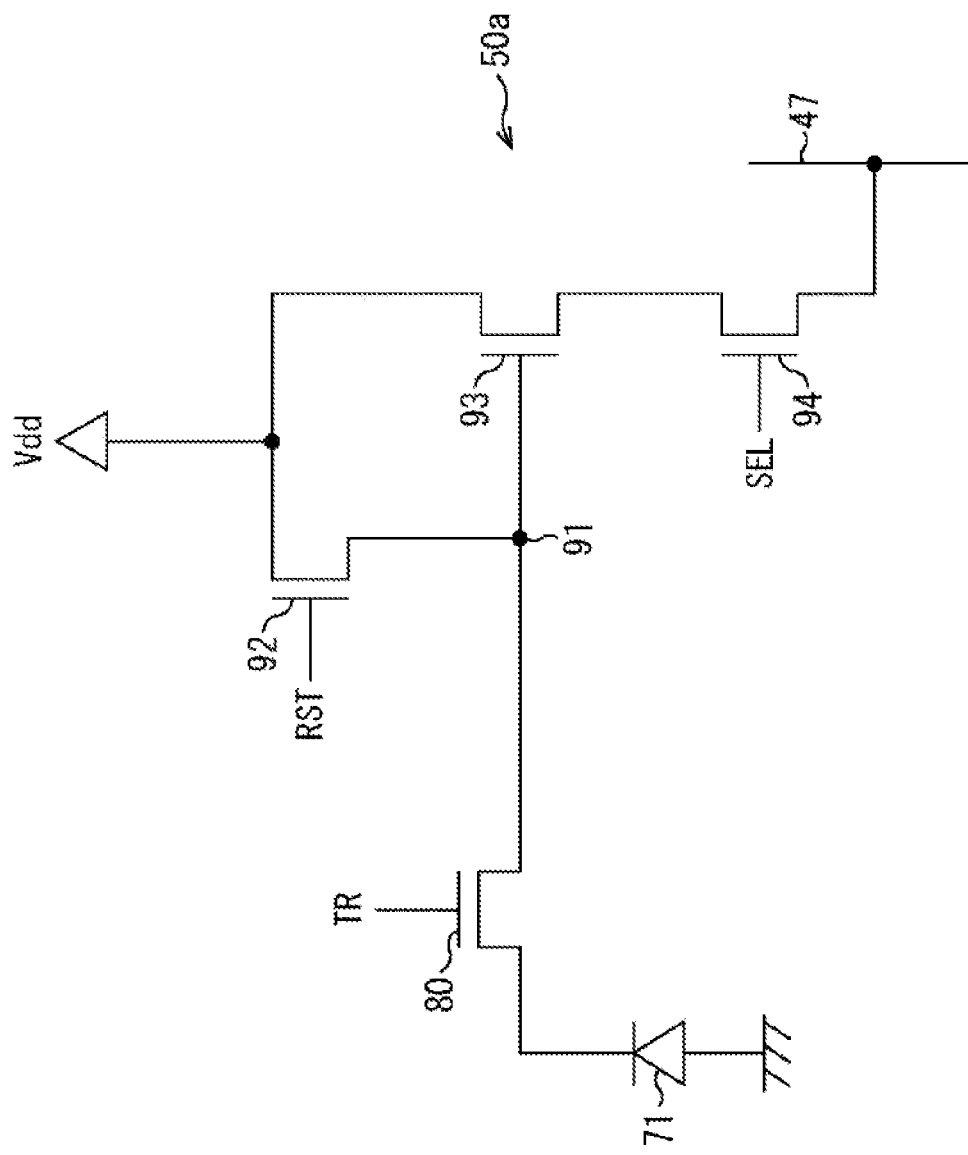
FIG. 5 is a circuit diagram of the pixel.

The arrangement of transistors formed in the pixel 50a and the operation of each transistor will be described with reference to FIGS. 4 and 5. FIG. 4 is a plan view of nine pixels 50a in 3×3 array in the pixel array section 41 (FIG. 2) when viewed from the front surface side (upper side in FIG. 3), and FIG. 5 is a circuit diagram for describing a connection relationship between the transistors shown in FIG. 4.

In FIG. 4, one rectangle represents one pixel 50a. As shown in FIG. 4, the DTI 82 is formed so as to surround the pixels 50a (the PDs 71 included in the pixels 50a). Further, a transfer transistor (gate) 80, a floating diffusion (FD) 91, a reset transistor 92, an amplifier transistor 93, and a selection transistor 94 are formed on the front surface of the pixel 50a.

The PD 71 generates and accumulates electric charges (signal charges) corresponding to an amount of received light. The PD 71 has an anode terminal grounded and a cathode terminal connected to the FD 91 via the transfer transistor 80.

When turned on by a transfer signal TR, the transfer transistor 80 reads the electric charge generated in the PD 71 and transfers the generated electric charge to the FD 91.

The FD 91 retains the electric charge read from the PD 71. The reset transistor 92 resets the potential of the FD 91 by discharging electric charges accumulated in the FD 91 to a drain (constant voltage source Vdd), when turned on by a reset signal RST.

The amplifier transistor 93 outputs a pixel signal according to the potential of the FD 91. That is, the amplifier transistor 93 constitutes a source follower circuit with a load MOS (not shown) as a constant current source connected via a vertical signal line 33, and a pixel signal indicating a level according to the electric charge accumulated in the FD 91 is output to the column processor 43 (FIG. 2) from the amplifier transistor 93 via the selection transistor 94 and the vertical signal line 47.

The selection transistor 94 is turned on when the pixel 31 is selected by a selection signal SEL, and outputs the pixel signal of the pixel 31 to the column processor 43 via the vertical signal line 33. The signal lines to which the transfer signal TR, the selection signal SEL, and the reset signal RST are transmitted correspond to the pixel drive lines 46 in FIG. 2.

The pixel 50a can be configured as described above, but is not limited to having the above configuration. The pixel 50a may have another configuration.

<Manufacturing Method of DTI 82 and Periphery Thereof>

Figure 6:
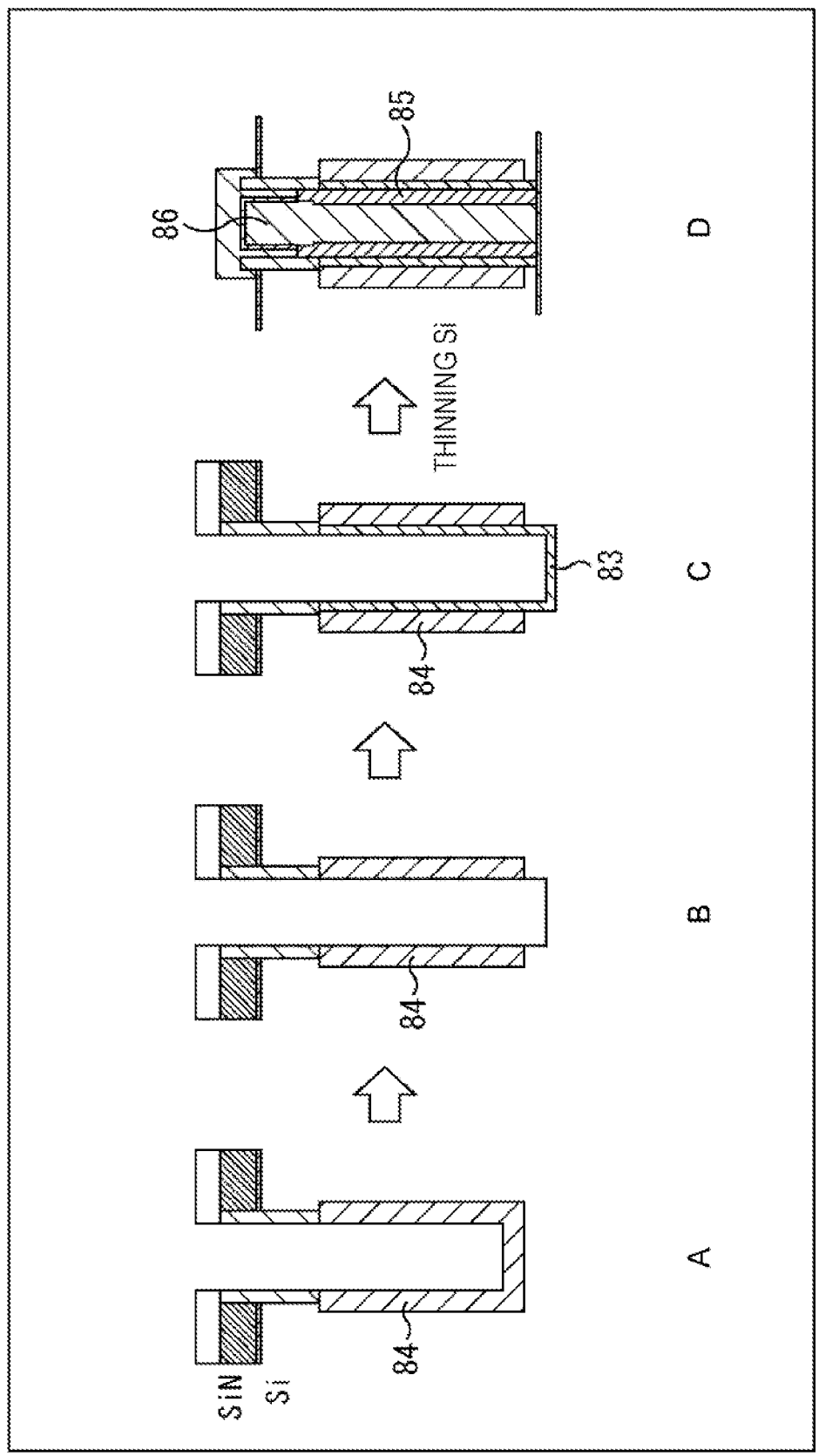
FIG. 6 is a diagram for describing a manufacturing method of a DTI 82 and a periphery thereof.

FIG. 6 is a diagram for describing a manufacturing method of the DTI 82 and a periphery thereof.

As shown in A of FIG. 6, when the DTI 82 is opened in the Si substrate 70, an area other than the position where the DTI 82 is to be formed on the Si substrate 70 is covered with a hard mask using SiN and SiO2, and the area not covered with the hard mask is dry etched. Thus, a groove is opened to a predetermined depth of the Si substrate 70 in the vertical direction.

Next, an SiO2 film containing phosphorus (P), which is an N-type impurity, is formed on the inner side of the opened groove, and then a heat treatment is performed to dope a portion from the SiO2 film into the Si substrate 70 with phosphorus (P) (hereinafter referred to as solid-phase diffusion).

Then, as shown in B of FIG. 6, after the SiO2 film containing P formed inside the opened groove is removed, a heat treatment is again performed to diffuse phosphorus (P) to the inside of the Si substrate 70. Thus, the N-type solid-phase diffusion layer 84 self-aligned to the current groove shape is formed. Thereafter, the bottom part of the groove is dry etched, whereby the groove is extended in the depth direction.

Next, as shown in C of FIG. 6, an SiO2 film containing boron (B), which is a P-type impurity, is formed inside the extended groove, and then, a heat treatment is performed. With this treatment, boron (B) is diffused from the SiO2 film toward the Si substrate 70 by solid-phase diffusion, whereby the P-type solid-phase diffusion layer 83 self-aligned to the shape of the extended groove is formed.

Thereafter, the SiO2 film containing boron (B) formed on the inner wall of the groove is removed.

Next, as shown in D of FIG. 6, a sidewall film 85 including SiO2 is formed on the inner wall of the opened groove and filled with polysilicon. Thus, the DTI 82 is formed. Thereafter, pixel transistors and wires are formed. Then, the Si substrate 70 is thinned from the back surface side. When the Si substrate 70 is thinned, the bottom of the DTI 82 including the P-type solid-phase diffusion layer 83 is simultaneously thinned. The thinning process is performed to a depth not reaching the N-type solid-phase diffusion layer 84.

Through the above steps, the strong electric field region constituted by the N-type solid-phase diffusion layer 84 not in contact with the backside Si interface 75 and the P-type solid-phase diffusion layer 83 in contact with the backside Si interface 75 can be formed adjacent to the PD 71.

Second Embodiment

Figure 7:
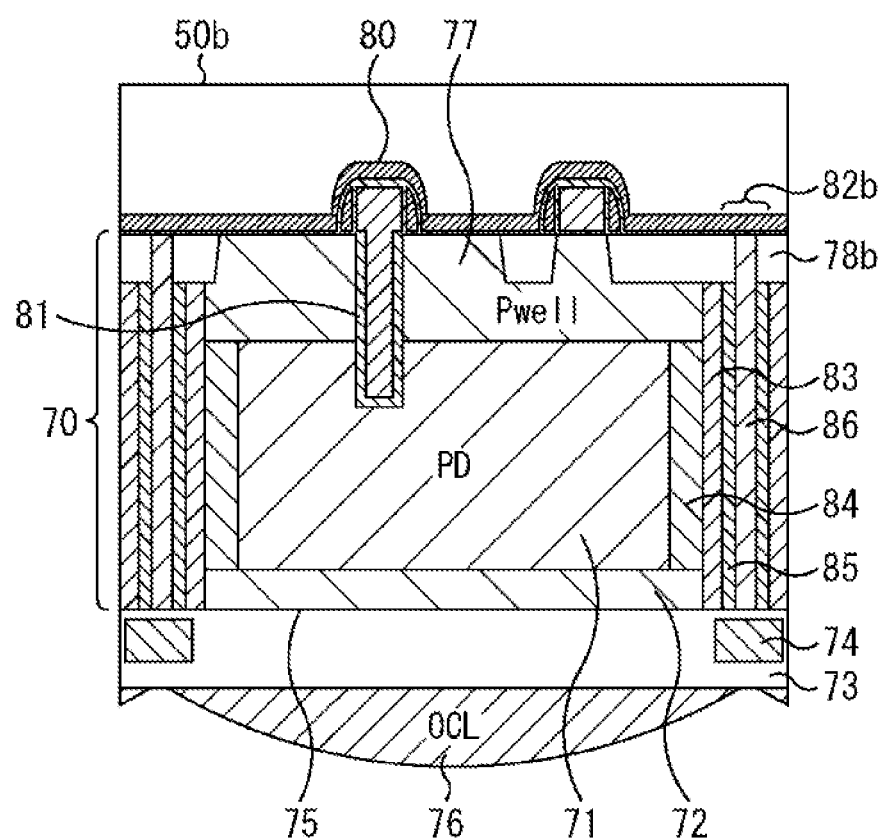
FIG. 7 is a vertical sectional view showing a second configuration example of the pixel to which the present technology is applied.

FIG. 7 is a vertical sectional view of a pixel 50*b* according to a second embodiment to which the present technology is applied.

The second embodiment is different from the first embodiment in that the DTI 82 is formed in the STI 78, and is similar to the first embodiment in the other configurations. Therefore, the portions similar to those in the first embodiment are denoted by the same reference signs, and the description thereof will be omitted as appropriate. In the following description of the pixel 50, the same portions as those of the pixel 50*b* in the first embodiment are denoted by the same reference signs, and the description thereof will be omitted as appropriate.

In the pixel 50*b* shown in FIG. 7, an STI 78*b* formed in the active region 77 is formed up to the portion where a DTI 82*b* is formed (up to the end of the pixel 50*b*). Then, the DTI 82*b* is formed under the STI 78*b*.

In other words, the STI 78*b* is formed at the portion where the DTI 82*b* is formed, and the STI 78*b* and the DTI 82*b* are formed at positions where the STI 78*b* and the DTI 82*b* are in contact with each other.

With such a formation, it is possible to reduce the size of the pixel 50*b* as compared with a case where the STI 78*b* and the DTI 82*b* are formed at different positions (for example, the pixel 50*a* (FIG. 3) in the first embodiment).

The pixel 50*b* according to the second embodiment can also provide an effect similar to that of the pixel 50*a* according to the first embodiment, that is, an effect of preventing deterioration in dark characteristics.

Third Embodiment

Figure 8:
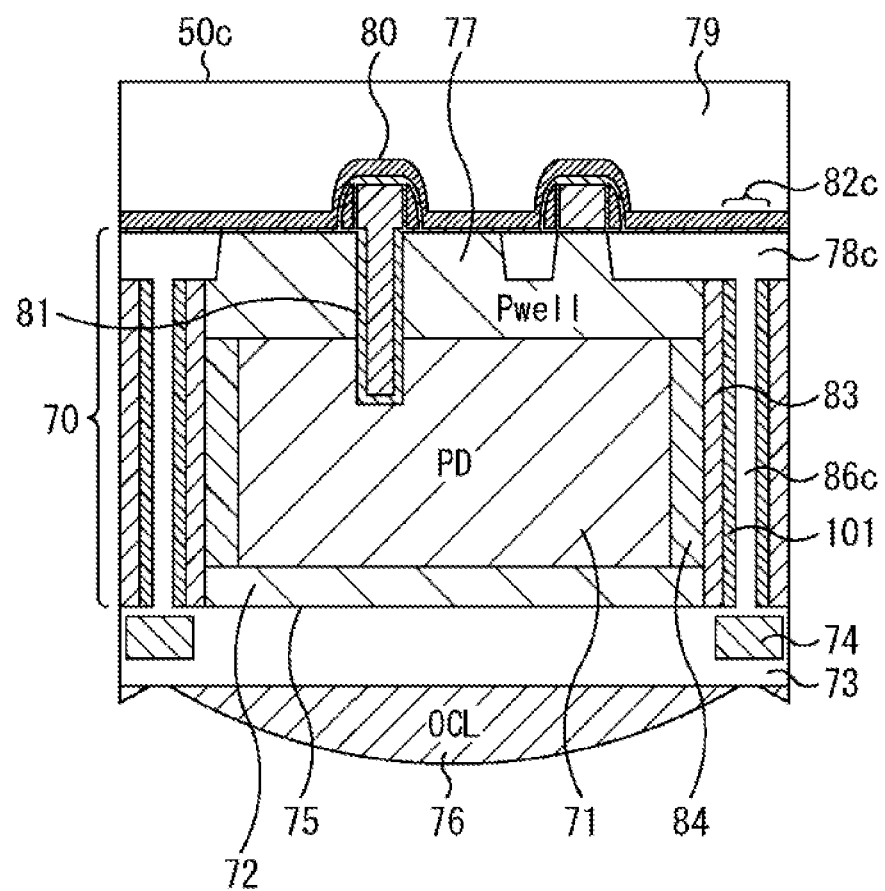
FIG. 8 is a vertical sectional view showing a third configuration example of the pixel to which the present technology is applied.

FIG. 8 is a vertical sectional view of a pixel 50*c* according to a third embodiment to which the present technology is applied.

The third embodiment is different from the pixels 50*a* and 50*b* in the first and second embodiments in that a film 101 having a negative fixed charge is formed on the sidewall of a DTI 82*c*, and the inside of the film 101 is filled with SiO2 as a filler 86*c*.

The pixel 50*a* in the first embodiment has a configuration in which the sidewall film 85 including SiO2 is formed on the sidewall of the DTI 82 and filled with polysilicon, whereas in the pixel 50*c* in the third embodiment, the film 101 having a negative fixed charge is formed on the sidewall of the DTI 82*c*, and the inside of the film 101 is filled with SiO2.

The film 101 having a negative fixed charge formed on the sidewall of the DTI 82*c* can be, for example, a hafnium oxide (HfO2) film, an aluminum oxide (Al2O3) film, a zirconium oxide (ZrO2) film, a tantalum oxide (Ta2O5) film, or a titanium oxide (TiO2) film. The above-mentioned types of films have been used as gate insulating films of insulated-gate field effect transistors and the like, and therefore, a film formation method has been established. Accordingly, such films can be easily formed.

Examples of the film formation method include a chemical vapor deposition method, a sputtering method, an atomic layer deposition method, and the like. If the atomic layer deposition method is used, an SiO2 layer that reduces the interface state during film formation is simultaneously formed with a thickness of about 1 nm, and thus, preferable.

In addition, examples of the material other than the above materials include lanthanum oxide (La2O3), praseodymium oxide (Pr2O3), cerium oxide (CeO2), neodymium oxide (Nd2O3), promethium oxide (Pm2O3), samarium oxide (Sm2O3), europium oxide (Eu2O3), gadolinium oxide (Gd2O3), terbium oxide (Tb2O3), dysprosium oxide (Dy2O3), holmium oxide (Ho2O3), erbium oxide (Er2O3), thulium oxide (Tm2O3), ytterbium oxide (Yb2O3), lutetium oxide (Lu2O3), and yttrium oxide (Y2O3).

Further, the film 101 having a negative fixed charge can be formed using a hafnium nitride film, an aluminum nitride film, a hafnium oxynitride film, or an aluminum oxynitride film.

The film 101 having a negative fixed charge may be added with silicon (Si) or nitrogen (N), as long as the insulating property is not impaired. The concentration of the additive is appropriately determined as long as the insulating property of the film is not impaired. However, in order to prevent an occurrence of image defects such as white spots, it is preferable that the additive such as silicon or nitrogen is added to the surface of the film 101 having a negative fixed charge, that is, the surface reverse to the PD71. As described above, the addition of silicon (Si) and nitrogen (N) makes it possible to increase the heat resistance of the film and the ability to prevent ion implantation during the process.

In the third embodiment, it is possible to enhance the pinning on the trench sidewall of the DTI 82. Therefore, when compared with, for example, the pixel 50*a* in the first embodiment, the pixel 50*c* can more reliably prevent deterioration in dark characteristics.

In order to form the DTI 82 in the third embodiment, such a process as described below may be performed. Specifically, in the state shown in D of FIG. 6, the back surface is polished until the polysilicon added as the filler 86 is exposed. Then, the filler 86 (polysilicon) and the sidewall film 85 (SiO2) inside the groove are removed by photoresist and wet etching, and the film 101 is formed. Thereafter, the groove is filled with SiO2.

Note that the inside of the groove may be filled with a metal material such as tungsten (W) as a filler instead of SiO2. In this case, transmission of obliquely entering light through the DTI 82 is suppressed, so that color mixing can be reduced.

Fourth Embodiment

Figure 9:
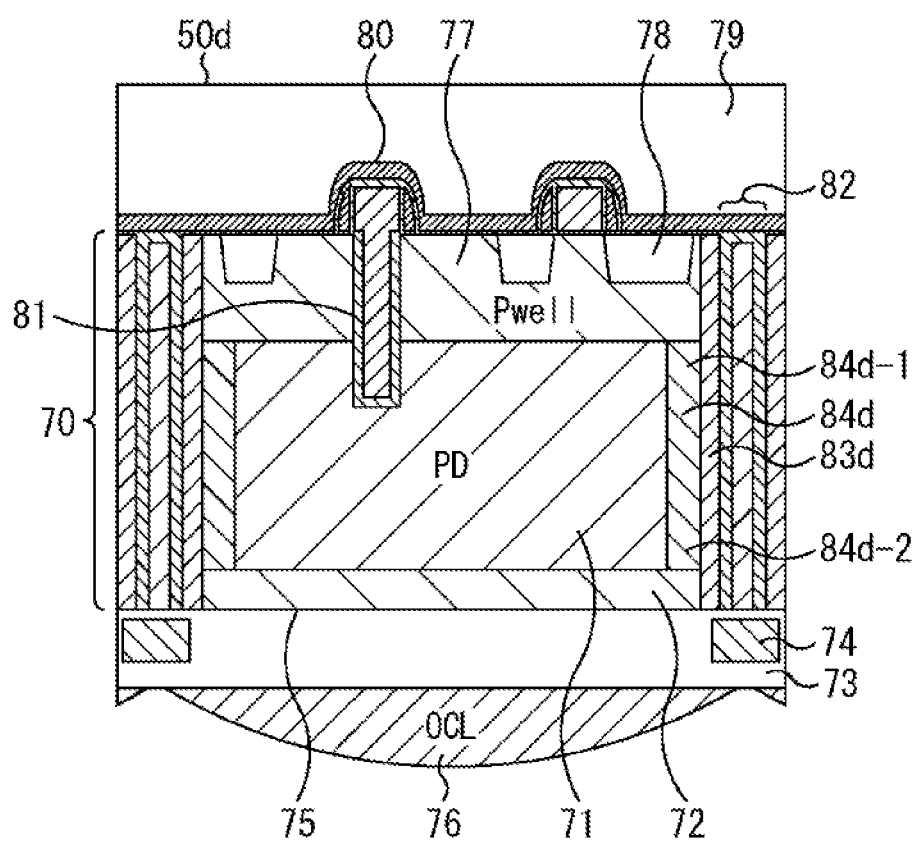
FIG. 9 is a vertical sectional view showing a fourth configuration example of the pixel to which the present technology is applied.

FIG. 9 is a vertical sectional view of a pixel 50*d* according to a fourth embodiment to which the present technology is applied.

The fourth embodiment is different from the pixel 50*a* in the first embodiment in that an N-type solid-phase diffusion layer 84*d* formed along the DTI 82 has a concentration gradient in the depth direction of the Si substrate 70. The other configurations are similar to those of the pixel 50*a* in the first embodiment.

The N-type impurity concentration of the N-type solid-phase diffusion layer 84 of the pixel 50*a* in the first embodiment is constant regardless of the depth direction, whereas the N-type impurity concentration of the N-type solid-phase diffusion layer 84*d* of the pixel 50*d* in the fourth embodiment varies in the depth direction.

That is, an N-type solid-phase diffusion layer 84*d*-1 near the front surface of the N-type solid-phase diffusion layer 84*d* of the pixel 50*d* has a high N-type impurity concentration, and an N-type solid-phase diffusion layer 84*d*-2 near the back surface has a low N-type impurity concentration.

The pixel 50*d* according to the fourth embodiment can provide an effect similar to that of the pixel 50*a* according to the first embodiment. In addition, the pixel 50*d* can also provide another effect of making it possible to easily read electric charge due to the potential on the back surface side being shallow by the concentration gradient provided in the N-type solid-phase diffusion layer 84*d*.

A concentration gradient can be provided in the N-type solid-phase diffusion layer 84*d* in the manner described below, for example. Specifically, when a groove for the DTI 82 is opened, etching damage is caused on the sidewall of the groove, and the concentration gradient can be provided by utilizing a difference in a doping amount by solid-phase diffusion due to an amount of damage.

Note that, instead of providing a concentration gradient in the N-type solid-phase diffusion layer 84*d*, the concentration of P-type impurities in the P-type solid-phase diffusion layer 83*d* near the front surface may be reduced, and the concentration of P-type impurities in the P-type solid-phase diffusion layer 83*d* near the back surface may be increased. In this case, an effect similar to the effect obtained when the concentration gradient is provided in the N-type solid-phase diffusion layer 84*d* can also be obtained.

In addition, both the N-type solid-phase diffusion layer 84*d* and the P-type solid-phase diffusion layer 83*d* may have a concentration gradient.

Fifth Embodiment

Figure 10:
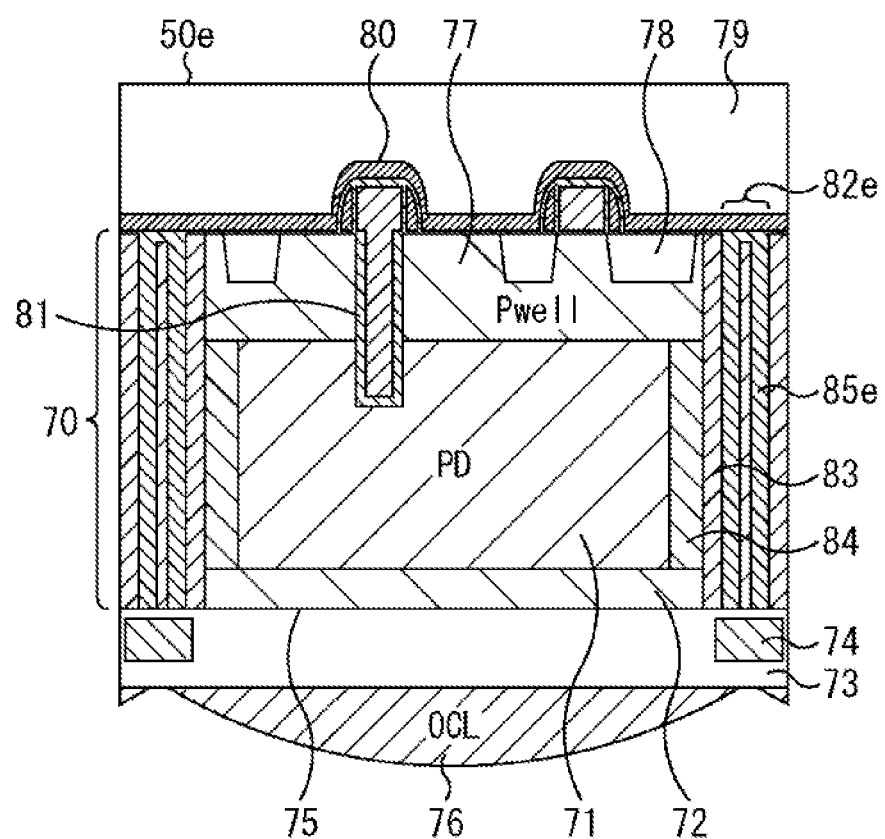
FIG. 10 is a vertical sectional view showing a fifth configuration example of the pixel to which the present technology is applied.

FIG. 10 is a vertical sectional view of a pixel 50*e* according to a fifth embodiment to which the present technology is applied.

The pixel 50*e* according to the fifth embodiment is different from the first embodiment in that a sidewall film 85*e* including SiO2 and formed on the inner wall of a DTI 82*e* is formed thicker than the sidewall film 85 of the pixel 50*e* according to the first embodiment. The other configurations are similar to those of the first embodiment.

SiO2 has a lower refractive index of light than Si. Therefore, light entering the Si substrate 70 is reflected according to Snell's law, so that transmission of light to the adjacent pixel 50 is prevented. However, if the sidewall film 85 is thin, Snell's law is not completely established, and transmitted light may be increased.

The sidewall film 85*e* of the pixel 50*e* in the fifth embodiment is formed to be thick. Therefore, deviation from Snell's law can be reduced, and the reflection of incident light on the sidewall film 85*e* increases. As a result, transmission of incident light to the adjacent pixel 50*e* can be reduced. Accordingly, the pixel 50*e* according to the fifth embodiment can provide an effect similar to the effect of the pixel 50*a* according to the first embodiment, and can further provide an effect of preventing color mixing to the adjacent pixel 50*e* due to the obliquely entering light.

Sixth Embodiment

Figure 11:
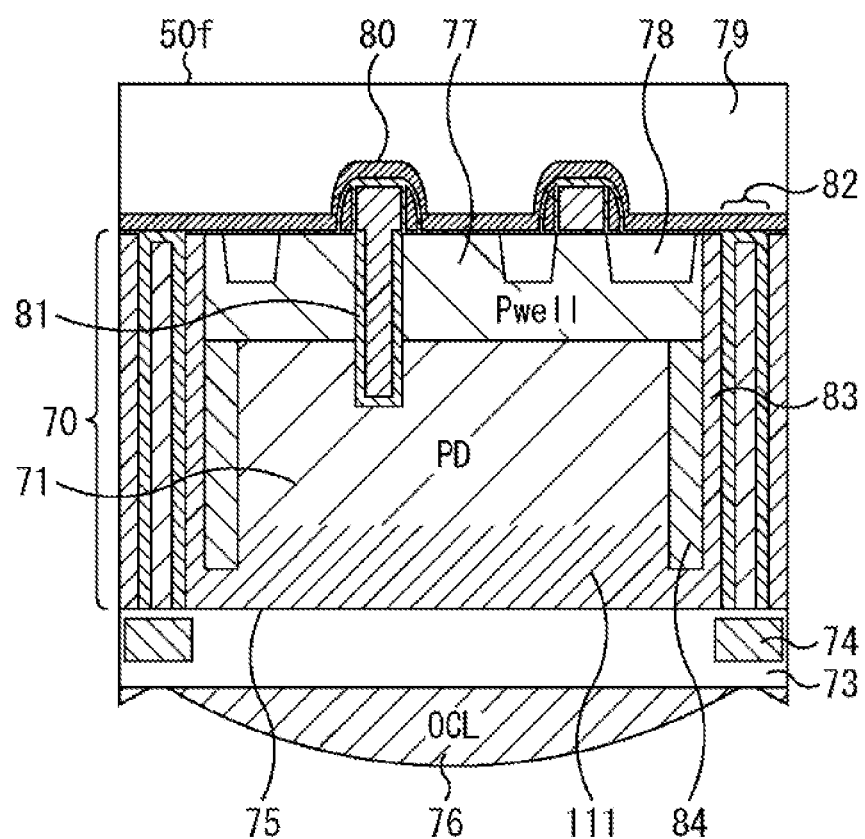
FIG. 11 is a vertical sectional view showing a sixth configuration example of the pixel to which the present technology is applied.

FIG. 11 is a vertical sectional view of a pixel 50*f* according to a sixth embodiment to which the present technology is applied.

The pixel 50*f* according to the sixth embodiment is different from the pixel 50*a* in the first embodiment in that a region 111 between the PD 71 and the backside Si interface 75 is doped with a P-type impurity, by which a concentration gradient is provided such that the concentration of the P-type impurity is higher on the back surface side than on the front surface side in the Si substrate 70. The other configurations are similar to those of the pixel 50*a* in the first embodiment.

Referring to FIG. 3 again, in the pixel 50*a* of the first embodiment, the Si substrate 70 has no concentration gradient, and the P-type region 72 is formed between the PD 71 and the backside Si interface 75. In the pixel 50*f* according to the sixth embodiment, the Si substrate 70 has a concentration gradient. The concentration gradient is such that the concentration of the P-type impurity is higher on the back surface side (P-type region 111 side) than on the front surface side.

The pixel 50*f* according to the sixth embodiment having such a concentration gradient can provide an effect similar to that of the pixel 50*a* according to the first embodiment, and can also provide a further effect of making it easier to read electric charge as compared with the pixel 50*a* in the first embodiment.

Seventh Embodiment

Figure 12:
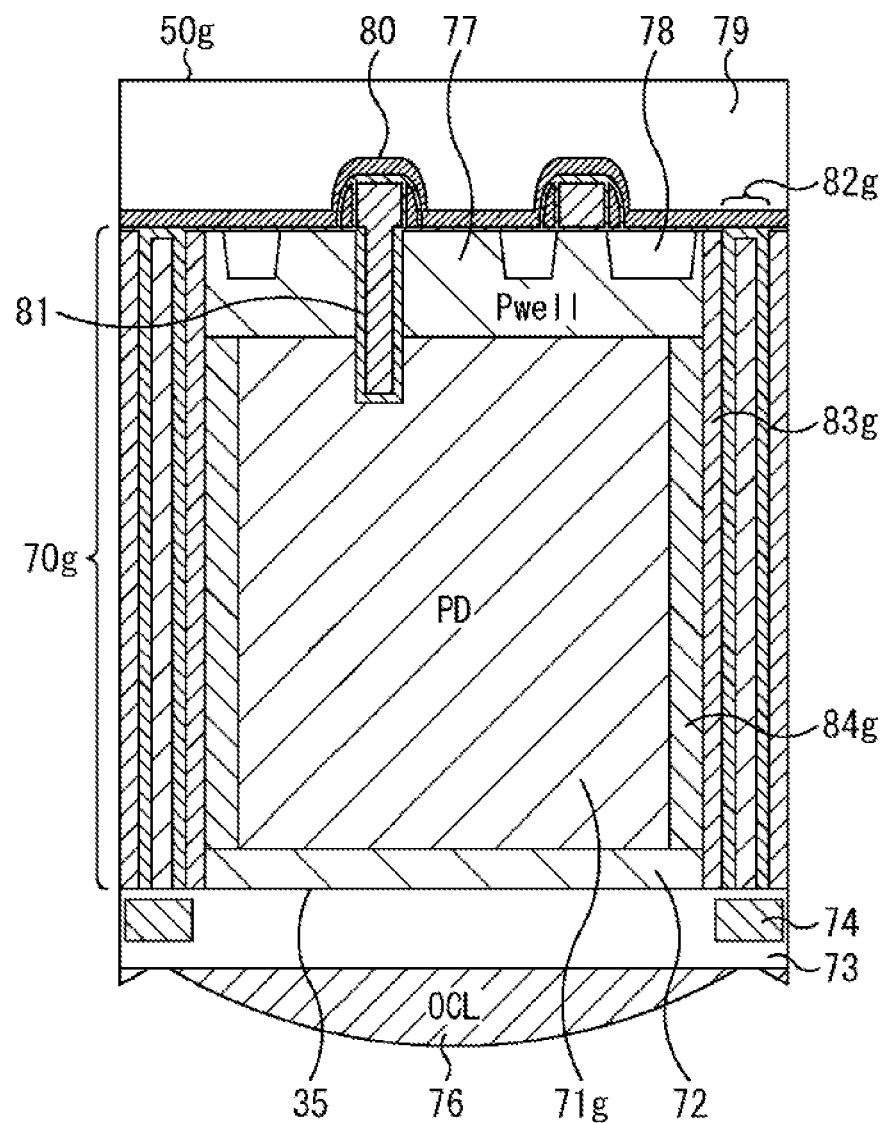
FIG. 12 is a vertical sectional view showing a seventh configuration example of the pixel to which the present technology is applied.

FIG. 12 is a vertical sectional view of a pixel 50*g* according to a seventh embodiment to which the present technology is applied.

The pixel 50*g* according to the seventh embodiment is different from the pixel 50*a* according to the first embodiment in that the pixel 50*g* has a thicker Si substrate 70 than the pixel 50*a*, and with an increase in the thickness of the Si substrate 70, the DTI 82 or the like is formed deeper.

The pixel 50*g* in the seventh embodiment has a thick Si substrate 70*g*. With an increase in the thickness of the Si substrate 70*g*, the area (volume) of the PD 71*g* increases, and a DTI 82*g* is deeper. Further, since the DTI 82*g* is formed deeper, a P-type solid-phase diffusion layer 83g and an N-type solid-phase diffusion layer 84g are also formed deeper (wider).

Since the P-type solid-phase diffusion layer 83g and the N-type solid-phase diffusion layer 84g are wider, the area of the PN junction region constituted by the P-type solid-phase diffusion layer 83g and the N-type solid-phase diffusion layer 84g increases. Therefore, the pixel 50g according to the seventh embodiment can provide an effect similar to that of the pixel 50g according to the first embodiment, and can further provide an effect of increasing the saturation charge amount Qs as compared with the pixel 50a according to the first embodiment.

Eighth Embodiment

Figure 13:
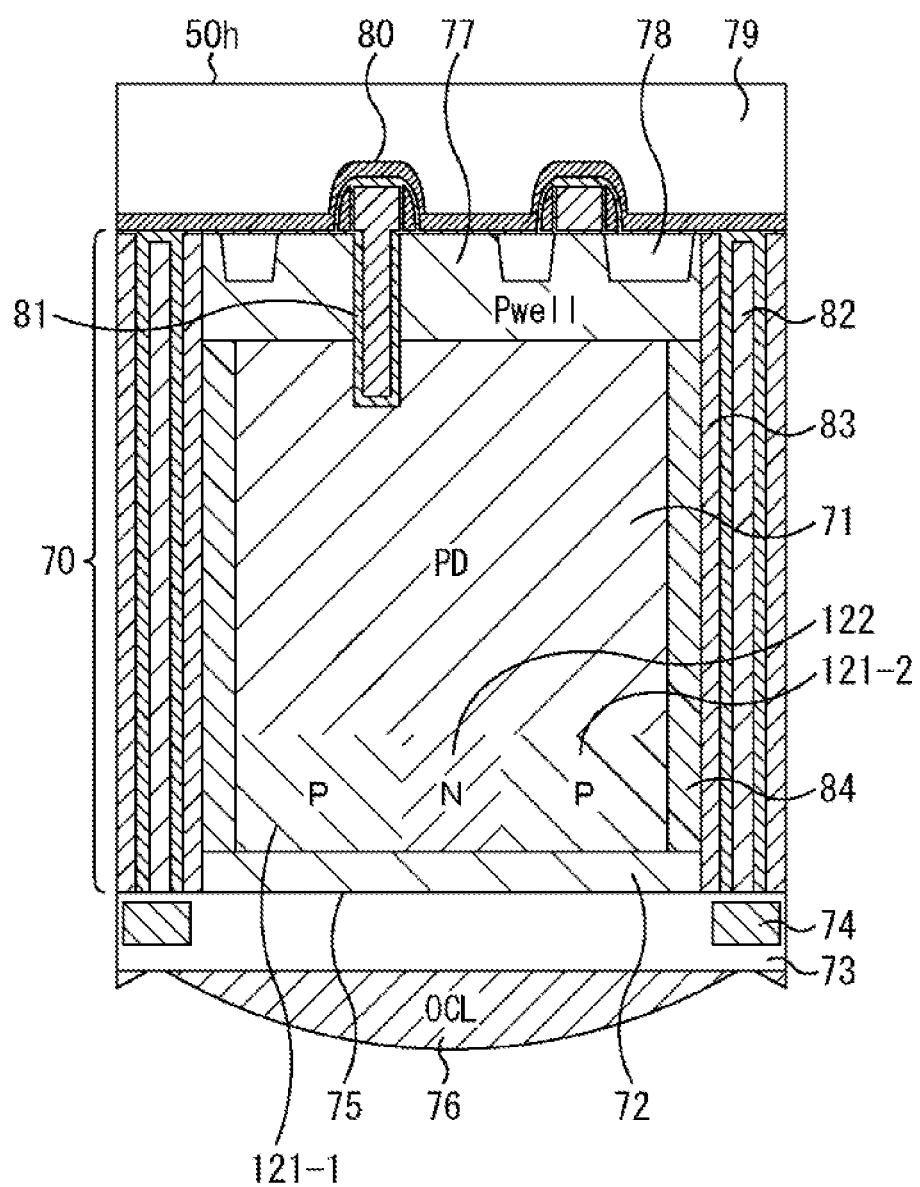
FIG. 13 is a vertical sectional view showing an eighth configuration example of the pixel to which the present technology is applied.

FIG. 13 is a vertical sectional view of a pixel 50h according to an eighth embodiment to which the present technology is applied.

In the pixel 50h according to the eighth embodiment, the length of the Si substrate 70g in the depth direction is increased as in the pixel 50g according to the seventh embodiment shown in FIG. 12.

Further, in the pixel 50r, a P-type region 121-1, an N-type region 122, and a P-type region 121-2 are formed in the PD 71 on the back surface side by ion implantation. A strong electric field is generated at the PN junction formed by the P-type region 121-1, the N-type region 122, and the P-type region 121-2, whereby electric charge can be retained.

Therefore, the pixel 50h according to the eighth embodiment can provide an effect similar to that of the pixel 50g according to the seventh embodiment, and can further provide an effect of increasing the saturation charge amount Qs.

Ninth Embodiment

Figure 14:
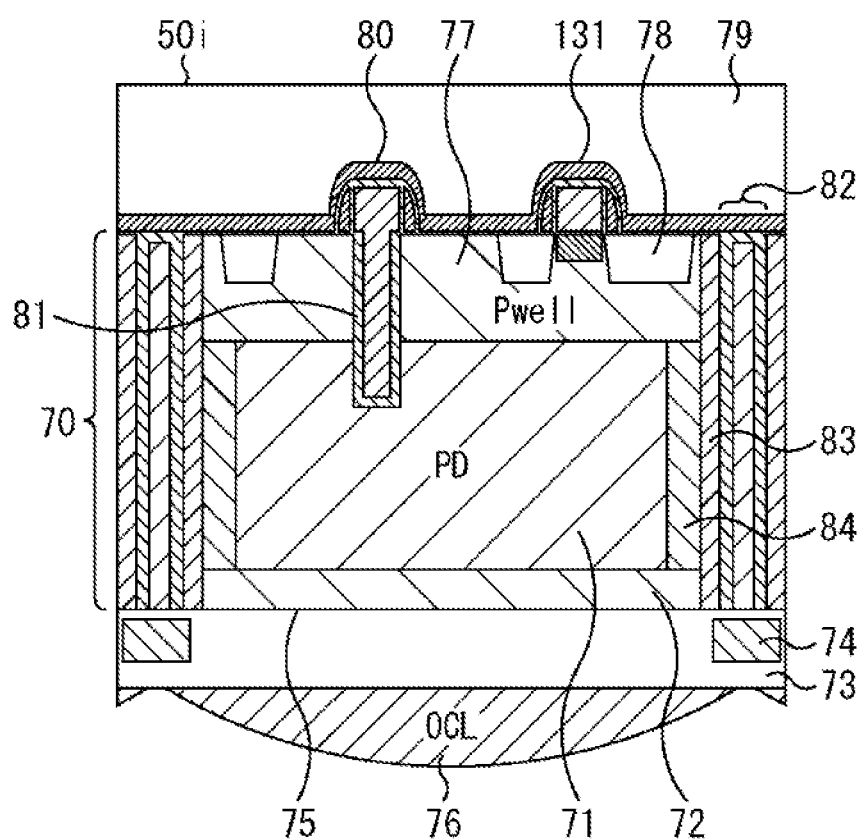
FIG. 14 is a vertical sectional view showing a ninth configuration example of the pixel to which the present technology is applied.

FIG. 14 is a vertical sectional view of a pixel 50i according to a ninth embodiment to which the present technology is applied.

The pixel 50i according to the ninth embodiment is different from the pixel 50a according to the first embodiment in that a MOS capacitor 131 and a pixel transistor (not shown) are formed on the front surface side of the Si substrate 70. The other configurations are similar to those of the pixel 50a in the first embodiment.

Normally, even if the saturation charge amount Qs of the PD 71 is increased, the output is limited by the amplitude limit of the vertical signal line VSL (vertical signal line 47 shown in FIG. 2) unless the conversion efficiency is reduced, and it is difficult to make full use of the increased saturation charge amount Qs.

In order to reduce the conversion efficiency of the PD 71, it is necessary to add capacitance to the FD 91 (FIG. 4). In view of this, the pixel 50i according to the ninth embodiment has a configuration in which the MOS capacitor 131 is added as a capacitance to be added to the FD 91 (not shown in FIG. 11).

The pixel 50i according to the ninth embodiment can provide an effect similar to that of the pixel 50a according to the first embodiment. Further, the pixel 50i can reduce the conversion efficiency of the PD 71 due to the addition of the MOS capacitor 131 to the FD 91, and can make full use of the increased saturation charge amount Qs.

Tenth Embodiment

Figure 15:
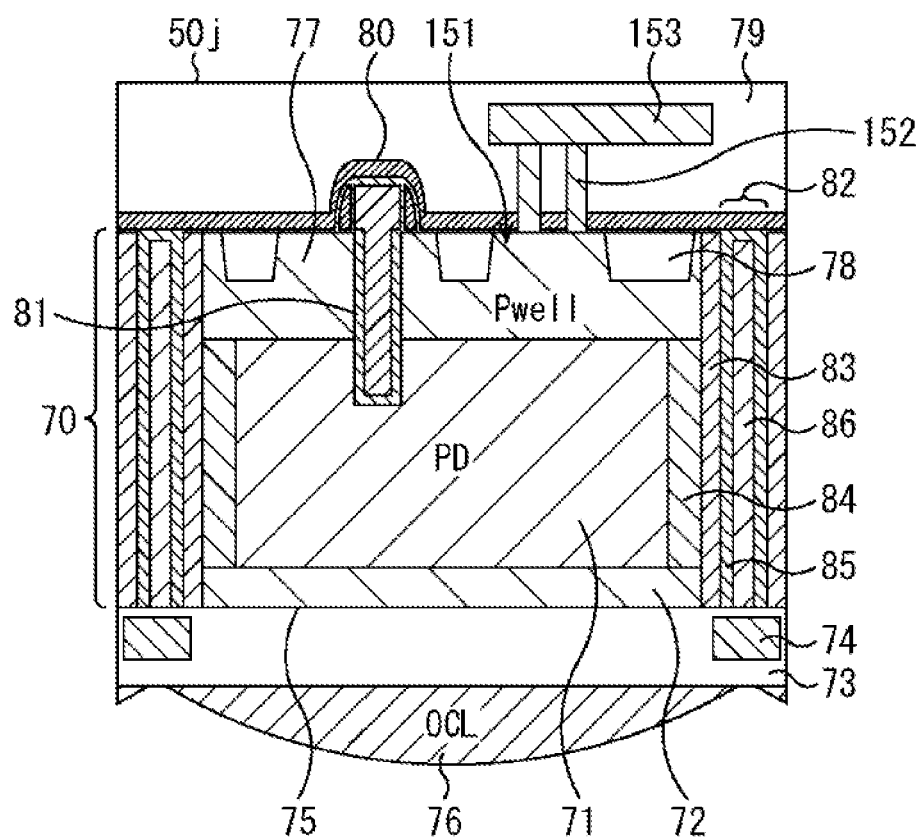
FIG. 15 is a vertical sectional view showing a tenth configuration example of the pixel to which the present technology is applied.

FIG. 15 is a vertical sectional view of a pixel 50j according to a tenth embodiment to which the present technology is applied.

The pixel 50j according to the tenth embodiment is different from the pixel 50a according to the first embodiment in that two contacts 152 are formed in a well contact section 151 formed in an active region 77, and the contacts 152 are connected to a Cu wire 153. The other configurations are similar to those of the pixel 50a according to the first embodiment.

As described above, the well contact section 151 may be provided. Note that, although FIG. 15 shows an example in which two contacts 152 are formed, two or more contacts 152 may be formed in the well contact section 151.

The pixel 50j according to the tenth embodiment can provide an effect similar to that of the pixel 50a according to the first embodiment, and can further provide an effect of enhancing critical yield defect.

Eleventh Embodiment

Figure 16:
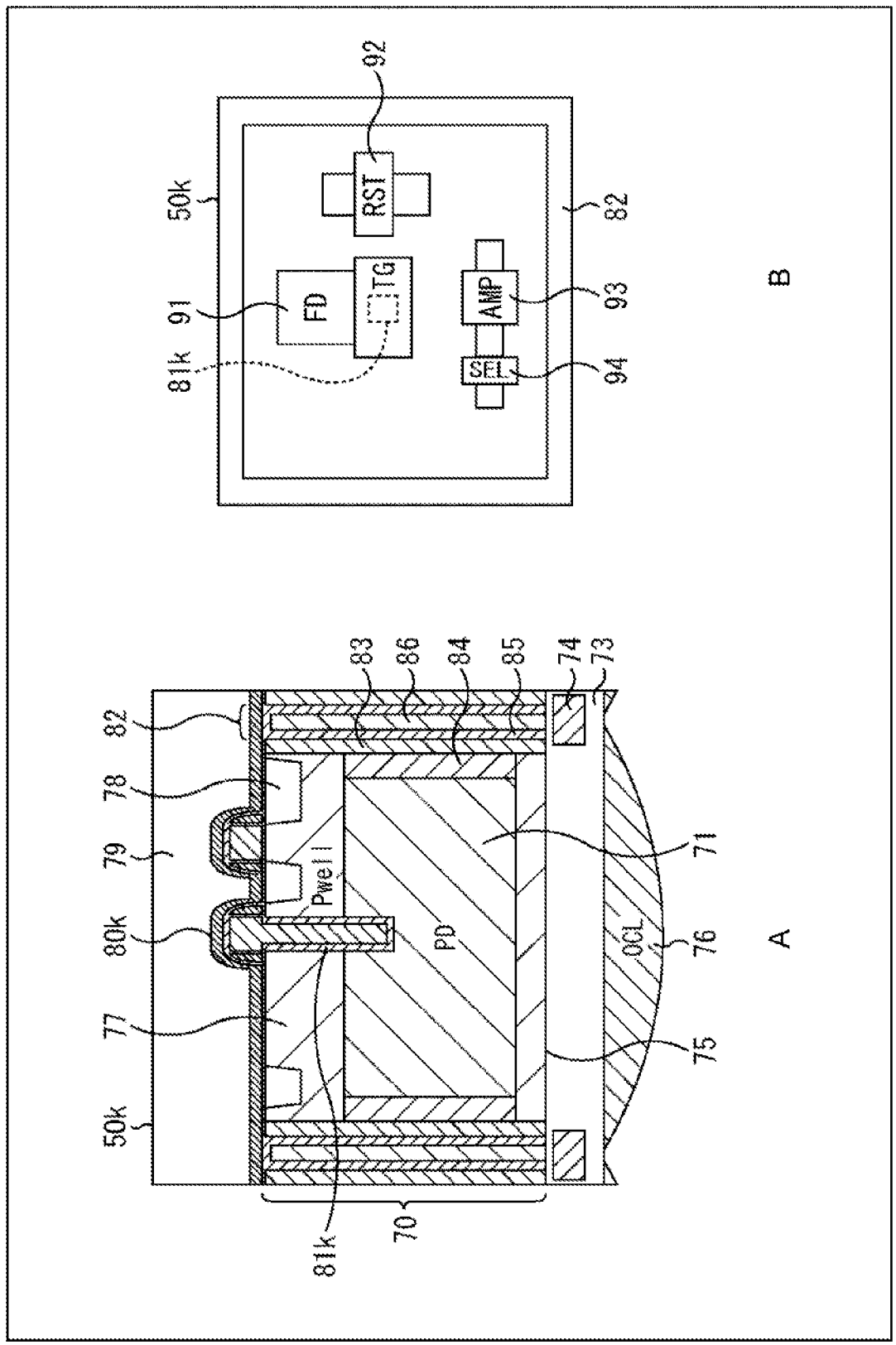
FIG. 16 shows a vertical sectional view and a plan view showing an eleventh configuration example of the pixel to which the present technology is applied.

FIG. 16 shows a vertical sectional view and a plan view of a pixel 50k according to an eleventh embodiment to which the present technology is applied.

The pixel 50k according to the eleventh embodiment is different from the pixel 50a according to the first embodiment in that a transfer transistor (gate) 80k is formed by opening a vertical transistor trench 81k in the center of the pixel 50k. The other configurations are similar to those of the pixel 50a in the first embodiment.

In the pixel 50k shown in FIG. 16, the transfer transistor (gate) 80k is positioned equidistant from the outer periphery of the PD 71. Therefore, the pixel 50k according to the eleventh embodiment can provide an effect similar to that of the pixel 50a according to the first embodiment, and further, can improve transfer of electric charge because the transfer transistor (gate) is positioned equidistant from the outer periphery of the PD 71.

Twelfth Embodiment

Figure 17:
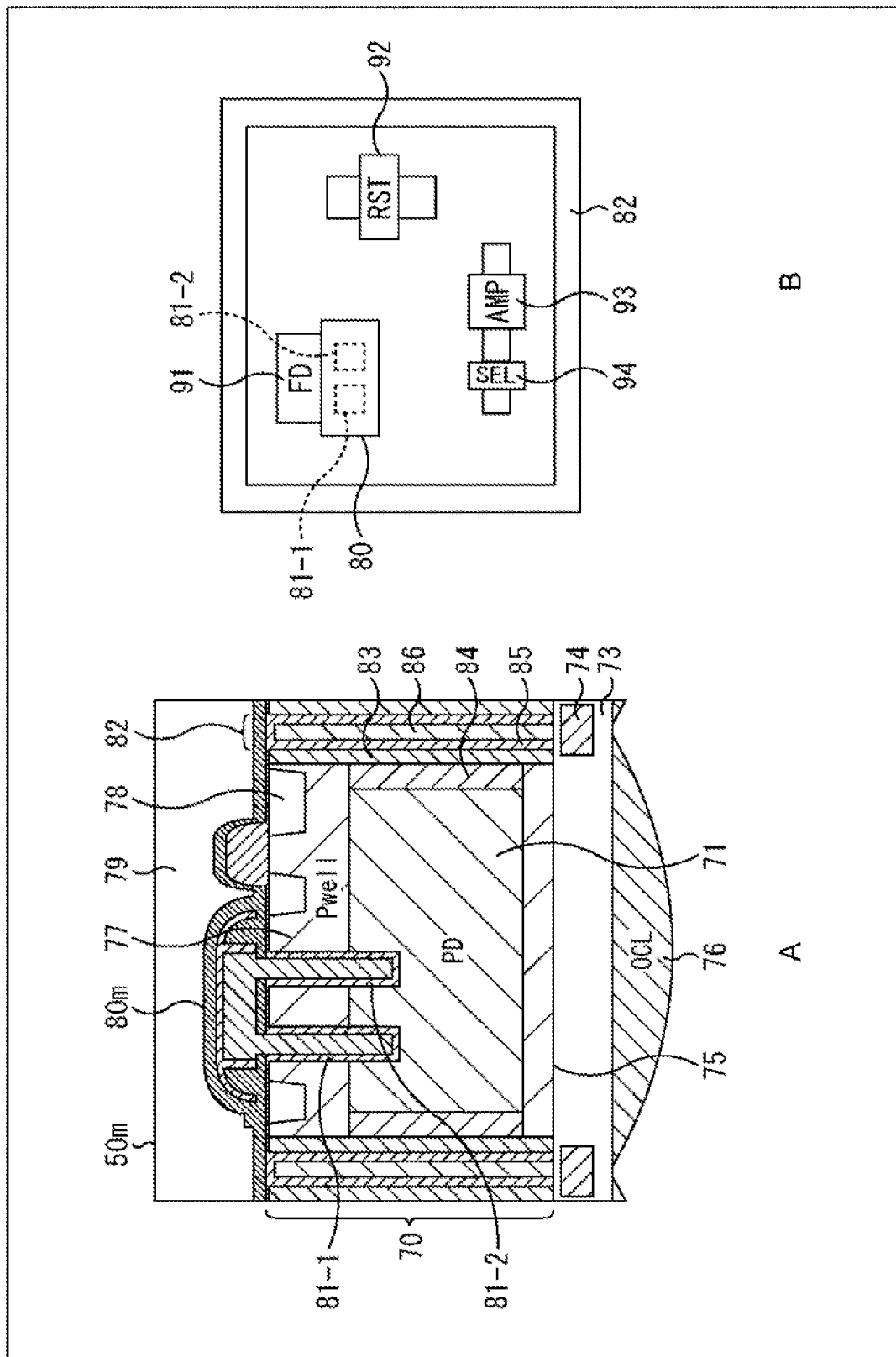
FIG. 17 shows a vertical sectional view and a plan view showing a twelfth configuration example of the pixel to which the present technology is applied.

FIG. 17 shows a vertical sectional view and a plan view of a pixel 50m according to a twelfth embodiment to which the present technology is applied.

The pixel 50m according to the twelfth embodiment is different from the pixel 50a according to the first embodiment in that a transfer transistor 80m includes two vertical transistor trenches 81-1 and 81-2. The other configurations are similar to those of the pixel 50a in the first embodiment.

The pixel 50a (FIG. 3) according to the first embodiment has a configuration in which the transfer transistor 80 includes one vertical transistor trench 81, whereas the pixel 50m according to the twelfth embodiment has a configuration in which the transfer transistor 80m includes two vertical transistor trenches 81-1 and 81-2.

Due to the above configuration including the two vertical transistor trenches 81-1 and 81-2, the followability of the potential in the region between the two vertical transistor trenches 81-1 and 81-2 upon changing the potential of the transfer transistor 80k is improved. Therefore, the degree of modulation can be increased. As a result, the charge transfer efficiency can be improved.

Further, the effect similar to the effect of the pixel 50a according to the first embodiment can also be obtained.

It is to be noted that, although the transfer transistor 80k includes, as one example, two vertical transistor trenches 81-1 and 81-2 in the above description, two or more vertical transistor trenches 81 may be provided in each pixel region.

Further, an example in which the two vertical transistor trenches 81-1 and 81-2 are formed to have the same size (length and thickness) has been described. However, in a case where multiple vertical transistor trenches 81 are formed, they may have different sizes. For example, one of the two vertical transistor trenches 81-1 and 81-2 may be longer than the other, or thicker than the other.

Thirteenth Embodiment

Figure 18:
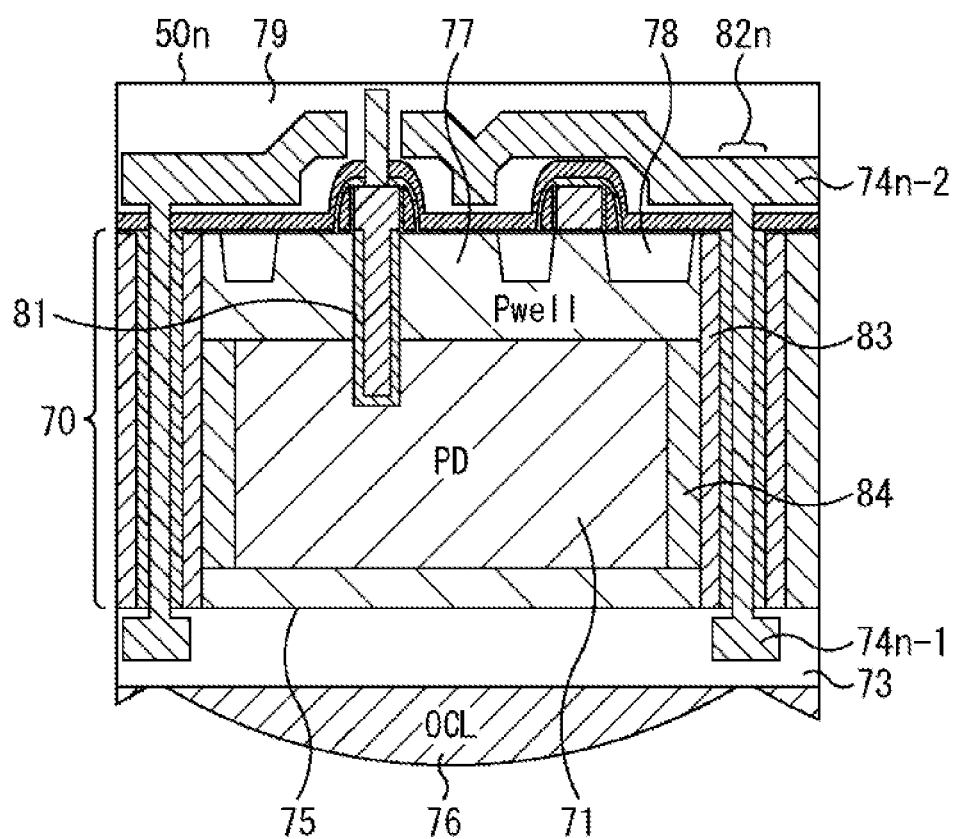
FIG. 18 is a vertical sectional view showing a thirteenth configuration example of the pixel to which the present technology is applied.

FIG. 18 is a vertical sectional view of a pixel 50*n* according to a thirteenth embodiment to which the present technology is applied.

The pixel 50*n* according to the thirteenth embodiment is different from the pixel 50*a* according to the first embodiment in the configuration of the light-shielding film 74, and the other configurations are similar to those of the pixel 50*a*.

In the pixel 50*n* according to the thirteenth embodiment, a light-shielding film 74*n*-1 and a light-shielding film 74*n*-2 are formed above and below a DTI 82*n*, respectively. The pixel 50*a* according to the first embodiment (FIG. 3) has the light-shielding film 74 that covers the back surface side of the DTI 82 (lower side in the figure) on the back surface side thereof, whereas in the pixel 50*n* (FIG. 18), the DTI 82*n* is filled with a metal material (for example, tungsten) same as the material of the light-shielding film 74, and the front surface side (upper side in the figure) of the Si substrate 70 is also covered with the metal material.

In other words, each pixel region is surrounded by the metal material except for the back surface (light entrance surface). It is to be noted, however, that in the configuration in which the pixel 50*n* is enclosed by the metal material except for the back surface of the pixel 50*n*, an opening is formed as appropriate at necessary portions. For example, a portion of the light-shielding film 74*n*-2 where the transfer transistor 80*n* is located is opened, and a terminal for connection to the outside is formed therein.

Note that a metal material other than tungsten (W) may be used for the light-shielding film 74 and the like.

According to the pixel 50*n* in the thirteenth embodiment, it is possible to prevent the incident light from leaking to the adjacent pixel 50*n*, so that color mixing can be suppressed.

Further, light entering from the back surface and reaching the front surface without being photoelectrically converted is reflected by the metal material (light-shielding film 74*n*-2) and again enters the PD 71. Therefore, the pixel 50*n* according to the thirteenth embodiment can provide an effect similar to that of the pixel 50*a* according to the first embodiment, and can further provide an effect of enhancing the sensitivity of the PD 71.

Fourteenth Embodiment

Figure 19:
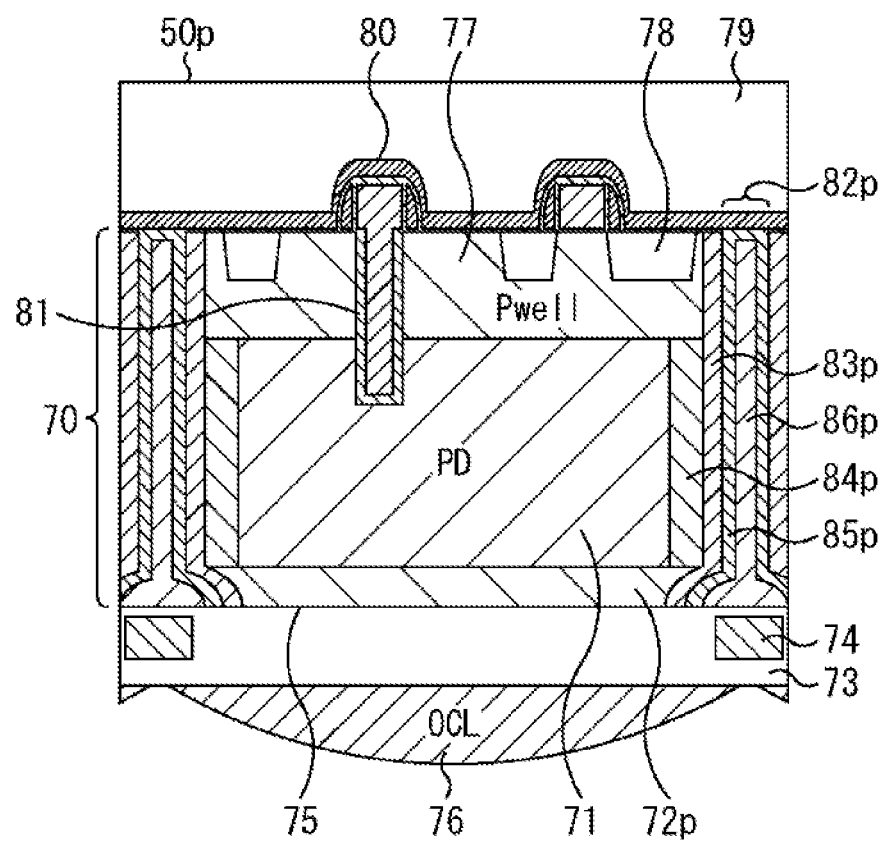
FIG. 19 is a vertical sectional view showing a fourteenth configuration example of the pixel to which the present technology is applied.

FIG. 19 is a vertical sectional view of a pixel 50*p* according to a fourteenth embodiment to which the present technology is applied.

The pixel 50*p* according to the fourteenth embodiment is different from the pixel 50*a* according to the first embodiment in the shape of a P-type solid-phase diffusion layer 83*p* and a sidewall film 85*p* on the back surface side. The other configurations are similar to those of the pixel 50*a* according to the first embodiment.

The P-type solid-phase diffusion layer 83*p* of the pixel 50*p* is formed to protrude to the lower side of an N-type solid-phase diffusion layer 84*p* on the back surface side of the pixel 50*p*. The pixel 50*p* has the P-type solid-phase diffusion layer 83*p* protruding to the inside of a P-type region 72*p* at the end of the P-type region 72*p*. Further, the sidewall film 85*p* formed inside the P-type solid-phase diffusion layer 83*p* is also formed to protrude toward the P-type region 72*p*. Furthermore, a filler 86*p* formed inside the sidewall film 85*p* is also formed to protrude toward the P-type region 72*p*.

Due to the configuration described above, the N-type solid-phase diffusion layer 84*p* is more reliably not in contact with the backside Si interface 75 of the Si substrate 70. Accordingly, it is possible to prevent weakening of pinning of electric charge, which can prevent electric charge from flowing into the PD 71. Thus, deterioration in dark characteristics can be prevented.

When the N-type solid-phase diffusion layer 84*p* is formed, the depth and concentration may vary. For example, there may be a variation such that the N-type solid-phase diffusion layer 84 of an A pixel 50 is deeper than the N-type solid-phase diffusion layer 84 of a B pixel 50. In this case, the deeply formed N-type solid-phase diffusion layer 84 may reach the inside of the P-type region 72, or may penetrate the P-type region 72 and reach the backside Si interface 75 of the Si substrate 70.

Alternatively, there may be, for example, a variation such that the concentration of the N-type impurity in the N-type solid-phase diffusion layer 84 of the A pixel 50 is higher than the concentration of the N-type impurity in the N-type solid-phase diffusion layer 84 of the B pixel 50. In this case, the N-type solid-phase diffusion layer 84 having higher concentration may reach the inside of the P-type region 72, or may penetrate the P-type region 72 and reach the backside Si interface 75 of the Si substrate 70.

In the pixel 50*p*, on the backside Si interface 75 side of the N-type solid-phase diffusion layer 84*p*, the P-type region 72*p* is formed, and further, the P-type solid-phase diffusion layer 83*p* is formed so as to protrude to the lower side of the N-type solid-phase diffusion layer 84*p*. Therefore, if there is a variation in depth or concentration of the N-type solid-phase diffusion layers 84*p* as described above, such variation can be absorbed, and the contact between the N-type solid-phase diffusion layer 84*p* and the backside Si interface 75 of the Si substrate 70 can be reliably prevented by the P-type solid-phase diffusion layer 83*p*.

The pixel 50*p* according to the fourteenth embodiment can provide an effect similar to the effect of the pixel 50*a* according to the first embodiment.

Figure 20:
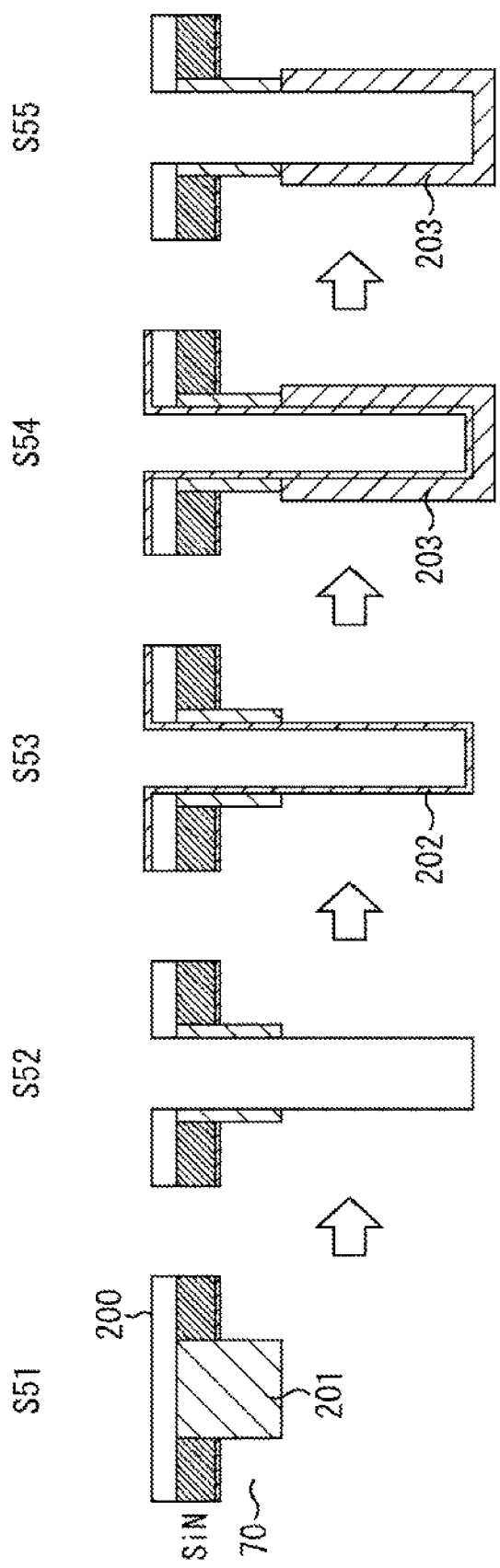
FIG. 20 is a view for describing a manufacture of a strong electric field region.
Figure 21:
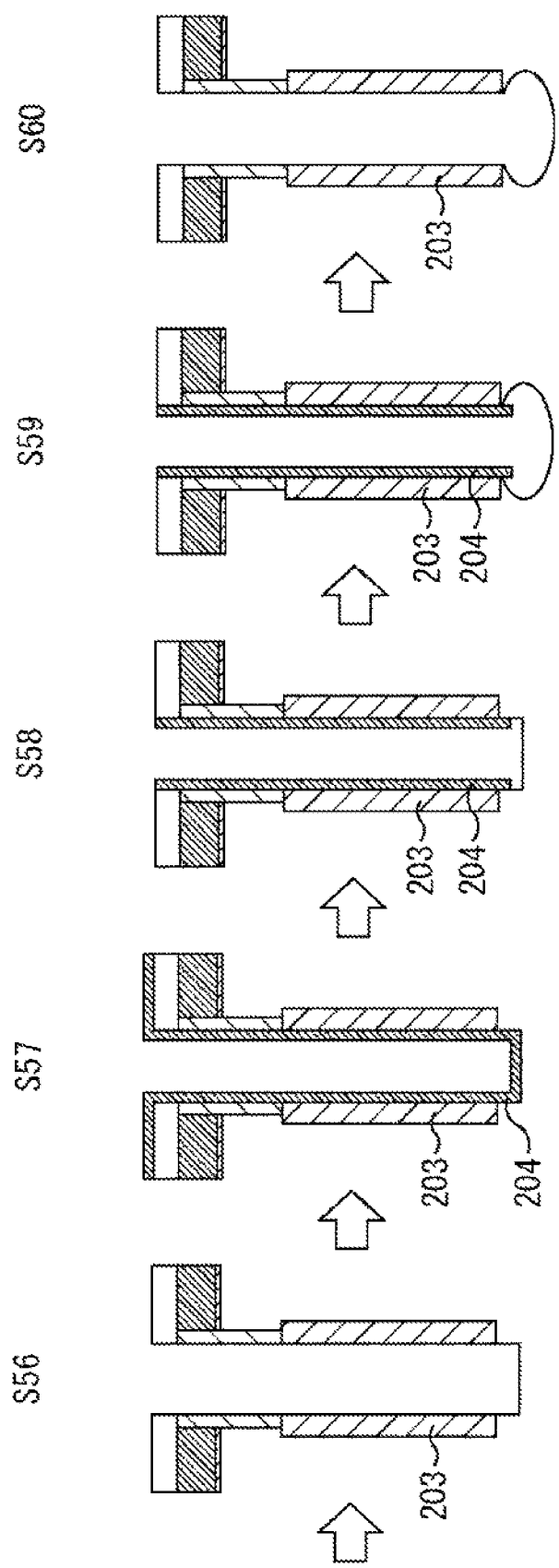
FIG. 21 is a view for describing the manufacture of a strong electric field region.

The manufacturing process of the pixel 50*p* according to the fourteenth embodiment, in particular, the process of forming a DTI 82*p* and the P-type solid-phase diffusion layer 83*p*, will be described with reference to FIGS. 20 to 22.

In step S51, a substrate on which the DTI 82*p* is to be formed is prepared. A silicon oxide film 200 is formed on the substrate, and an insulating film (insulating material) 201 is embedded in a groove which has been formed. For example, LP-TEOS is deposited as the silicon oxide film 200.

In step S52, a part of the silicon oxide film 200, a part of the insulating film 201, a part of SiN, and a part of the Si substrate 70 are removed by dry etching. Thus, a deep groove (deep trench) is formed in step S52. The deep trench has a lattice shape in a plan view, and is formed up to a lower end of a region where the N-type region is to be formed by solid-phase diffusion in the subsequent step.

In step S53, a silicon oxide film (PSG) 202 containing phosphorus (P) is deposited on the entire surface of the wafer by using an atomic layer deposition (ALD) method. By the process in step S53, the PSG film 202 is formed on the surface of the wafer except for the portion where the deep trench is formed, on the side surface of the deep trench, and on the bottom surface of the deep trench. Since phosphorus (P) is used here, the PSG film 202 is formed as an N-type film.

In step S54, a thermal diffusion treatment is performed. In step S54, the wafer is annealed, by which phosphorus (P) is diffused by solid-phase diffusion from the PSG film 202 to the Si substrate 70 in a region where the PSG film 202 and the Si substrate 70 are in contact with each other. As a result, an N-type impurity region 203 is formed as shown in step S54 in FIG. 20. The N-type impurity region 203 is a region that becomes the N-type solid-phase diffusion layer 84p.

In step S55, the PSG film 202 on the wafer is removed. The PSG film 202 can be removed by, for example, wet etching using hydrofluoric acid.

In step S56 (FIG. 21), silicon on the bottom surface of the deep trench of the wafer is further drilled by dry etching. The deep trench further drilled in step S56 has a width equal to that of the deep trench formed in step S52, and is deeper than the deep trench formed in step S52. That is, the deep trench is further drilled to a position deeper than a region where the P-type region 72p (FIG. 19) is to be formed.

In step S57, an SiN film 204 is deposited on the entire surface of the wafer by using, for example, an LP-CVD method. The SiN film 204 is formed on the surface of the wafer except for the portion where the deep trench is formed, on the side surface of the deep trench, and on the bottom surface of the deep trench.

In step S58, the entire surface of the SiN film 204 on the wafer is etched back by using dry etching. Due to the process in step S58, the SiN film 204 on the surface of the wafer except for the portion where the deep trench is formed and on the bottom surface of the deep trench is removed, and the SiN film 204 is left only on the side surface of the deep trench, as shown in step S58 in FIG. 21.

In step S59, the bottom surface of the deep trench not covered with the SiN film 204 in the wafer is wet-etched. Due to the bottom surface of the deep trench being wet-etched, the bottom part of the deep trench protrudes to be wider than the width of the trench as shown in step S59 in FIG. 21. For example, a cavity having an elliptical cross section is formed.

In step S60, the SiN film 204 on the sidewall of the deep trench is removed. The SiN film can be removed by, for example, wet etching using hot phosphoric acid.

In step S61 (FIG. 22), a silicon oxide film (BSG) 205 containing boron (B) is deposited using an atomic layer deposition (ALD) method. By the process in step S61, the BSG film 205 is formed on the surface of the wafer except for the portion where the deep trench is formed, on the side surface of the deep trench, and on the bottom surface of the deep trench. Since boron (B) is used here, the BSG film 205 is formed as a P-type film.

In step S62, a thermal diffusion treatment is performed. In step S62, the wafer is annealed, by which boron (B) is diffused by solid-phase diffusion from the BSG film 205 to the Si substrate 70 in a region where the BSG film 205 and the Si substrate 70 are in contact with each other. As a result, a P-type impurity region 206 is formed as shown in step S62 in FIG. 22. The P-type impurity region 206 is a region that becomes the P-type solid-phase diffusion layer 83p (FIG. 19).

In step S63, the BSG film 205 is removed. The BSG film 205 can be removed by, for example, wet etching using hydrofluoric acid.

In step S64, polysilicon is embedded in the trench as a filler 86p, and unnecessary polysilicon deposited on the wafer is removed. Further, a pixel transistor, a wire, and the like are also formed. Then, the Si substrate 70 is thinned from the back surface side. The thinning is performed until the bottom part of the deep trench is exposed. In other words, the Si substrate 70 is thinned to the central part (the portion corresponding to the long axis of the cavity which is nearly elliptic in cross section, for example) of the cavity which is formed in step S59 (FIG. 21) and which is wider than the trench, as shown in step S64 in FIG. 22.

In this way, a portion related to the DTI 82i of the pixel 50p shown in FIG. 19 is formed. As described with reference to FIG. 19, the pixel 50p can be configured to have the shape in which the P-type solid-phase diffusion layer 83p is located between the N-type solid-phase diffusion layer 84p and the backside Si interface 75. Therefore, the N-type solid-phase diffusion layer 84p can be reliably prevented from being in contact with the backside Si interface 75 of the Si substrate 70. Accordingly, it is possible to prevent weakening of pinning of electric charge, which can prevent electric charge from flowing into the PD 71. Thus, deterioration in dark characteristics can be prevented.

Fifteenth Embodiment

Figure 23:
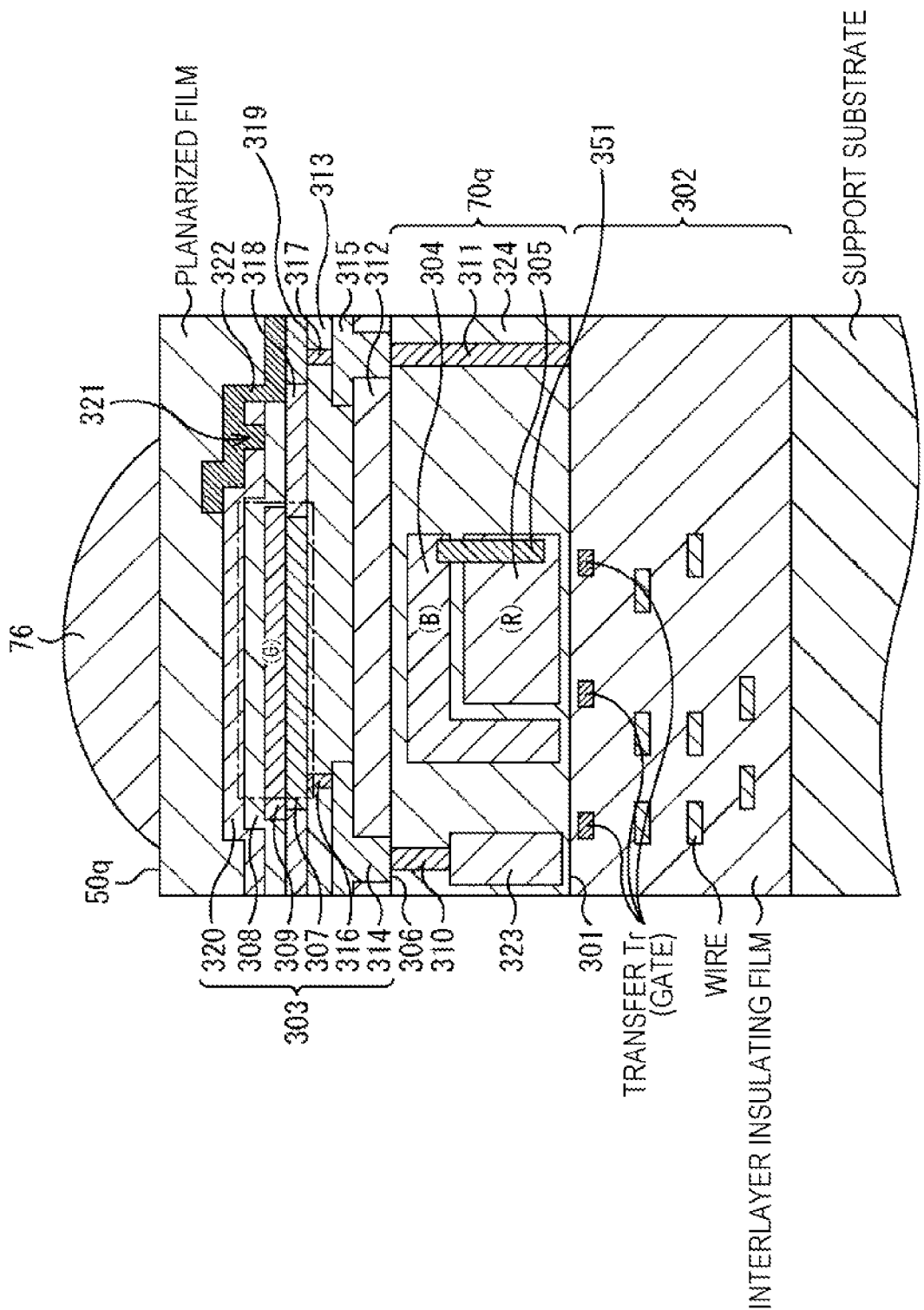
FIG. 23 is a vertical sectional view showing a fifteenth configuration example of the pixel to which the present technology is applied.

FIG. 23 is a vertical sectional view of a pixel 50q according to a fifteenth embodiment to which the present technology is applied.

The present technology can also be applied to a vertical spectral pixel 50. The fifteenth embodiment describes a case where the present technology is applied to a vertical spectral pixel 50q. In the pixel 50q shown in FIG. 23, the upper side is defined as a back surface side (light entrance side), and the lower side is defined as a front surface side (the side on which the wiring layer and the like are formed).

In the pixel 50q shown in FIG. 23, photoelectric conversion sections (PDs) are stacked. In the pixel 50q, a multi-layer wiring layer 302 in which transfer Trs (MOS FETs) and the like are formed is provided on the surface 301 side which is the surface of a Si substrate 70q.

In FIG. 23, the pixel 50q has a stacked structure in which one organic photoelectric conversion section 303 and two inorganic photoelectric conversion sections 304 and 305 are vertically stacked. The photoelectric conversion sections 303, 304, and 305 selectively detect light in different wavelength ranges and perform photoelectric conversion. The organic photoelectric conversion section 303 contains two or more types of organic semiconductor materials, for example.

As described above, the two inorganic photoelectric conversion sections 304 and 305 and the one organic photoelectric conversion section 303 are stacked, so that a red color signal, a green color signal, and a blue color signal can be obtained by one element (pixel). The organic photoelectric conversion section 303 is formed on a surface 306 that is the back surface of the Si substrate 70q, and the inorganic photoelectric conversion sections 304 and 305 are embedded in the Si substrate 70q.

The organic photoelectric conversion section 303 includes an organic photoelectric conversion element that absorbs light in a selective wavelength range, that is, green light in this case, to generate electron-hole pairs using an organic semiconductor. The organic photoelectric conversion section 303 has a configuration in which an organic photoelectric conversion layer (organic semiconductor layer) 309 is sandwiched between a lower electrode 307 and an upper electrode 308 which are provided for extracting signal charge. The lower electrode 307 and the upper electrode 308 are electrically connected to conductive plugs 310 and 311 embedded in the Si substrate 70q via a wiring layer and a contact metal layer.

In the organic photoelectric conversion section 303, interlayer insulating films 312 and 313 are formed on the surface 306 of the Si substrate 70q. In the interlayer insulating film 312, through holes are provided in regions facing the conductive plugs 310 and 311, respectively, and conductive plugs 314 and 315 are respectively embedded in the through holes. In the interlayer insulating film 313, wiring layers 316 and 317 are embedded in regions facing the conductive plugs 314 and 315, respectively.

The lower electrode 307 and a wiring layer 319 are provided on the interlayer insulating film 313. The wiring layer 319 is electrically isolated from the lower electrode 307 by an insulating film 318. The organic photoelectric conversion layer 309 is formed on the lower electrode 307 out of the wiring layer 319 and the lower electrode 307, and the upper electrode 308 is formed so as to cover the organic photoelectric conversion layer 309. On the upper electrode 308, a protective film 320 is formed so as to cover the surface of the upper electrode 308. A contact hole 321 is provided in a predetermined region of the protective film 320, and a contact metal layer 322 with which the contact hole 321 is filled and that extends to the upper surface of the wiring layer 319 is formed on the protective film 320.

The conductive plug 314 functions as a connector together with the conductive plug 310, and forms a transmission path for electric charge (electron) from the lower electrode 307 to a green power storage layer 323 together with the conductive plug 310 and the wiring layer 316. The conductive plug 315 functions as a connector together with the conductive plug 311 and forms a discharge path for electric charge (hole) from the upper electrode 308 together with the conductive plug 311, the wiring layer 317, the wiring layer 319, and the contact metal layer 322.

The conductive plugs 314 and 315 can be constituted by a laminated film of a metal material such as titanium (Ti), titanium nitride (TiN), and tungsten (W) in order to function as a light-shielding film. Further, use of such a laminated film can ensure a contact between the conductive plugs 310 and 311 and silicon, even in a case where the conductive plugs 310 and 311 are formed as n-type or p-type semiconductor layers.

The interlayer insulating film 312 can be formed using an insulating film having a small interface state in order to reduce the interface state with a silicon layer 324 of the Si substrate 709 and to suppress the generation of dark current from the interface with the silicon layer 324. As such an insulating film, a laminated film of a hafnium oxide (HfO2) film and a silicon oxide (SiO2) film can be used, for example. The interlayer insulating film 313 is, for example, a single-layer film including one of silicon oxide, silicon nitride (SiN), silicon oxynitride (SiON), and the like, or a laminated film including two or more of these materials.

The insulating film 318 is, for example, a single-layer film including one of silicon oxide, silicon nitride, silicon oxynitride, and the like, or a laminated film including two or more of these materials. The insulating film 318 has, for example, a planarized surface, so that the insulating film 318 has a shape and a pattern with almost no level difference with respect to the lower electrode 307. The insulating film 318 has a function of electrically isolating the lower electrodes 307 of pixels of the pixel 50q from each other.

The lower electrode 307 is provided in a region which faces the inorganic photoelectric conversion sections 304 and 305 arranged within the Si substrate 70q in the vertical direction and which covers the inorganic photoelectric conversion sections 304 and 305. The lower electrode 307 includes a light-transmitting conductive film. For example, the lower electrode 307 includes indium tin oxide (ITO).

However, as a constituent material of the lower electrode 307, a tin oxide (SnO2) material to which a dopant is added, or a zinc oxide (ZnO) material obtained by adding a dopant to aluminum zinc oxide may be used in place of indium tin oxide. Examples of the zinc oxide material include aluminum-doped zinc oxide (AZO) containing aluminum (Al) as a dopant, gallium-doped zinc oxide (GZO) containing gallium (Ga) as a dopant, and indium-doped zinc oxide (IZO) containing indium (In) as a dopant. Further, CuI, InSbO4, ZnMgO, CuInO2, MgIN2O4, CdO, ZnSnO3, etc. may be used, in addition to the abovementioned materials. It is to be noted that, in FIG. 23, the lower electrode 307 is separated for each pixel, since the signal charge (electron) obtained in the organic photoelectric conversion layer 309 is extracted from the lower electrode 307.

The organic photoelectric conversion layer 309 includes, for example, three types of materials, that is, first organic semiconductor material, second organic semiconductor material and/or third organic semiconductor material. Any of the three types of organic semiconductor materials is either an organic p-type semiconductor or an organic n-type semiconductor or both of the organic p-type semiconductor and the organic n-type semiconductor. Further, any of the three types of organic semiconductor materials photoelectrically converts light in a selective wavelength range, while transmitting light in another wavelength range.

Specifically, the organic photoelectric conversion layer 309 has a maximum absorption wavelength in, for example, a range of 450 nm to 650 nm inclusive as a green wavelength.

Another layer (not shown) may be provided between the organic photoelectric conversion layer 309 and the lower electrode 307 and between the organic photoelectric conversion layer 309 and the upper electrode 308. For example, an undercoat film, a hole transport layer, an electron blocking film, the organic photoelectric conversion layer 309, a hole blocking film, a buffer film, an electron transport layer, and a work function adjusting film are laminated in this order from the lower electrode 307 side.

The upper electrode 308 includes a light-transmitting conductive film similar to that of the lower electrode 307. The upper electrode 308 may be separated for each pixel, or may be formed as an electrode common to each pixel. The thickness of the upper electrode 308 is, for example, 10 nm to 200 nm.

The protective film 320 is, for example, a single-layer film including one of silicon oxide, silicon nitride, silicon oxynitride, and the like, or a laminated film including two or more of these materials. The thickness of the protective film 320 is, for example, 100 nm to 30,000 nm.

The contact metal layer 322 includes, for example, any one of titanium, tungsten, titanium nitride, aluminum, and the like, or is a laminated film including two or more of these materials.

The inorganic photoelectric conversion sections 304 and 305 are photodiodes (PDs) each having a pn junction, and are formed in the order of the inorganic photoelectric conversion sections 304 and 305 from the surface 306 side in an optical path within the Si substrate 70q. The inorganic photoelectric conversion section 304 selectively detects blue light and accumulates signal charges corresponding to blue color. The inorganic photoelectric conversion section 304 extends from a selective region along the surface 306 of the Si substrate 70q to a region near the interface with the multilayer wiring layer 302, for example.

The inorganic photoelectric conversion section 305 selectively detects red light and accumulates signal charges corresponding to red color. The inorganic photoelectric conversion section 305 is formed, for example, in a region below the inorganic photoelectric conversion section 304 (the surface 301 side). Note that blue is a color corresponding to, for example, a wavelength range of 450 nm to 495 nm, and red is a color corresponding to, for example, a wavelength range of 620 nm to 750 nm. It is sufficient that the inorganic photoelectric conversion sections 304 and 305 can detect light in a portion of or all of the respective wavelength ranges.

The pixel in FIG. 23 has a stacked structure in which the organic photoelectric conversion section 303 and two inorganic photoelectric conversion sections 304 and 305 are stacked in the vertical direction. The organic photoelectric conversion section 303 absorbs (detects) and photoelectrically converts green light, the inorganic photoelectric conversion section 304 absorbs (detects) and photoelectrically converts blue light, and the inorganic photoelectric conversion section 305 absorbs (detects) and photoelectrically converts red light. Therefore, the pixel shown in FIG. 23 can acquire red, green, and blue color signals in one pixel by performing vertical spectroscopy in the vertical (layer) direction.

The technology according to the present disclosure can be applied to the pixel 50q as described above, and a strong electric field region 351 including an N-type solid-phase diffusion layer and a P-type solid-phase diffusion layer is formed in each of the inorganic photoelectric conversion section 304 and the inorganic photoelectric conversion section 305.

The strong electric field region 351 formed in the inorganic photoelectric conversion section 304 and the inorganic photoelectric conversion section 305 will be described with reference to FIG. 24. The strong electric field region 351 includes the P-type solid-phase diffusion layer 361 and the N-type solid-phase diffusion layer 362.

More specifically, the P-type solid-phase diffusion layer 361 and an N-type solid-phase diffusion layer 362-2 are formed in the inorganic photoelectric conversion section 304, and the P-type solid phase diffusion layer 361 and an N-type solid-phase diffusion layer 362-1 are formed in the inorganic photoelectric conversion section 305. The P-type solid-phase diffusion layer 361 formed in the inorganic photoelectric conversion section 304 and the inorganic photoelectric conversion section 305 is continuously formed.

Further, a sidewall film 385 is formed in the interface of the Si sidewall of the P-type solid-phase diffusion layer 361, and a center portion of the sidewall film 385 is filled with a filler 386. The filler 386 can be a film including polysilicon or SiO2 as a material, like the filler 86 in the abovementioned embodiments.

The silicon layer 324 exists between the inorganic photoelectric conversion section 304 and the inorganic photoelectric conversion section 305. The silicon layer 324 separates the inorganic photoelectric conversion section 304 and the inorganic photoelectric conversion section 305 from each other. In the silicon layer 324, a P-type vertical isolation region 371 is formed. Further, the silicon layer between the P-type isolation region 371 and the inorganic photoelectric conversion section 304 and the silicon layer between the P-type isolation region 371 and the inorganic photoelectric conversion section 305 may be an N-type.

As described above, the strong electric field region 351 constituted by the P-type solid-phase diffusion layer 361 and the N-type solid-phase diffusion layer 362-2 exists in the inorganic photoelectric conversion section 304, and the strong electric field region 351 constituted by the P-type solid-phase diffusion layer 361 and the N-type solid-phase diffusion layer 362-1 exists in the inorganic photoelectric conversion section 305. Further, the P-type solid-phase diffusion layer 361 exists on the interface between the sidewall film 385 and the Si sidewall. Therefore, as in the abovementioned embodiments, electric charge accumulation regions can be formed in the inorganic photoelectric conversion section 304 and the inorganic photoelectric conversion section 305, respectively, without causing weakening of pinning of electric charge, whereby deterioration in dark characteristics caused by electric charge flowing into the inorganic photoelectric conversion section 304 or 305 can be prevented. In addition, due to the electric charge accumulation regions being formed on the sidewalls of the photoelectric conversion sections 304 and 305, the electric charge accumulation regions per unit pixel cell area can be increased.

The manufacturing process of the pixel 50q according to the fifteenth embodiment, in particular, the process of forming the P-type solid-phase diffusion layer 361 and the N-type solid-phase diffusion layer 362 that constitute the strong electric field region 351, will be described with reference to FIGS. 25 and 26. Note that the method for forming the P-type solid-phase diffusion layer 361 and the N-type solid-phase diffusion layer 362 is basically similar to the method described with reference to FIGS. 20 to 22. Therefore, the detailed description thereof will be omitted as appropriate.

In step S101, a trench is formed up to a position not reaching the P-type isolation region 371. Thereafter, a silicon oxide film (PSG film) 381 containing, for example, phosphorus (P) is formed. The PSG film 381 is formed on the bottom surface and side surface of the trench and on the wafer. This step S101 can be performed by executing a process equivalent to the processes in steps S51 to S53 shown in FIG. 20.

In step S102, a thermal diffusion treatment is performed, by which phosphorus (P) is diffused by solid-phase diffusion from the PSG film 381 to the Si substrate 70q in a region where the PSG film 381 and the Si substrate 70q are in contact with each other. As a result, an N-type impurity region 382 is formed. The N-type impurity region 382 is a portion corresponding to the N-type solid-phase diffusion layer 362-1. Thereafter, the PSG film 381 is removed. This step S102 can be performed by executing processes equivalent to the processes in steps S54 and S55 shown in FIG. 20.

In step S103, the trench is further drilled. In step S103, the trench is drilled through the P-type region 371 to a portion where the N-type solid-phase diffusion layer 362-2 is to be formed. Further, the PSG film 383 is formed. The PSG film 383 is formed on the bottom surface and side surface of the trench and on the wafer as in step S101.

In step S104, a protective resist 384, for example, is formed at a depth where the PSG film 383 is to be left. The protective resist 384 is formed in such a way that an unnecessary part of the protective resist 384 is removed by wet etching. The depth at which the PSG film 383 is to be left indicates a portion where the N-type solid-phase diffusion layer 362-2 is to be formed. The protective resist 384 is an embedded film having a high selectivity to a chemical. Note that a coating film that can be embedded in the trench may be used instead of the protective resist.

In step S105, the PSG film 383 which needs to be removed is removed. In this case, the PSG film 383 in a region other than the region where the N-type solid-phase diffusion layer 362-2 is to be formed, in other words, other than the region where the protective resist 354 exists, is removed. After the PSG film 383 which needs to be removed is removed, the protective resist 354 is also removed.

In step S106 (FIG. 26), a thermal diffusion treatment is performed as in step S102, by which phosphorus (P) is diffused by solid-phase diffusion from the PSG film 383 to the Si substrate 70q in a region where the PSG film 383 and the Si substrate 70q are in contact with each other. As a result, an N-type impurity region 385 is formed. The N-type impurity region 385 is a portion corresponding to the N-type solid-phase diffusion layer 362-2. Thereafter, the PSG film 383 is removed.

In step S107, a thermal treatment is additionally performed, by which N-type phosphorus (P) is diffused, and the N-type region is thereby expanded. Thus, the portions corresponding to the N-type solid-phase diffusion layer 362-1 and the N-type solid-phase diffusion layer 362-2 are formed. Due to the additional thermal treatment as described above, the PN junction region can be formed in the sidewall of the trench at a desired concentration and depth after the P-type solid-phase diffusion region is formed in the subsequent steps.

In step S108, a silicon oxide film (BSG film) 386 containing, for example, boron (B) is formed.

In step S109, a thermal diffusion treatment is performed, by which boron (B) is diffused by solid-phase diffusion from the BSG film 386 to the Si substrate 70q in a region where the BSG film 386 and the Si substrate 70q are in contact with each other. As a result, a P-type impurity region is formed. The P-type impurity region is a portion corresponding to the P-type solid-phase diffusion layer 361. Thereafter, the BSG film 386 is removed.

Figure 22:
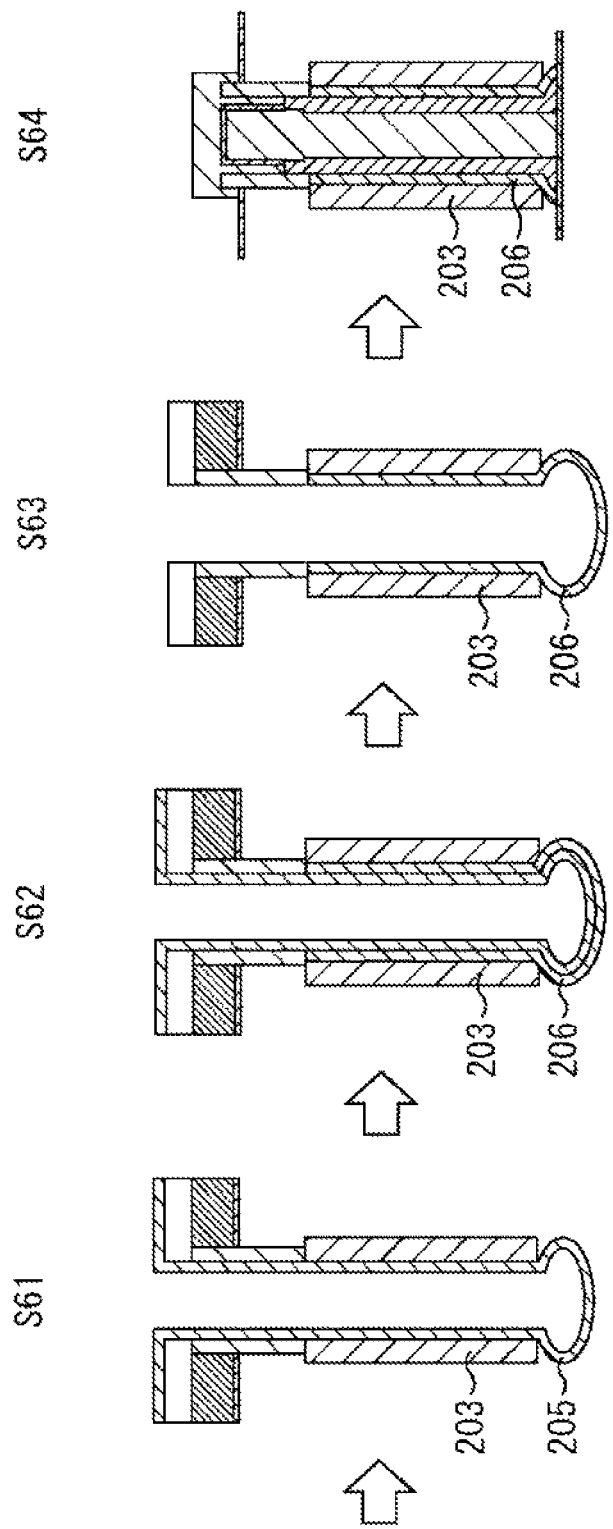
FIG. 22 is a view for describing the manufacture of a strong electric field region.

Steps S108 and S109 can be performed by executing processes equivalent to the processes in steps S61 to S63 shown in FIG. 22. Thereafter, in step S110, the sidewall film 385 and the filler 386 are formed on the Si surface of the trench sidewall on which the P-type solid-phase diffusion layer 361 is formed, and then, the formed sidewall film 385 and the filler 386 are etched back and embedded. The process in step S110 corresponds to the process in step S64 (FIG. 22). Then, an oxide film is formed, and the formed oxide film is planarized by CMP, whereby the upper part is covered by the oxide film. Thus, the strong electric field region 351, the P-type solid-phase diffusion layer, and the N-type solid-phase diffusion layer as shown in FIG. 24 are formed. The P-type solid-phase diffusion layer is formed on the surface of the Si sidewall of the trench, and the N-type solid-phase diffusion layer is formed at a position deeper than the P-type solid-phase diffusion layer.

Figure 27:
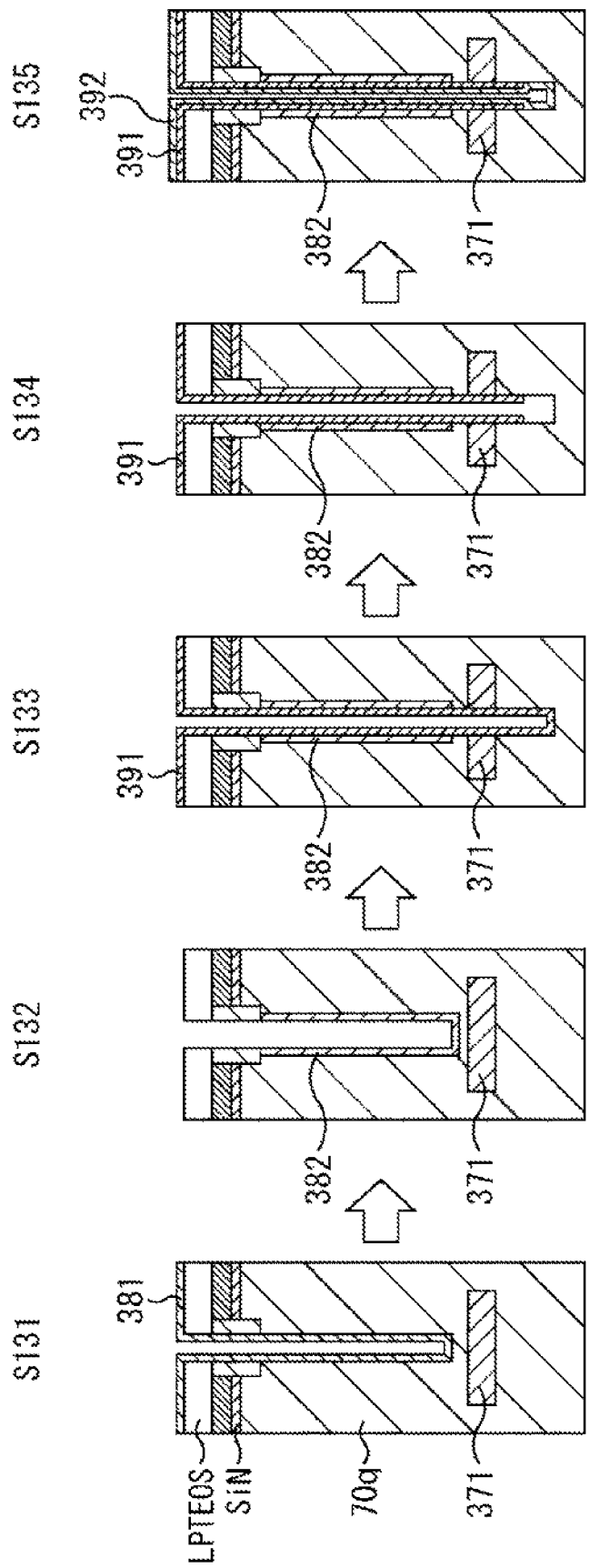
FIG. 27 is a view for describing the manufacture of a strong electric field region.
Figure 28:
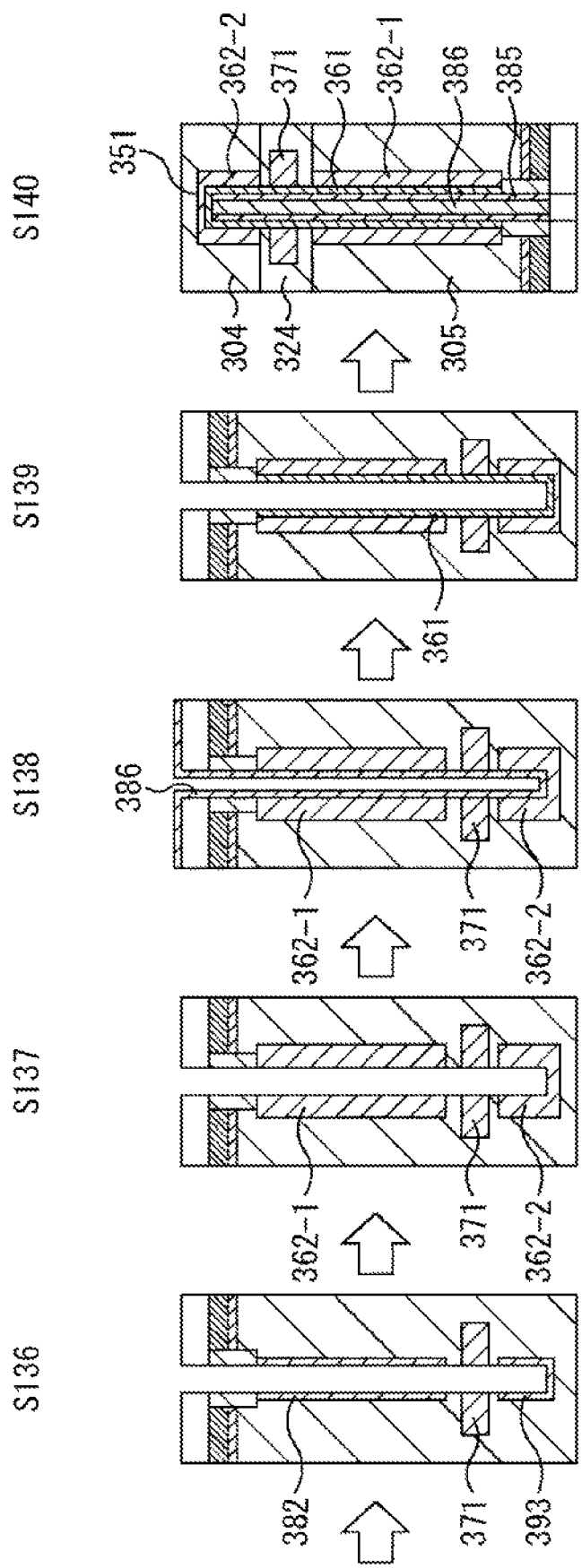
FIG. 28 is a view for describing the manufacture of a strong electric field region.

The manufacturing process of the pixel 50q according to the fifteenth embodiment, in particular, another process of forming the P-type solid-phase diffusion layer 361 and the N-type solid-phase diffusion layer 352 that constitute the strong electric field region 351, will be described with reference to FIGS. 27 and 28.

Figure 25:
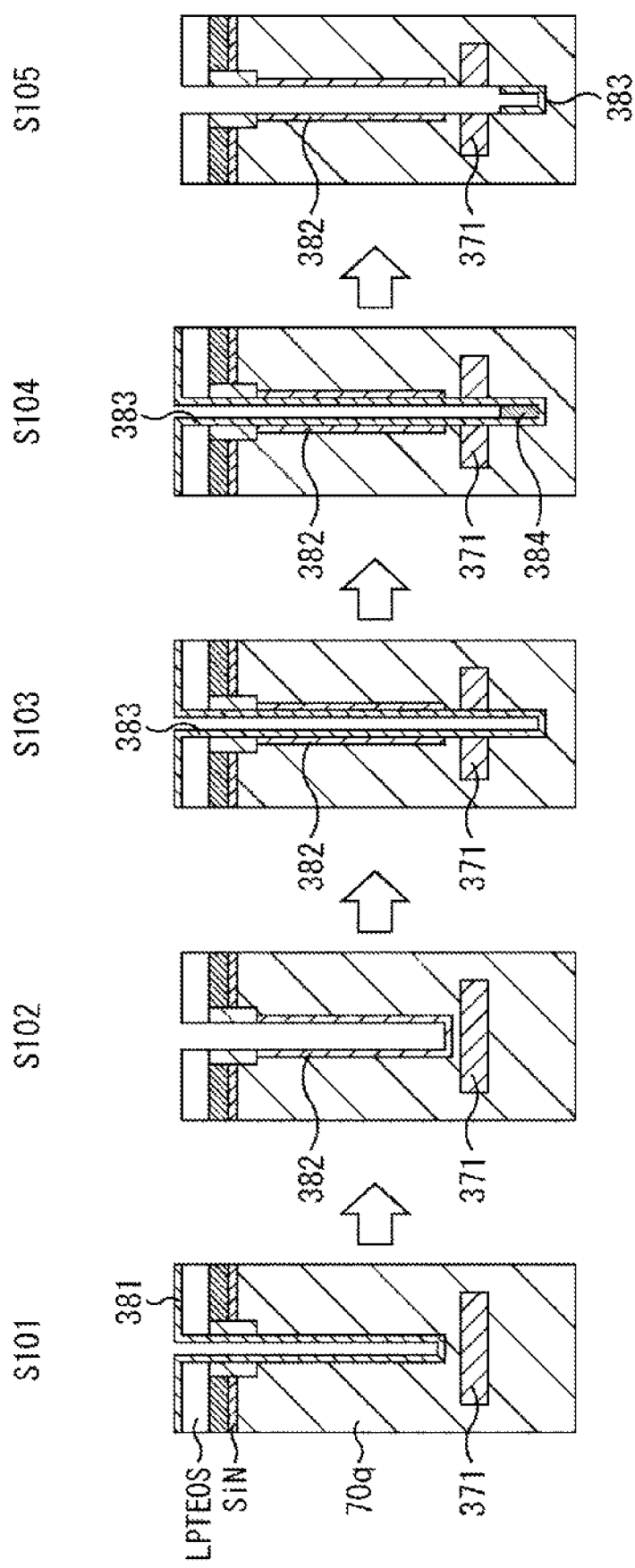
FIG. 25 is a view for describing the manufacture of a strong electric field region.
Figure 26:
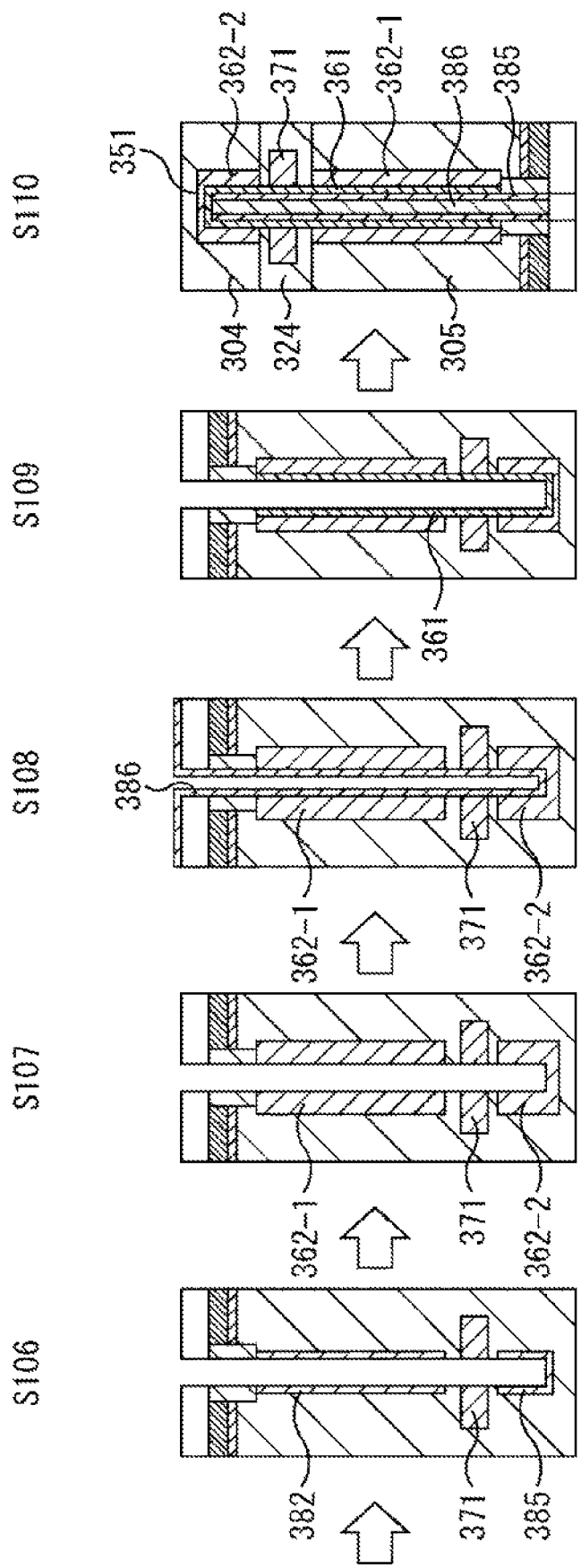
FIG. 26 is a view for describing the manufacture of a strong electric field region.

Steps S131 and S132 are similar to steps S101 and S102 (FIG. 25). Specifically, a trench is formed, the PSG film 381 is formed in the trench, and the N-type impurity region 382 is formed by solid-phase diffusion.

In step S133, the trench is further drilled as in step S103 (FIG. 25). Then, a stopper film 391 is formed. In step S134, an unnecessary part of the stopper film 391 is removed. The stopper film 391 is formed to a depth not reaching a portion where a PSG film 392 to be formed in step S135 is to be left. The depth not reaching a portion where the PSG film 392 is to be left is a depth not reaching a portion where the N-type solid-phase diffusion layer 362-2 is to be formed.

The stopper film 391 is formed as described below, for example. Specifically, the stopper film 391 is formed on the entire surface of the trench drilled to the portion where the N-type solid-phase diffusion layer 362-2 is to be formed. A protective film is subsequently formed, and then, the protective film is etched on the entire surface to expose the stopper film 391 on the bottom of the trench. Thereafter, the stopper film 391 is treated with a chemical which has a selectivity to the protective film and which can etch the stopper film 391 at the bottom of the trench. With this process, only the stopper film 391 at the bottom of the trench not covered by the protective film is removed.

In step S135, the PSG film 392 is formed. The PSG film 392 is formed on the bottom surface and side surface of the trench (on the stopper film 391) and on the wafer.

In step S136 (FIG. 28), an N-type impurity region 393 is formed by performing a thermal diffusion treatment. Further, after the N-type impurity region 393 is formed, the PSG film 392 is removed, and the stopper film 391 is removed.

In step S137, a thermal diffusion treatment is further performed, so that the N-type impurity regions 382 and 393 are expanded. Thus, the portions corresponding to the N-type solid-phase diffusion layer 362-1 and the N-type solid-phase diffusion layer 362-2 are formed.

In steps S138 and S139, processes similar to the processes in steps S108 and S109 (FIG. 26) are performed, whereby the P-type solid-phase diffusion layer 361 is formed. Thereafter, the sidewall film 385 and the filler 386 are formed on the Si surface of the trench sidewall on which the P-type solid-phase diffusion layer 361 is formed, and then, the formed sidewall film 385 and the filler 386 are etched back and embedded. This process corresponds to the process in step S110 (FIG. 26). Then, an oxide film is formed, and the formed oxide film is planarized by CMP, whereby the upper part is covered by the oxide film. Thus, the strong electric field region 351, the P-type solid-phase diffusion layer, and the N-type solid-phase diffusion layer as shown in FIG. 24 are formed. The P-type solid-phase diffusion layer is formed on the surface of the Si sidewall of the trench, and the N-type solid-phase diffusion layer is formed at a position deeper than the P-type solid-phase diffusion layer.

When the N-type impurity region (region corresponding to the N-type solid-phase diffusion layer 362) and the P-type impurity region (region corresponding to the P-type solid-phase diffusion layer 361) are formed by forming the PSG film and the BSG film and performing solid-phase diffusion in the processes described with reference to FIGS. 25 to 28, the impurity regions may be formed by ion implantation, plasma doping, or the like.

Figure 24:
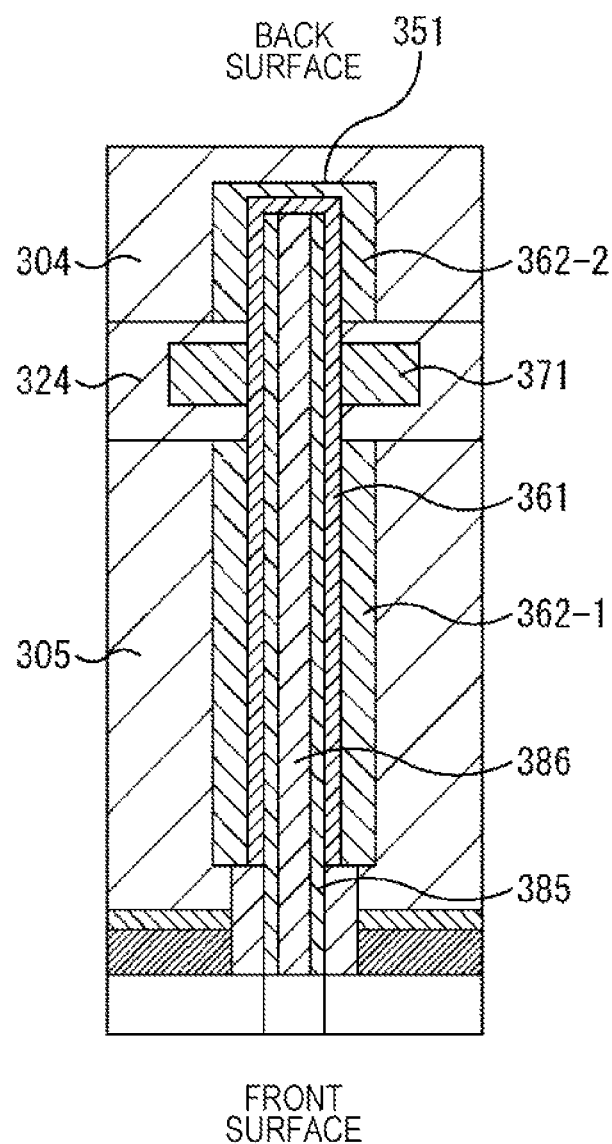
FIG. 24 is a view for describing a configuration example of a DTI.

In this manner, the strong electric field region 351 shown in FIG. 24 is formed. The pixel 50q can be manufactured which includes the strong electric field region 351 constituted by the P-type solid-phase diffusion layer 361 and the N-type solid-phase diffusion layer 362-1 in the inorganic photoelectric conversion section 304 and the strong electric field region 351 constituted by the P-type solid-phase diffusion layer 361 and the N-type solid-phase diffusion layer 362-2 in the inorganic photoelectric conversion section 305 as described with reference to FIGS. 23 and 24.

Therefore, in the pixel 50q according to the fifteenth embodiment, electric charge accumulation regions due to a strong electric field can also be formed in the inorganic photoelectric conversion sections 304 and 305 without weakening the pinning of electric charge. Thus, deterioration in dark characteristics caused by electric charge flowing into the inorganic photoelectric conversion section 304 or 305 can be prevented. In addition, due to the electric charge accumulation regions being formed on the sidewalls of the photoelectric conversion sections 304 and 305, the electric charge accumulation regions per unit pixel cell area can be increased.

In addition, the position of the vertical spectral P-type isolation region relative to the depth of the N-type solid-phase diffusion layer 362, that is, the position of the silicon layer 324 located between the N-type solid-phase diffusion layer 362-1 and the N-type solid-phase diffusion layer 362-2 relative to the depth of the N-type solid-phase diffusion layer 362-1 and the depth of the N-type solid-phase diffusion layer 362-2 in FIG. 24 (for example, the depth of the N-type solid-phase diffusion layer 362-1 and the depth of the N-type solid-phase diffusion layer 362-2 by which the P-type vertical isolation region 371 is located between the N-type solid-phase diffusion layer 362-1 and the N-type solid-phase diffusion layer 362-2) is appropriately controlled. Such control enables the formation of the strong electric field region 351 on the sidewall of the trench without causing deterioration in isolation performance due to a decrease in the concentration of a P-type impurity in the P-type vertical isolation region by the N-type solid-phase diffusion layer. Accordingly, an increase in the Qs and suppression of color mixing in the vertical direction can be both achieved.

Sixteenth Embodiment

Figure 29:
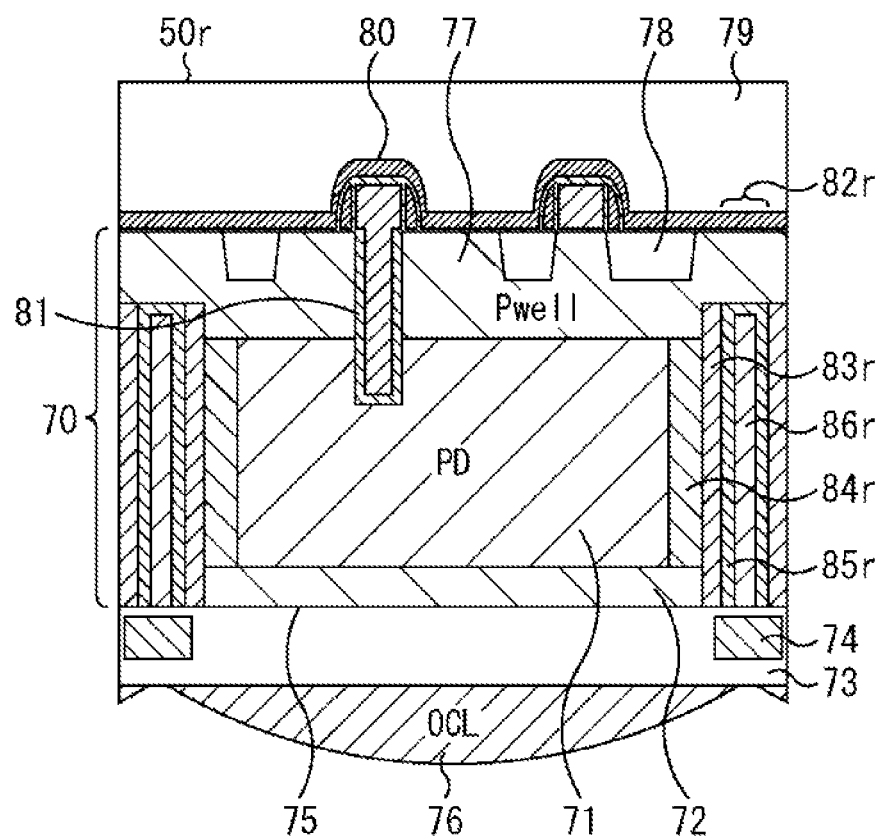
FIG. 29 is a vertical sectional view showing a sixteenth configuration example of the pixel to which the present technology is applied.

FIG. 29 is a vertical sectional view of a pixel 50r according to a sixteenth embodiment to which the present technology is applied.

In the abovementioned embodiments, the DTI 82 penetrates the Si substrate 70 of the pixel 50. The pixel 50r according to the sixteenth embodiment is different from, for example, the pixel 50a according to the first embodiment in that a DTI 82r does not penetrate the Si substrate 70.

In the pixel 50r, the DTI 82r reaches the backside Si interface 75. In contrast, on the front side, the DTI 82r is formed up to the middle of the Pwell region 77 without penetrating the Pwell region 77. In a case where the DTI 82r does not penetrate the Si substrate 70 as described above, a P-type solid-phase diffusion layer 83r and an N-type solid-phase diffusion layer 84r formed in the DTI 82r does not also penetrate the Si substrate 70 and is formed up to the middle of the Pwell region 77.

In the configuration described above, the P-type solid-phase diffusion layer 83r and the N-type solid-phase diffusion layer 84r are also formed on the side surfaces of the PD 71. Therefore, it is also possible to prevent weakening of pinning of electric charge in the PD 71, whereby deterioration in dark characteristics can be prevented.

Figure 30:
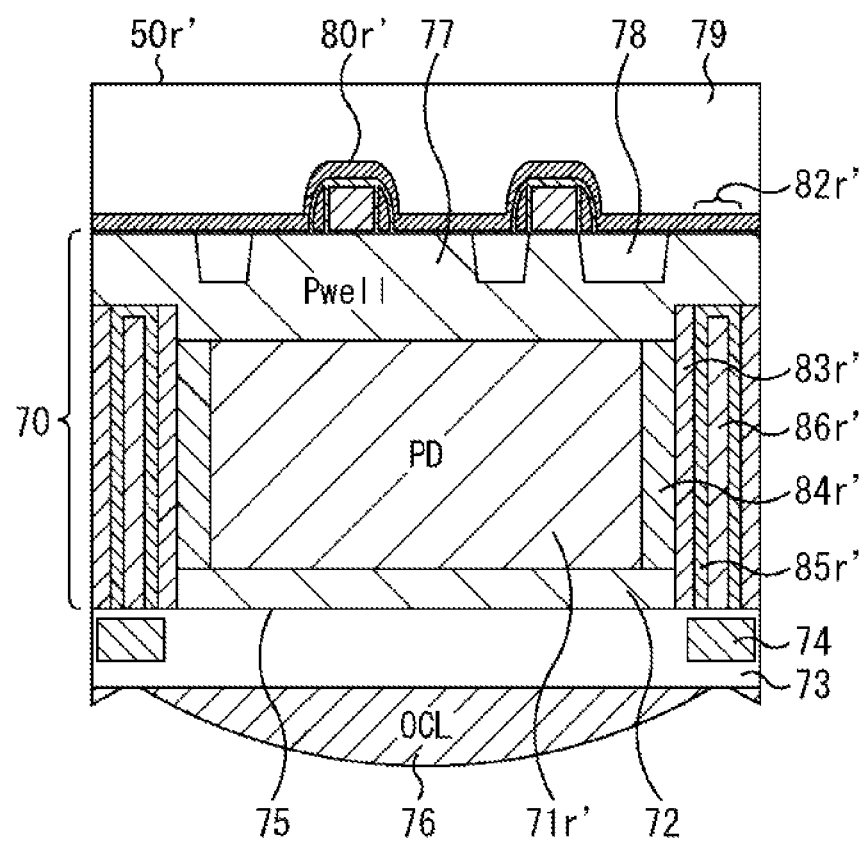
FIG. 30 is a vertical sectional view showing another example of the sixteenth configuration example of the pixel to which the present technology is applied.

Although a transfer transistor 80r of the pixel 50r shown in FIG. 29 includes a vertical transistor trench 81r, a transfer transistor 80r' that does not have a vertical transistor trench 81r' may be used as in a pixel 50r' shown in FIG. 30. Further, although not shown, the pixel 50r' shown in FIG. 30 may be configured such that an N-type region and a P-type region are formed in the Pwell region 77 so as to make the transfer transistor 80r' easily transfer electric charge from the PD 71.

Figure 31:
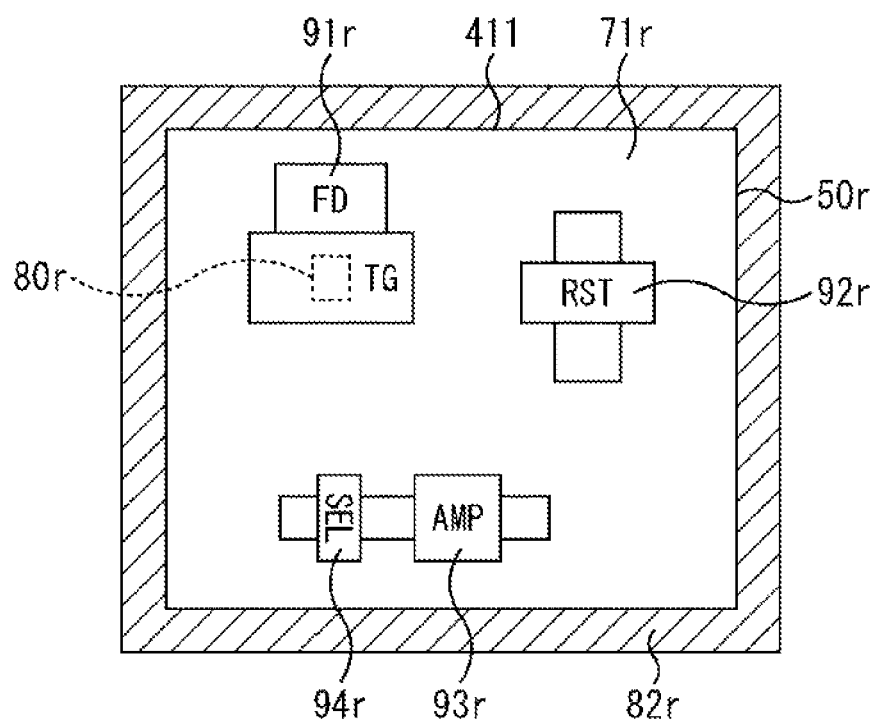
FIG. 31 is a view for describing a shape of a DTI.
Figure 32:
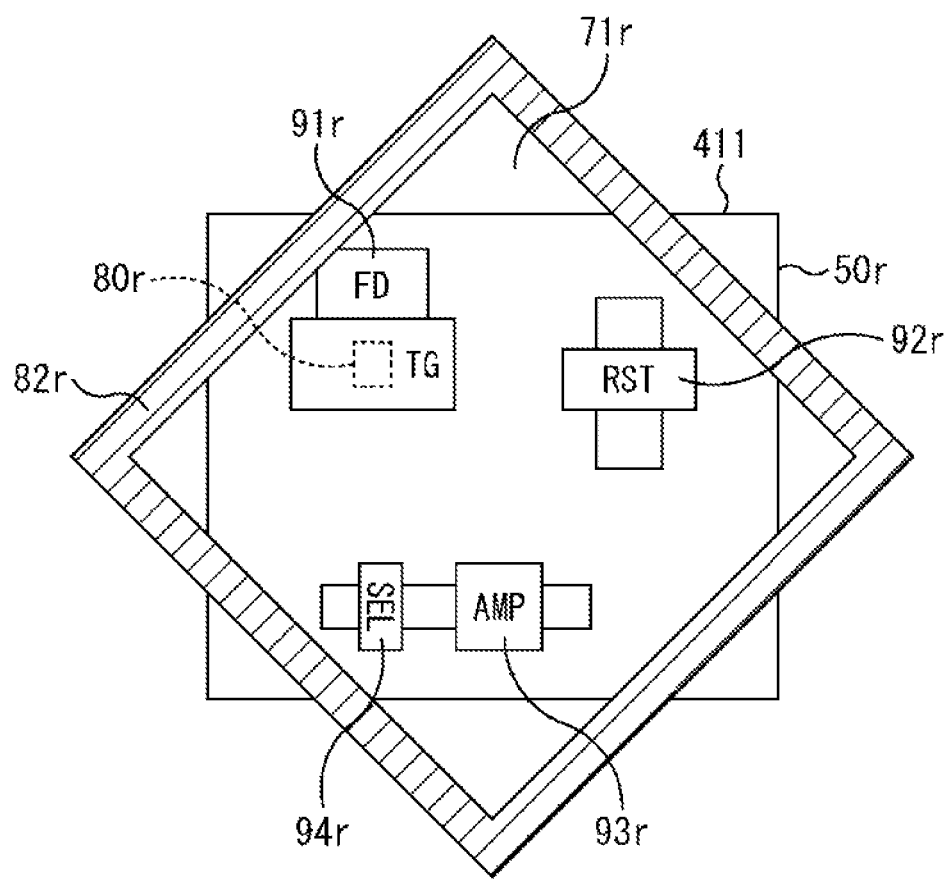
FIG. 32 is a view for describing a shape of a DTI.
Figure 33:
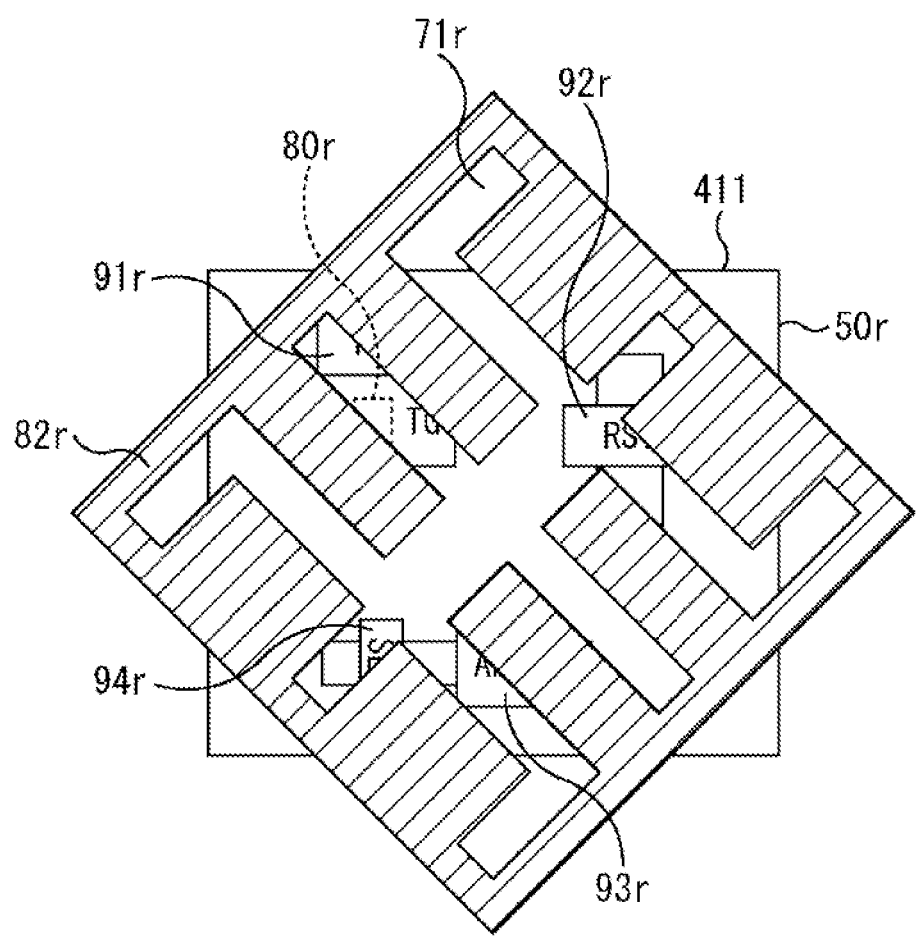
FIG. 33 is a view for describing a shape of a DTI.

Due to the configuration in which the DTI 82r does not penetrate the Si substrate 70 as described above, elements, such as a transistor, disposed on the front surface side and the PD 71 formed on the back surface side can be independently designed. This will be described with reference to FIGS. 31 to 33. FIGS. 31 to 33 are plan views of the pixel 50r as viewed from the front surface.

FIG. 31 shows one of the pixels in a plan view of FIG. 4. The transfer transistor 80r, an FD 91r, a reset transistor 92r, an amplifier transistor 93r, and a selection transistor 94r are disposed on one pixel 50r. Such elements are laid out on the front surface of the pixel 50r. In the example shown in FIG. 31, a trench 82r is formed around such elements, and a region surrounded by the DTI 82r is defined as a PD 71r.

That is, assuming that a rectangle surrounding the arrayed elements is defined as a rectangle 411, the DTI 82r is formed in a region surrounding the rectangle 411. In this case, the rectangle 411 in which the elements are arrayed and the DTI 82r are aligned with each other.

In the pixel 50r shown in FIG. 32, the rectangle 411 in which the elements are arrayed and the DTI 82r are shifted by 45 degrees.

As described with reference to FIGS. 29 and 30, the DTI 82r does not penetrate the Si substrate 70. In other words, a Pwell region 431 exists on the DTI 82r and the surface of the pixel 50r on which the elements are arrayed. Therefore, the layout of the elements and the layout of the DTI 82r can be independently designed. That is, it is unnecessary that the position where the DTI 82r is disposed is not aligned with the rectangle 411 in which the elements are arrayed.

Therefore, as shown in FIG. 32, the rectangle 411 where the elements are arrayed and the DTI 82r can be shifted by 45 degrees. In this case, the portion surrounded by the DTI 82r is also defined as the PD 71r.

Due to the configuration in which the DTI 82r is shifted by 45 degrees with respect to the rectangle 411 in which the elements are arrayed, the sidewall of the DTI 82r is (100) plane. Thus, the interface property can be improved.

As shown in FIG. 33, the DTI 82r, in other words, the PD 71r, can be formed into a shape other than a rectangular shape. The DTI 82r (PD 71r) shown in FIG. 33 has a shape obtained by combining an H shape and an I shape. With such a shape, the area of the sidewall of the PD 71r is increased.

The DTI 82r is formed on the sidewall of the PD 71r, and a strong electric field region constituted by a P-type solid-phase diffusion layer 83r and an N-type solid-phase diffusion layer 84r is formed in the DTI 82r. Therefore, the area of the strong electric field region can be increased by increasing the area of the sidewall of the PD 72r. Accordingly, the effect of further increasing Qs can be obtained.

Note that the shape shown in FIG. 33 is an example, and the PD 71r may have, for example, a polygonal shape, a circular shape, or a shape obtained by combining a plurality of diagrams in a plan view. The PD 71r may have any shape as long as the area of the sidewall of the PD 72r increases and the strong electric field region increases.

<Manufacturing Process>

The manufacturing process of the pixel 50r shown in FIG. 29 will be described. Here, the case where the pixel 50r is manufactured will be described. However, the manufacturing process to be described below is applicable to the manufacture of the pixel 50 in which the DTI 82 penetrates the Si substrate 70, for example, the pixel 50a (FIG. 3).

Figure 34:
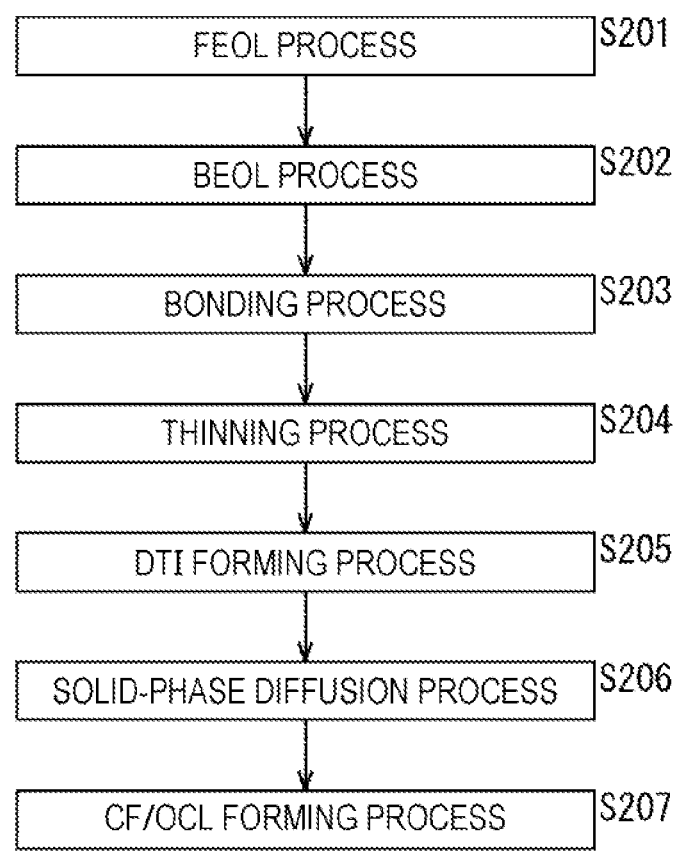
FIG. 34 is a view for describing a first manufacturing process of a pixel.

The manufacturing process (hereinafter referred to as a first manufacturing process) of the pixel 50r will be described with reference to FIGS. 34 and 35.

In step S201, a front end of line (FEOL) process is executed. By the FEOL process, elements such as a transistor (for example, a transfer transistor 80r) is formed on the front surface of the pixel 50r. The substrate that has been subjected to the FEOL process is referred to as an FEOL substrate 422 (FIG. 35). During the FEOL process, the PD 71 and the like are also formed in the Si substrate 70. In FIG. 35, they are formed in a silicon substrate (Si-sub) 423.

In step S202, a back end of line (BEOL) process is performed. By the BEOL process, wires in the pixel 50r are formed. Connection wires for forming a circuit including elements such as transistors formed in the FEOL substrate 422 are formed. The substrate subjected to the BEOL process is referred to as a BEOL substrate 421 (FIG. 35).

Figure 35:
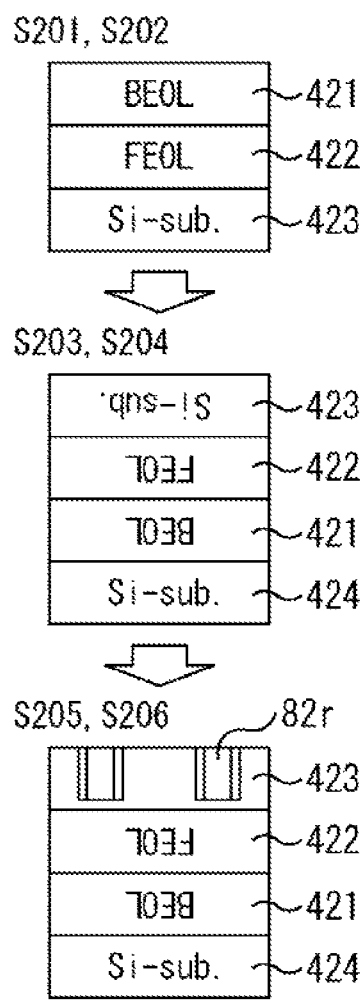
FIG. 35 is a view for describing the first manufacturing process of a pixel.

As shown in FIG. 35, a substrate in which the BEOL substrate 421, the FEOL substrate 422, and the silicon substrate 423 are stacked in order from the top is formed by the processes in step S201 and step S202.

In step S203, the substrate in which the BEOL substrate 421, the FEOL substrate 422, and the silicon substrate 423 are stacked is turned upside down, and a support substrate 424 (Si-sub in FIG. 35) is bonded to the BEOL substrate 421. In FIG. 35, the characters are written upside down to indicate that the corresponding substrates have been turned upside down.

In step S204, the silicon substrate 423 is thinned. In the middle part of FIG. 35, the silicon substrate 423 is on the top. After the support substrate 424 is bonded to the BEOL substrate 241, the silicon substrate 423 is thinned.

In step S205, the DTR 82r is formed in the thinned silicon substrate 423. In step S206, a solid-phase diffusion process is performed, whereby the P-type solid-phase diffusion layer 83r and the N-type solid-phase diffusion layer 84r are formed. The DTR 82r and the solid-phase diffusion layers can be formed by applying, for example, the steps described with reference to FIG. 6 and the steps described with reference to FIGS. 20 to 22.

In step S207, a color filter (CF), an OCL 76, and the like are formed.

In this way, the pixel 50r shown in FIG. 29 can be manufactured.

The solid-phase diffusion process is performed in step S206, and in step S202 prior to step S206, wires are formed (BEOL). The solid-phase diffusion process is usually performed at a high temperature. In a case where a solid-phase diffusion process is performed on a substrate on which wires have already been formed, a material that can withstand high temperature during solid-phase diffusion is used as a material of the wire. Alternatively, the solid-phase diffusion process is performed at a temperature that the material of the wire can withstand.

According to the first manufacturing process, the pixel 50r can be manufactured without increasing the number of processes so much.

Figure 36:
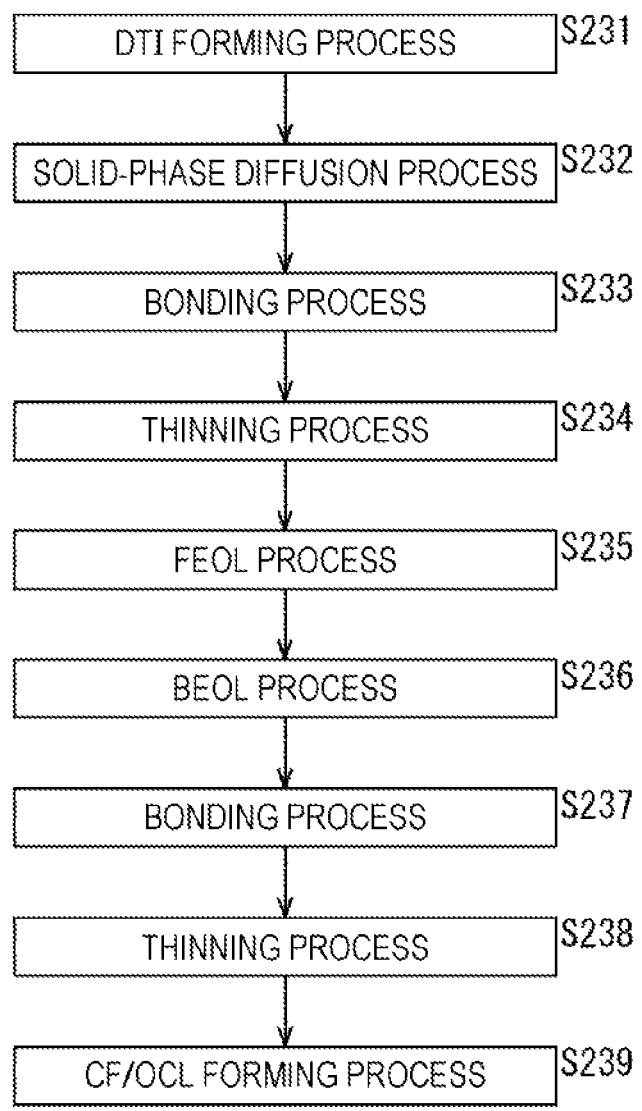
FIG. 36 is a view for describing a second manufacturing process of a pixel.

Another manufacturing process (second manufacturing process) of the pixel 50r will be described with reference to FIGS. 36 and 37. The second manufacturing process includes the same processes as the first manufacturing process, and therefore, the description of the same processes will be appropriately omitted.

In step S231, the DTI 82r is formed in a silicon substrate 451 (FIG. 37). The silicon substrate 451 is thick enough to withstand the step for forming the DTI 82r.

In step S232, a solid-phase diffusion process is performed, whereby the P-type solid-phase diffusion layer 83r and the N-type solid-phase diffusion layer 84r are formed in the silicon substrate 451.

In step S233, the silicon substrate 451 is turned upside down, and a support substrate (Si-sub) 452 is bonded. As shown in the second part of FIG. 37, silicon remains in the area above the DTI 82r of the silicon substrate 451, and the support substrate 452 is bonded on the bottom part.

In step S234, a thinning process is performed, by which the silicon of the silicon substrate 451 remaining in the area above the DTI 82r is removed.

In step S235, an FEOL process is performed, by which an FEOL substrate 453 (FIG. 37) is formed. In step S236, a BEOL process is performed, by which a BEOL substrate 454 (FIG. 37) is formed.

Through the processes so far, a substrate in which the BEOL substrate 454, the FEOL substrate 453, the silicon substrate 451, and the support substrate 452 are stacked in order from the top is formed as shown in the third part of FIG. 37.

In step S237, the substrate in which the BEOL substrate 454, the FEOL substrate 453, the silicon substrate 451, and the support substrate 452 are stacked is turned upside down, and a support substrate 455 is bonded to the BEOL substrate 454.

In step S238, thinning is performed. The thinning is a process of removing the support substrate 452 bonded to the silicon substrate 451. By removing the support substrate 452, the DTI 82r is exposed as shown in the fifth part of FIG. 37.

In step S239, a color filter (CF), an OCL 76, and the like are formed.

In this way, the pixel 50r shown in FIG. 29 can be manufactured.

In a case where the pixel 50r is manufactured in such a process, the solid-phase diffusion is performed before the BEOL process, so that the solid-phase diffusion can be performed at a high temperature.

According to the second manufacturing process, the degree of freedom in selecting the material of wire is improved, and the pixel 50r can be manufactured, even if, for example, a wire using an inexpensive material is used.

Figure 38:
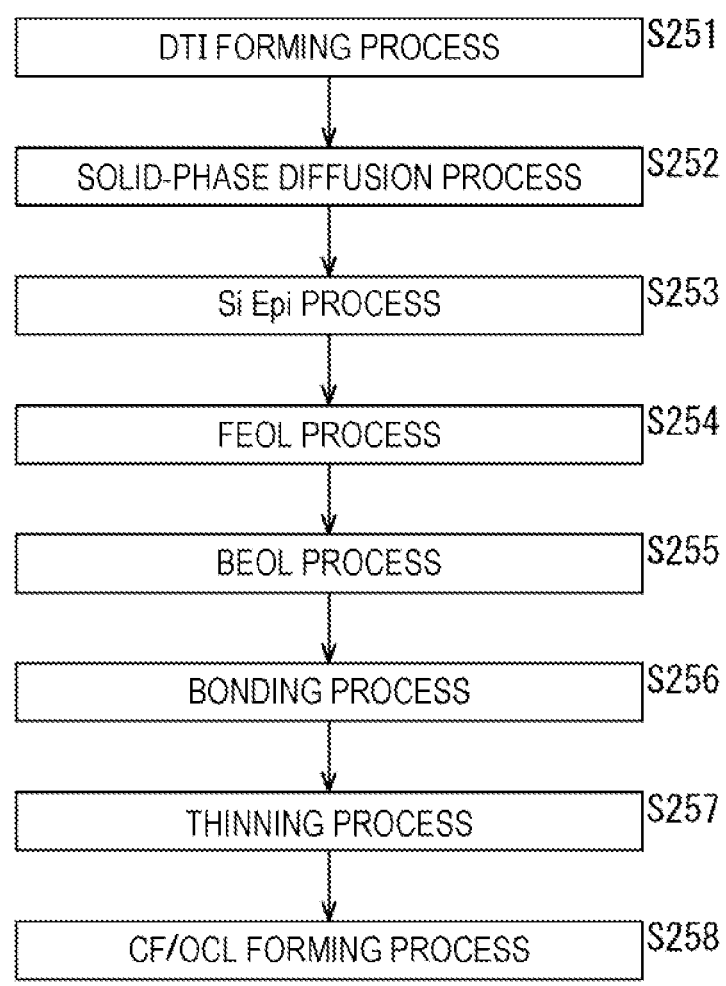
FIG. 38 is a view for describing a third manufacturing process of a pixel.

Still another manufacturing process (third manufacturing process) of the pixel 50r will be described with reference to FIGS. 38 and 39. The third manufacturing process includes the same processes as the first and second manufacturing processes, and therefore, the description of the same processes will be appropriately omitted.

In step S251, the DTI 82r is formed in a silicon substrate 471 (FIG. 39). The silicon substrate 471 is thick enough to withstand the step for forming the DTI 82r.

In step S252, a solid-phase diffusion process is performed, whereby the P-type solid-phase diffusion layer 83r and the N-type solid-phase diffusion layer 84r are formed in the silicon substrate 471.

In step S253, a silicon film 472 is formed on the silicon substrate 471 (on the DTI 82r) by epitaxial growth of silicon on the silicon substrate 471. Due to the epitaxial growth of silicon, a substrate in which the DTI 82r is surrounded by silicon is manufactured as shown in the second part of FIG. 38.

In step S254, an FEOL process is performed, by which an FEOL substrate 473 (FIG. 39) is formed. In step S255, a BEOL process is performed, by which a BEOL substrate 474 (FIG. 39) is formed.

Through the processes so far, a substrate in which the BEOL substrate 474, the FEOL substrate 473, the silicon film 472, and the silicon substrate 471 are stacked in order from the top is formed as shown in the third part of FIG. 39.

In step S256, the substrate in which the BEOL substrate 474, the FEOL substrate 473, the silicon film 472, and the silicon substrate 471 are stacked is turned upside down, and a support substrate 475 is bonded to the BEOL substrate 474. In the substrate in this state, silicon remains in the area above the DTI 82*r* as shown in the fourth part of FIG. 39. The remaining silicon is removed (thinning process in step S257).

In step S258, a color filter (CF), an OCL 76, and the like are formed.

In this way, the pixel 50*r* shown in FIG. 29 can be manufactured.

In a case where the pixel 50*r* is manufactured in such a process, the solid-phase diffusion is performed before the BEOL process, so that the solid-phase diffusion can be performed at a high temperature.

Further, the pixel 50*r* can be formed with a smaller number of steps than in the second manufacturing process.

Seventeenth Embodiment

Figure 40:
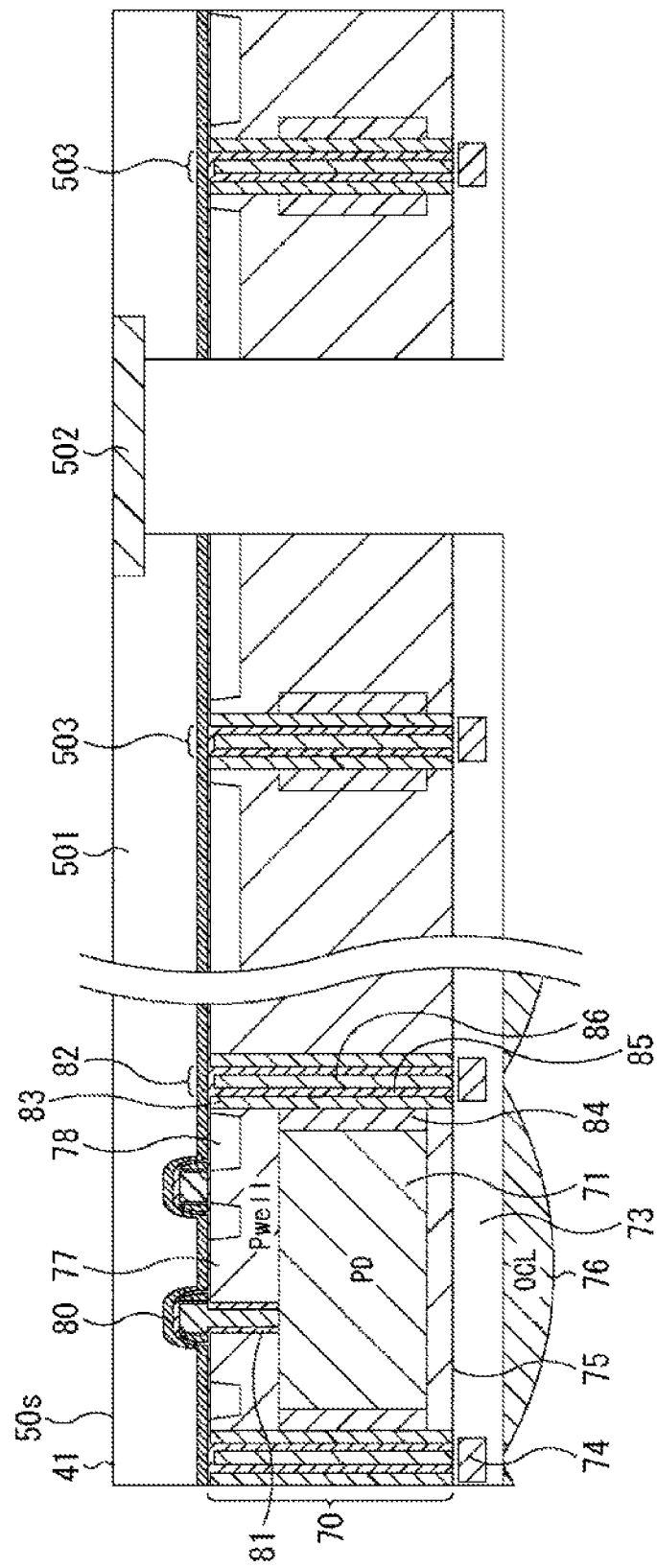
FIG. 40 is a vertical sectional view showing a seventeenth configuration example of the pixel to which the present technology is applied.

FIG. 40 is a vertical sectional view of a pixel 50*s* according to a seventeenth embodiment to which the present technology is applied. Further, FIG. 41 is a plan view of the pixel 50*s* including an AL pad extraction section included in the seventeenth embodiment.

A configuration including an AL pad for connecting the pixel 50 to another semiconductor substrate or the like will be described as the seventeenth embodiment. FIG. 40 shows an example in which an AL pad is provided for the pixel 50*a* in the first embodiment shown in FIG. 3. However, any pixel 50 of the pixels 50*b* to 50*s* according to the second to seventeenth embodiments can be provided with an AL pad by combining with the seventeenth embodiment.

Figure 41:
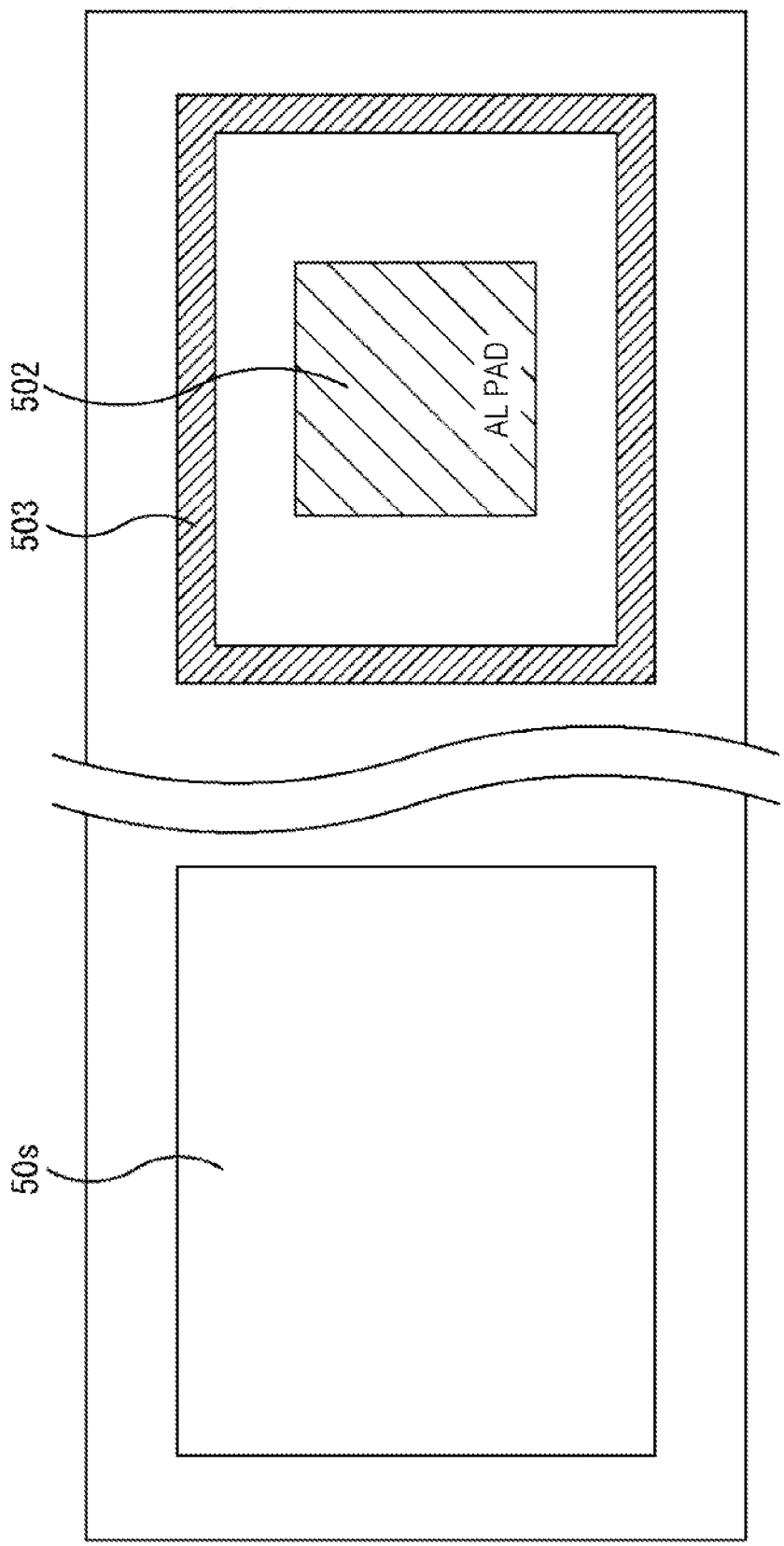
FIG. 41 is a plan view corresponding to the seventeenth configuration example shown in FIG. 40.

As shown in FIGS. 40 and 41, the pixel array section 41 (FIG. 2) is formed on the left side in the figure, and an AL pad extraction section 501 is provided on the right side in the figure. Regarding the AL pad extraction section 501, AL pads 502 that are connection terminals between the pixel 50*s* and other semiconductor substrates and the like are formed in a substrate surface (upper side in the figure).

As shown in FIG. 40, a solid-phase diffusion trench 503 is formed around each AL pad 502 in the AL pad extraction section 501. The solid-phase diffusion trench 503 is formed in a manner similar to the DTI 82 in the first embodiment. Thus, it is possible to electrically isolate each AL pad 502 from the pixel array section 41 and other peripheral circuit sections (not shown).

Note that the solid-phase diffusion trench 503 formed in the AL pad extraction section 501 can be utilized as a mark for photoresist, for example. Moreover, with this, the solid-phase diffusion trench 503 can also be used as an alignment mark for the subsequent processes.

Eighteenth Embodiment

Figure 42:
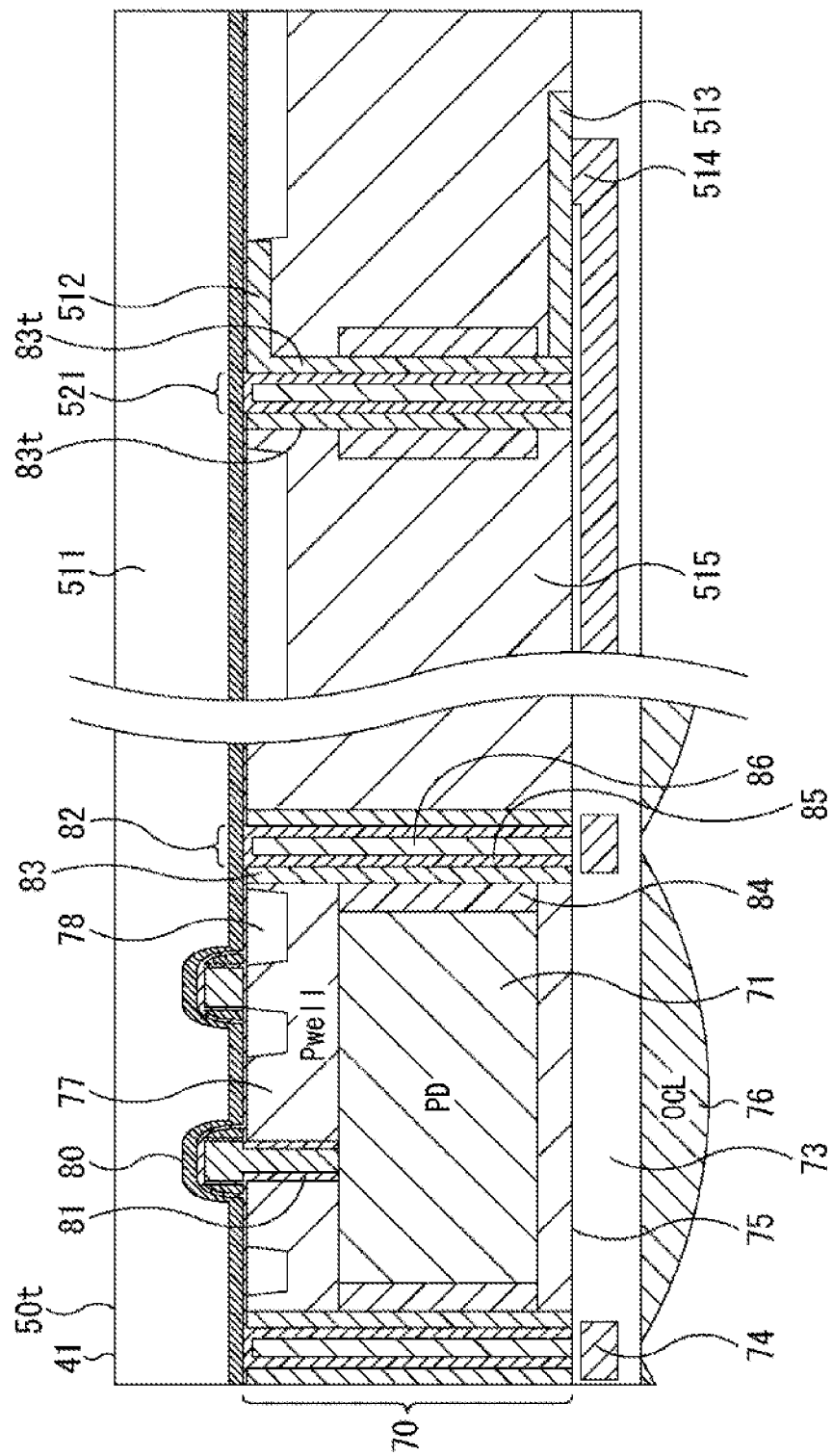
FIG. 42 is a vertical sectional view showing an eighteenth configuration example of the pixel to which the present technology is applied.

FIG. 42 is a vertical sectional view of a pixel 50*t* according to an eighteenth embodiment to which the present technology is applied.

A configuration including the pixel 50 and the peripheral circuit section will be described as the eighteenth embodiment. FIG. 42 shows an example in which a peripheral circuit is provided for the pixel 50*a* in the first embodiment shown in FIG. 3. However, any pixel 50 of the pixels 50*b* to 50*s* according to the second to seventeenth embodiments can be provided with a peripheral circuit by combining with the eighteenth embodiment.

As shown in FIG. 42, the pixel array section 41 (FIG. 2) is formed on the left side in the figure, and a peripheral circuit section 511 is provided on the right side in the figure. A solid-phase diffusion trench 521 is formed in the peripheral circuit section 511. The solid-phase diffusion trench 521 is formed in a manner similar to the DTI 82 in the first embodiment.

A front surface side (upper side in the figure) of a P-type solid-phase diffusion layer 83*t* formed along the solid-phase diffusion trench 521 is electrically connected to a P+ diffusion layer 512 formed in the front surface of the Si substrate 70. Further, the back surface side (lower side in the figure) of the P-type solid-phase diffusion layer 83*t* is electrically connected to a Pwell region 513 formed near the backside Si interface 75 or a hole layer 515 formed by a pinning film in the vicinity of a backside interface of the Si substrate 70.

The Pwell region 513 is connected to a light-shielding film 74 including a metal material such as tungsten (W) via a backside contact 514. As a result, the front surface side and the back surface side of the Si substrate 70 are electrically connected to each other and fixed to potential of the light-shielding film 74.

In the eighteenth embodiment, the P-type solid-phase diffusion layer 83*t* can also serve as the Pwell region, which has been traditionally necessary for connecting the front surface side and the back surface side of the Si substrate 70 to each other. Thus, the number of steps of forming the Pwell region can be reduced.

Nineteenth Embodiment

Figure 43:
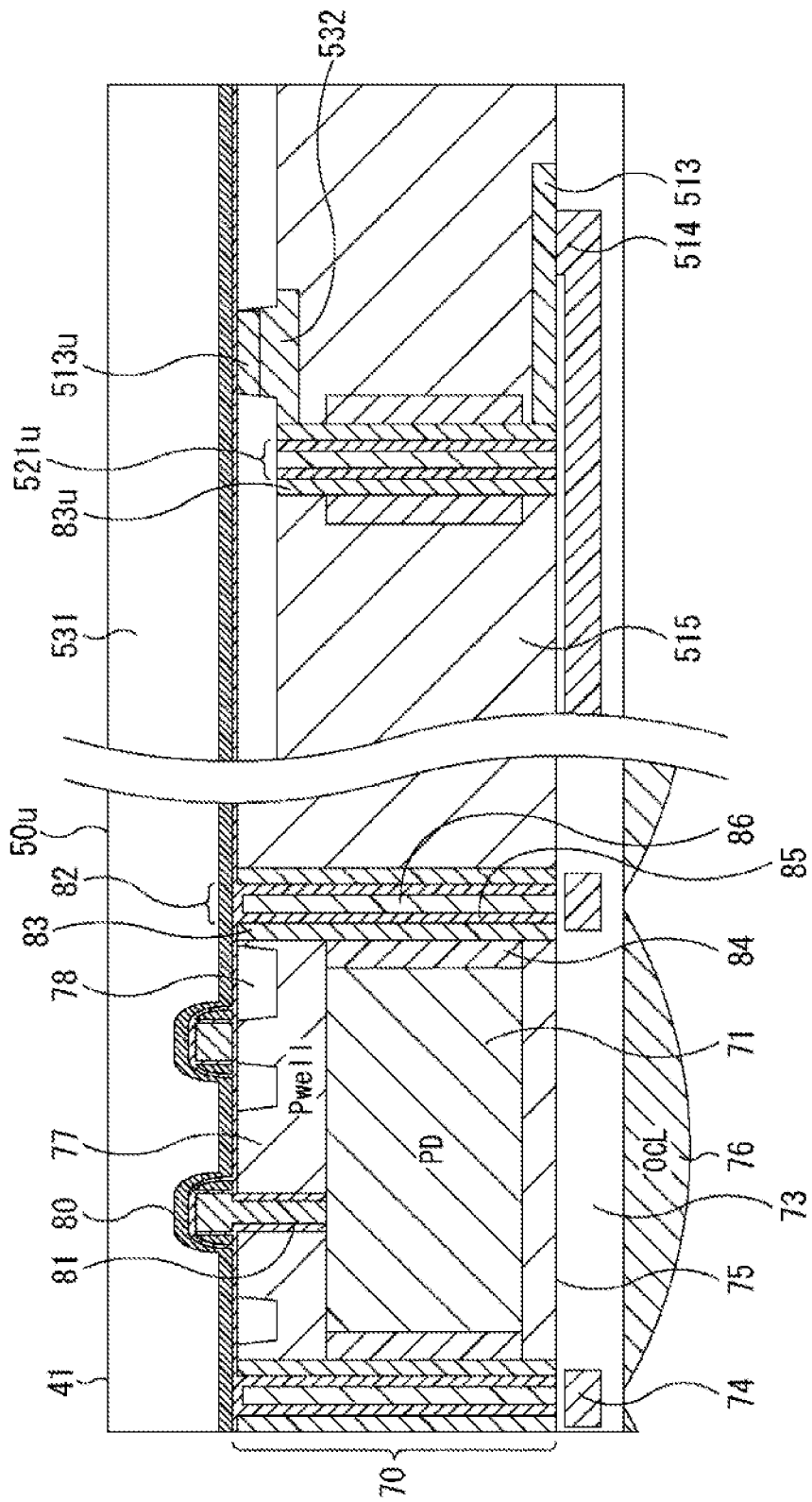
FIG. 43 is a vertical sectional view showing a nineteenth configuration example of the pixel to which the present technology is applied.

FIG. 43 is a vertical sectional view of a pixel 50*u* according to a nineteenth embodiment to which the present technology is applied.

Similar to the eighteenth embodiment, a configuration including the pixel 50 and the peripheral circuit section will be described as the nineteenth embodiment. FIG. 43 shows an example in which a peripheral circuit is provided for the pixel 50*a* in the first embodiment shown in FIG. 3. However, any pixel 50 of the pixels 50*b* to 50*s* according to the second to seventeenth embodiments can be provided with a peripheral circuit by combining with the nineteenth embodiment.

The pixel 50*u* according to the nineteenth embodiment has a pixel array section 41 on the left side in the figure and a peripheral circuit section 531 on the right side in the figure as shown in FIG. 43, like the pixel 50*s* according to the eighteenth embodiment. A solid-phase diffusion trench 321*u* is formed in the peripheral circuit section 531. The solid-phase diffusion trench 321*u* is formed in a manner similar to the DTI 82 in the first embodiment.

A solid-phase diffusion trench 321*u* is formed in the peripheral circuit section 531. The solid-phase diffusion trench 321*u* is formed in a manner similar to the DTI 82 in the first embodiment. The front surface side (upper side in the figure) of a P-type solid-phase diffusion layer 83*u* formed along the solid-phase diffusion trench 321*u* is electrically connected to a P+ diffusion layer 512*u* formed in the front surface of the Si substrate 70 via a Pwell region 532. This point is different from the pixel 50*t* shown in FIG. 42.

Further, the back surface side (lower side in the figure) of the P-type solid-phase diffusion layer 83*u* is electrically connected to a Pwell region 513 formed near the backside Si interface 75 or a hole layer 515. The Pwell region 513 is connected to a light-shielding film 74 including a metal material such as W via a backside contact 514. As a result, the front surface side and the back surface side of the Si substrate 70 are electrically connected to each other and fixed to potential of the light-shielding film 74.

In the nineteenth embodiment, the P-type solid-phase diffusion layer 83*u* can also serve as the Pwell region, which has been traditionally necessary for connecting the front surface side and the back surface side of the Si substrate 70 to each other. Thus, the number of steps of forming the Pwell region can be reduced.

Twentieth Embodiment

Figure 44:
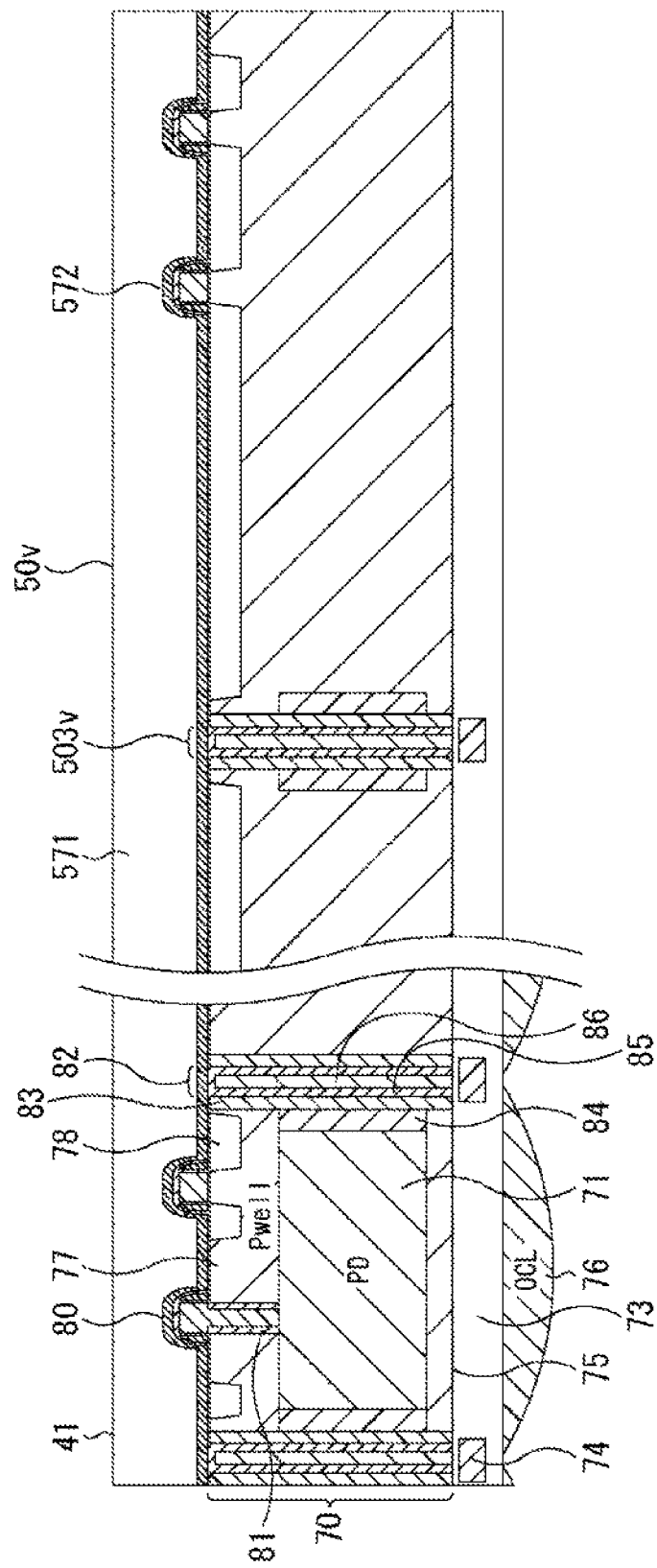
FIG. 44 is a vertical sectional view showing a twentieth configuration example of the pixel to which the present technology is applied.

FIG. 44 is a vertical sectional view of a pixel 50*v* according to a twentieth embodiment to which the present technology is applied.

Similar to the eighteenth embodiment, a configuration including the pixel 50 and the peripheral circuit section will be described as the twentieth embodiment. FIG. 44 shows an example in which a peripheral circuit is provided for the pixel 50*a* in the first embodiment shown in FIG. 3. However, any pixel 50 of the pixels 50*b* to 50*s* according to the second to seventeenth embodiments can be provided with a peripheral circuit by combining with the twentieth embodiment.

The pixel 50*v* according to the twentieth embodiment has a pixel array section 41 on the left side in the figure and a peripheral circuit section 571 on the right side in the figure as shown in FIG. 44, like the pixel 50*s* according to the eighteenth embodiment.

A solid-phase diffusion trench 503 is formed at a boundary section 572 located at a boundary between the pixel array section 41 and the peripheral circuit section 571.

Therefore, the pixel 50*v* according to the twentieth embodiment can provide an effect similar to the effect of the pixel 50*a* according to the first embodiment, and further prevent light generated in the peripheral circuit section 571 from entering the pixel array section 41 due to the solid-phase diffusion trench 503*v*.

Note that the abovementioned first to twentieth embodiments can be appropriately combined.

<First Modification>

In the abovementioned first to twentieth embodiments, each pixel 50 has the FD 91 (FIG. 4) and the pixel transistor (for example, the reset transistor 92 (FIG. 2) and the like). However, the FD 91 or the pixel transistor may be shared by a plurality of pixels 50.

Figure 45:
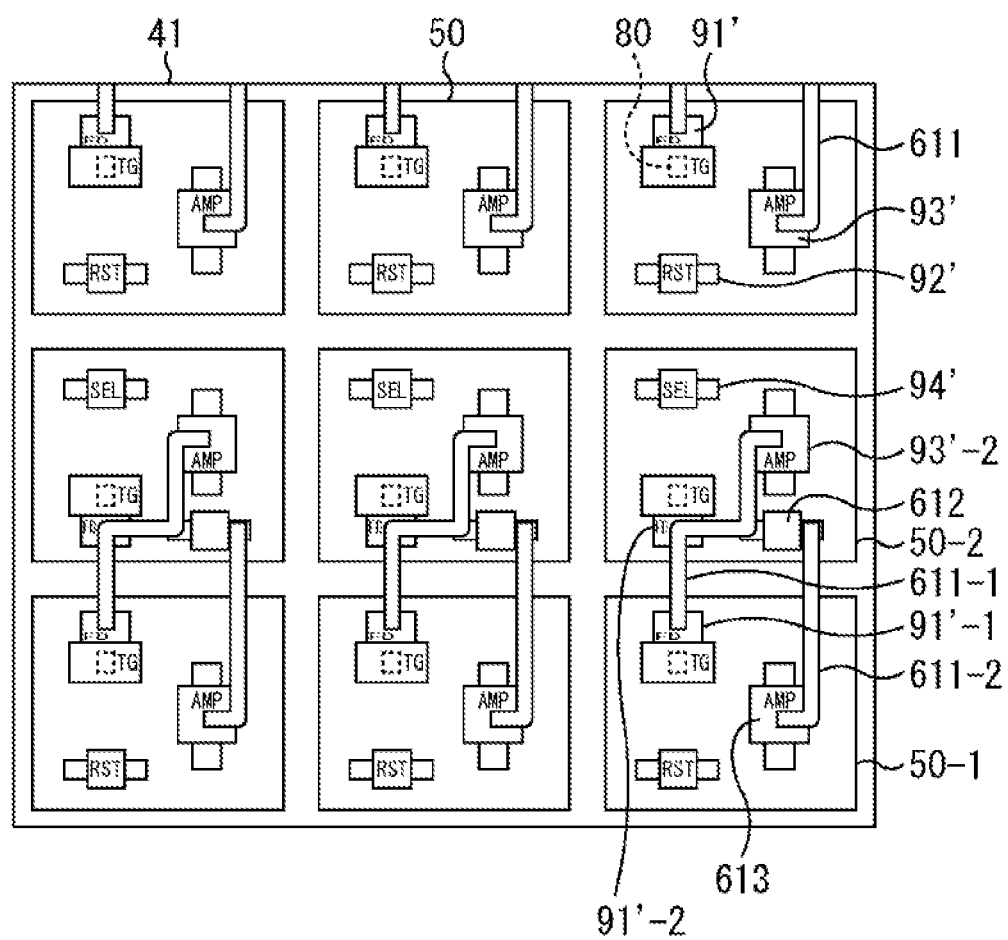

FIG. 45 shows a plan view in a case where two pixels 50 adjacent to each other in a vertical direction share the FD 91 and the pixel transistor.

In the example shown in FIG. 45, for example, the lower-right pixel 50-1 and the pixel 50-2 located above the pixel 50-1 share the FD 91 and the pixel transistor. An FD 91'-1 of the pixel 50-1, an FD 91'-2 of the pixel 50-2, a conversion efficiency switching transistor 612, and an amplifier transistor 93'-2 of the pixel 50-2 are connected by a means of a wire 611-1.

Further, a MOS capacitor 613 of the pixel 50-1 and a conversion efficiency switching transistor 612 of the pixel 50-2 are connected by means of a wire 611-2.

When the sharing structure is applied as described above, the number of elements per pixel decreases and an occupation area in each pixel is sufficiently large. Thus, the conversion efficiency switching transistor 612 and the MOS capacitor 613 to be added to the FD 91' can be provided.

The conversion efficiency switching transistor 612 can switch to high conversion efficiency for an application intended to enhance a sensitivity output and switch to low conversion efficiency for an application intended to increase the saturation charge amount Qs.

The MOS capacitor 613 added to the FD 91' can increase the FD capacity. Therefore, the low conversion efficiency can be achieved, and thus, the saturation charge amount Qs can be increased.

<Other Modifications>

The first to twentieth embodiments can also be applied to a pixel 50 formed by stacking a plurality of substrates as described below, for example.

<Configuration Example of Stacked-Type Solid-State Imaging Device to which Technology According to Present Disclosure can be Applied>

Figure 46:
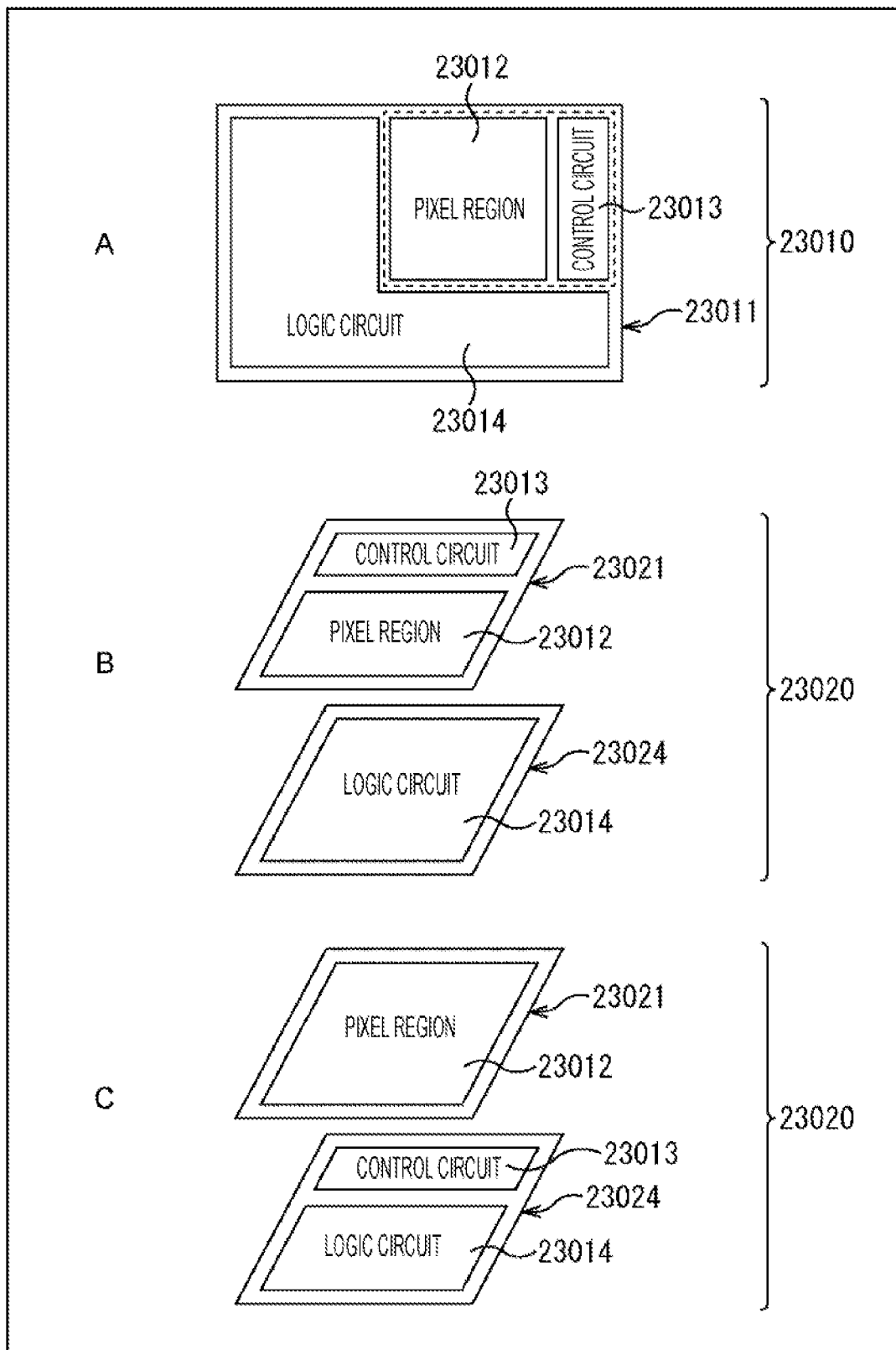
FIG. 46 is a diagram showing the outline of a configuration example of a stacked-type solid-state imaging device to which the technology according to the present disclosure can be applied.

FIG. 46 is a diagram showing the outline of a configuration example of a stacked-type solid-state imaging device to which the technology according to the present disclosure can be applied.

A of FIG. 46 shows a schematic configuration example of a non-stacked-type solid-state imaging device. As shown in A of FIG. 46, a solid-state imaging device 23010 includes a single die (semiconductor substrate) 23011. This die 23011 has a pixel region 23012 in which pixels are arranged in an array, and is mounted with a control circuit 23013 that controls driving of the pixels and performs other various kinds of control, and a logic circuit 23014 for signal processing.

B and C of FIG. 46 show schematic configuration examples of a stacked-type solid-state imaging device. As shown in B and C of FIG. 46, in a solid-state imaging device 23020, two dies, a sensor die 23021 and a logic die 23024, are stacked and electrically connected to each other. In this manner, the solid-state imaging device 23020 is configured as a single semiconductor chip.

In B of FIG. 46, the sensor die 23021 includes the pixel region 23012 and the control circuit 23013, and the logic die 23024 includes the logic circuit 23014 including a signal processing circuit that performs signal processing.

In C of FIG. 46, the sensor die 23021 includes the pixel region 23012, and the logic die 23024 includes the control circuit 23013 and the logic circuit 23014.

Figure 47:
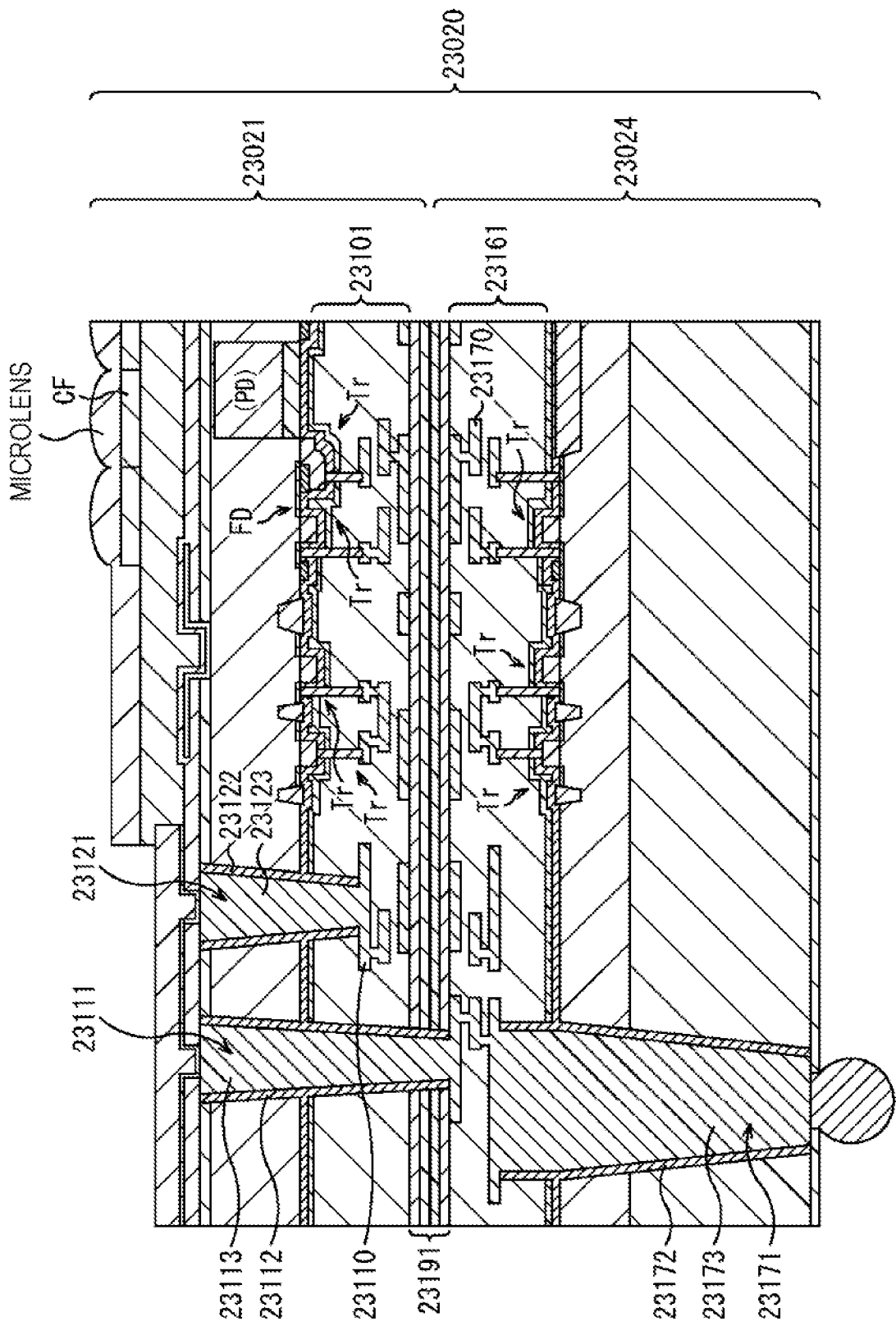
FIG. 47 is a sectional view showing a first configuration example of a stacked-type solid-state imaging device 23020.

FIG. 47 is a sectional view showing a first configuration example of the stacked-type solid-state imaging device 23020.

The sensor die 23021 includes a photodiode (PD), a floating diffusion (FD), and transistors (Tr) (MOSFETs), which constitute a pixel arranged in the pixel region 23012, and Tr and the like which become the control circuit 23013. In addition, a wiring layer 23101 is formed in the sensor die 23021. The wiring layer 23101 includes a plurality of layers, in this example, three layers of wires 23110. Note that the control circuit 23013 (Tr that becomes the control circuit 23013) can be formed in the logic die 23024 instead of in the sensor die 23021.

The logic die 23024 includes Tr constituting the logic circuit 23014. Further, the logic die 23024 includes a wiring layer 23161 having a plurality of layers, in this example, three layers of wires 23170. Further, in the logic die 23024, a connection hole 23171 is formed. The connection hole 23171 has an insulating film 23172 formed on an inner wall surface thereof. A connection conductor 23173 to be connected to the wire 23170 and the like is embedded in the connection hole 23171.

The sensor die 23021 and the logic die 23024 are bonded to each other such that the wiring layers 23101 and 23161 thereof face each other. Accordingly, the stacked-type solid-state imaging device 23020 in which the sensor die 23021 and the logic die 23024 are stacked is formed. A film 23191 such as a protective film is formed in a face on which the sensor die 23021 and the logic die 23024 are bonded to each other.

The sensor die 23021 is formed with a connection hole 23111 which penetrates the sensor die 23021 from the back surface side (from the side where light enters toward the PD)

(upper side) of the sensor die 23021 and reaches the wire 23170 in the uppermost layer in the logic die 23024. In addition, the sensor die 23021 is formed with a connection hole 23121 which is located in proximity to the connection hole 23111 and reaches the wire 23110 in the first layer from the back surface side of the sensor die 23021. An insulating film 23112 is formed on the inner wall surface of the connection hole 23111, and an insulating film 23122 is formed on the inner wall surface of the connection hole 23121. Then, connection conductors 23113 and 23123 are embedded in the connection holes 23111 and 23121, respectively. The connection conductor 23113 and the connection conductor 23123 are electrically connected on the back surface side of the sensor die 23021. Thus, the sensor die 23021 and the logic die 23024 are electrically connected to each other via the wiring layer 23101, the connection hole 23121, the connection hole 23111, and the wiring layer 23161.

Figure 48:
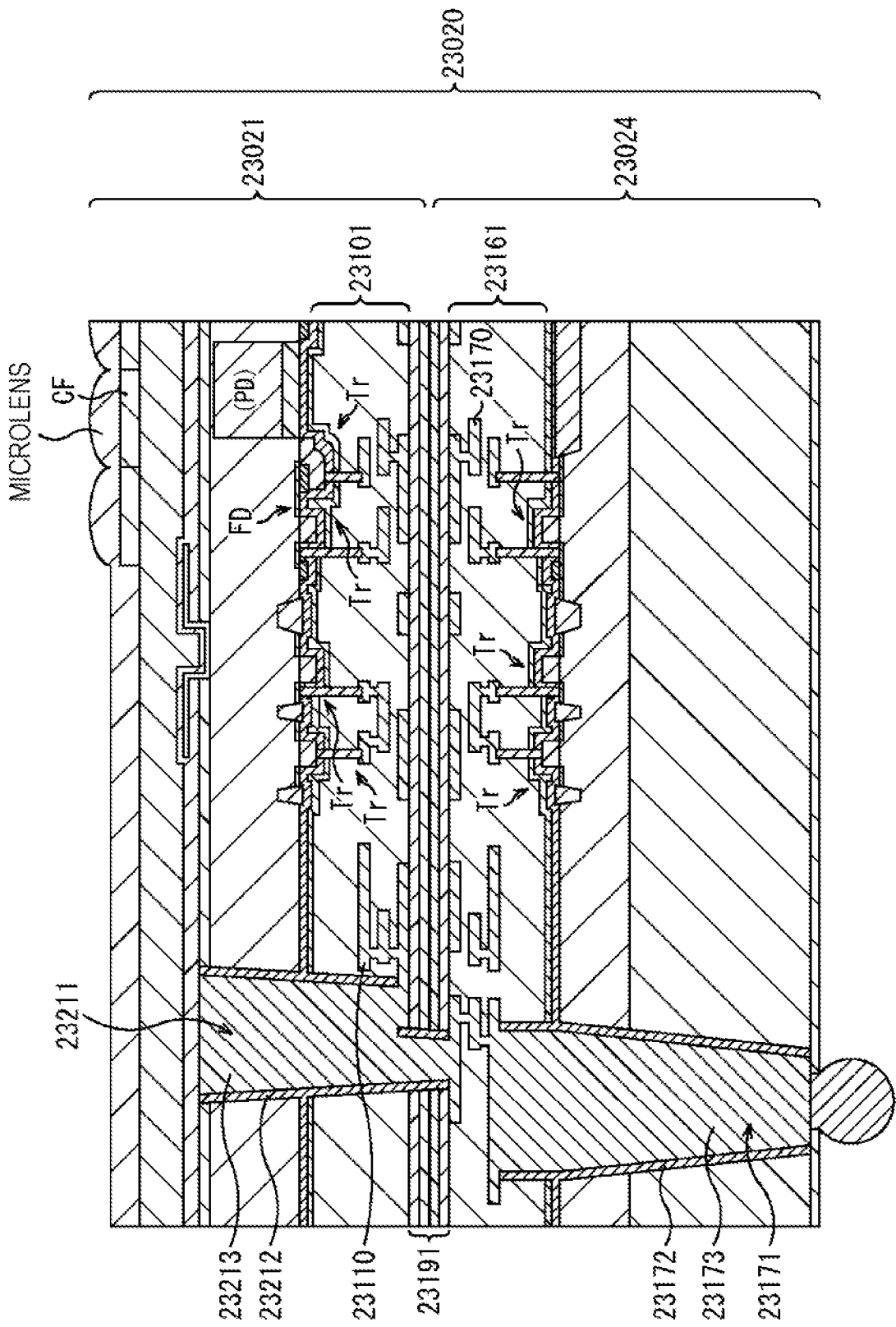
FIG. 48 is a sectional view showing a second configuration example of the stacked-type solid-state imaging device 23020.

FIG. 48 is a sectional view showing a second configuration example of the stacked-type solid-state imaging device 23020.

In the second configuration example of the solid-state imaging device 23020, the sensor die 23021 ((the wire 23110) of the wiring layer 23101 of the sensor die 23021) and the logic die ((the wire 23170) of the wiring layer 23161 of the logic die 23024) are electrically connected to each other via a single connection hole 23211 formed in the sensor die 23021.

That is, in FIG. 48, the connection hole 23211 penetrates the sensor die 23021 from the back surface side of the sensor die 23021 and reaches the wire 23170 in the uppermost layer in the logic die 23024 and the wire 23110 in the uppermost layer in the sensor die 23021. An insulating film 23212 is formed on the inner wall surface of the connection hole 23211, and a connection conductor 23213 is embedded in the connection hole 23211. In FIG. 47 described above, the sensor die 23021 and the logic die 23024 are electrically connected to each other through the two connection holes 23111 and 23121. On the other hand, in FIG. 48, the sensor die 23021 and the logic die 23024 are electrically connected to each other through the single connection hole 23211.

Figure 49:
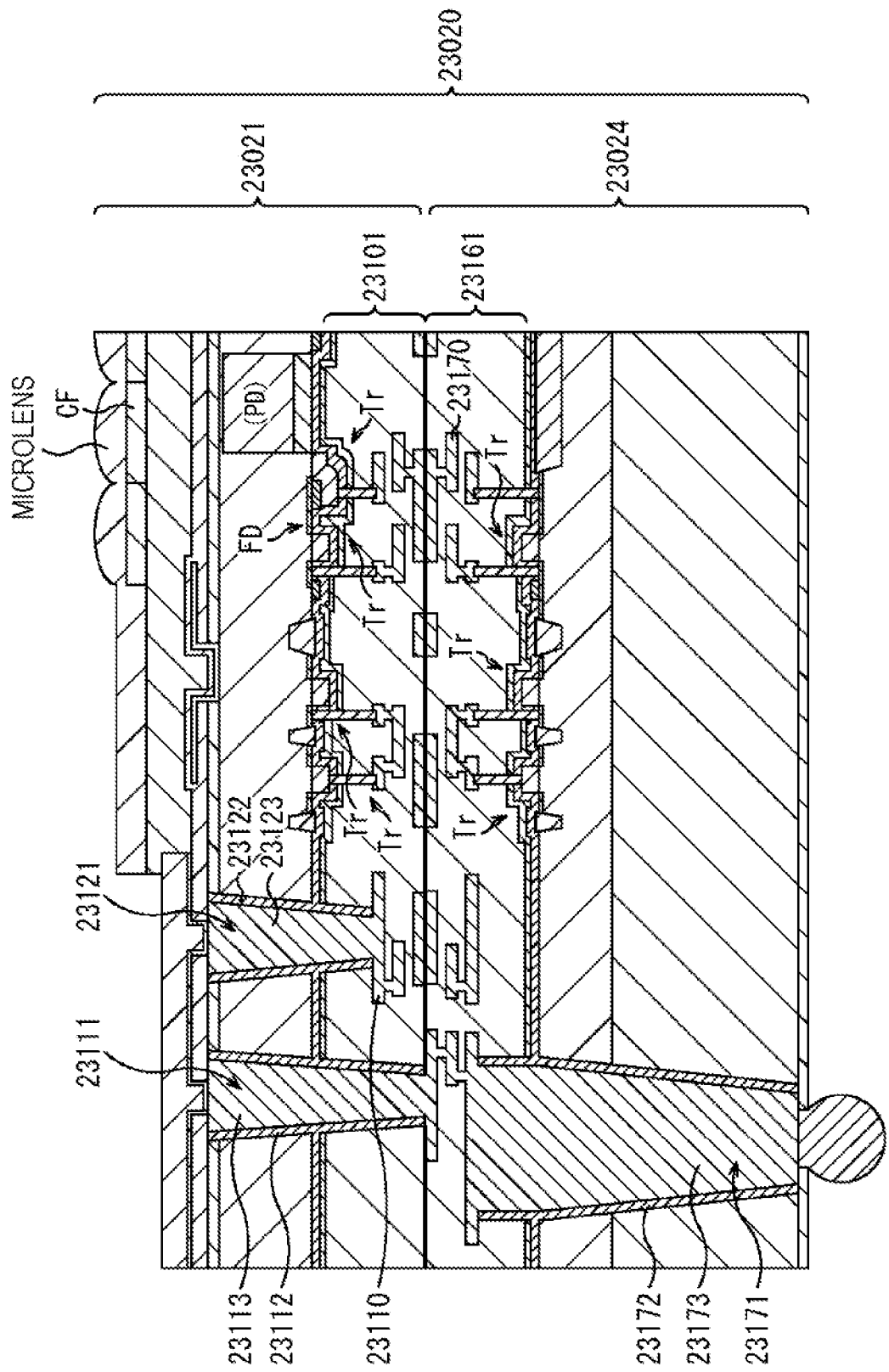
FIG. 49 is a sectional view showing a third configuration example of the stacked-type solid-state imaging device 23020.

FIG. 49 is a sectional view showing a third configuration example of the stacked-type solid-state imaging device 23020.

The solid-state imaging device 23020 shown in FIG. 49 does not include the film 23191 such as a protective film on the surface where the sensor die 23021 and the logic die 23024 are bonded to each other, and thus, is different from the configuration shown in FIG. 47 in which the film 23191 such as a protective film is formed in the surface where the sensor die 23021 and the logic die 23024 are bonded to each other.

The solid-state imaging device 23020 shown in FIG. 49 is formed in the manner described below. Specifically, the sensor die 23021 and the logic die 23024 are superimposed on each other such that the wires 23110 and 23170 are in direct contact with each other. Then, the wires 23110 and 23170 are directly joined with each other by heating the wires 23110 and 23170 while applying a necessary pressure.

Figure 50:
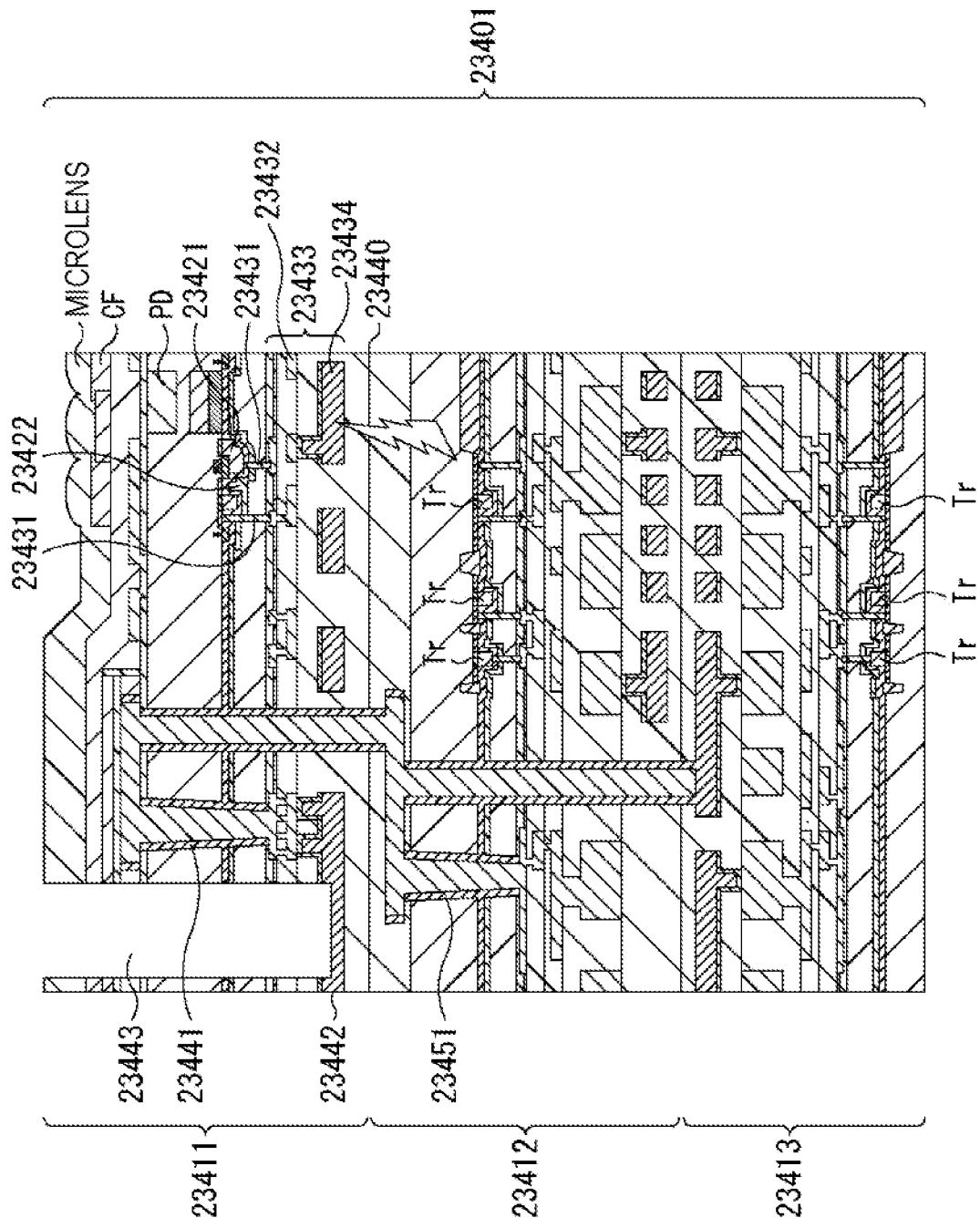
FIG. 50 is a sectional view showing another configuration example of the stacked-type solid-state imaging device to which the technology according to the present disclosure can be applied.

FIG. 50 is a sectional view showing another configuration example of the stacked-type solid-state imaging device to which the technology according to the present disclosure can be applied.

In FIG. 50, a solid-state imaging device 23401 has a three-layer stack structure in which three dies, that is, a sensor die 23411, a logic die 23412, and a memory die 23413, are stacked.

The memory die 23413 includes a memory circuit that stores data temporarily necessary in signal processing performed in the logic die 23412, for example.

In FIG. 50, the logic die 23412 and the memory die 23413 are stacked in this order below the sensor die 23411. However, the logic die 23412 and the memory die 23413 may be stacked below the sensor die 23411 in inverse order, i.e., in the order of the memory die 23413 and the logic die 23412.

Note that, in FIG. 50, a PD that serves as a photoelectric conversion section of the pixel and source/drain regions of pixel Trs are formed in the sensor die 23411.

A gate electrode is formed around the PD via a gate insulating film, and a pixel Tr 23421 and a pixel Tr 23422 are formed by the gate electrode and the paired source/drain regions.

The pixel Tr 23421 adjacent to the PD serves as a transfer Tr, and one of the paired source and drain regions that constitute the pixel Tr 23421 serves as an FD.

Further, an interlayer insulating film is formed in the sensor die 23411, and a connection hole is formed in the interlayer insulating film. In the connection hole, connection conductors 23431 connected to the pixel Tr 23421 and the pixel Tr 23422 are formed.

Further, the sensor die 23411 is provided with a wiring layer 23433 having a plurality of layers of wires 23432 connected to the respective connection conductors 23431.

Moreover, an aluminum pad 23434 serving as an electrode for external connection is formed on the lowermost layer of the wiring layer 23433 of the sensor die 23411. That is, in the sensor die 23411, the aluminum pad 23434 is formed at a position closer to a bonding surface 23440 with the logic die 23412 with respect to the wires 23432. The aluminum pad 23434 is used as one end of a wire involved with input/output of signals into/from outside.

Further, the sensor die 23411 is formed with a contact 23441 used for electrical connection with the logic die 23412. The contact 23441 is connected to a contact 23451 of the logic die 23412 and also connected to an aluminum pad 23442 of the sensor die 23411.

Further, the sensor die 23411 is formed with a pad hole 23443 that reaches the aluminum pad 23442 from the back surface side (upper side) of the sensor die 23411.

The technology according to the present disclosure can be applied to the solid-state imaging device as described above.

<Example of Application to Internal Information Acquisition System>

The technology according to the present disclosure (present technology) can be applied to various products. For example, the technology according to the present disclosure may be applied to an endoscopic surgery system.

Figure 51:
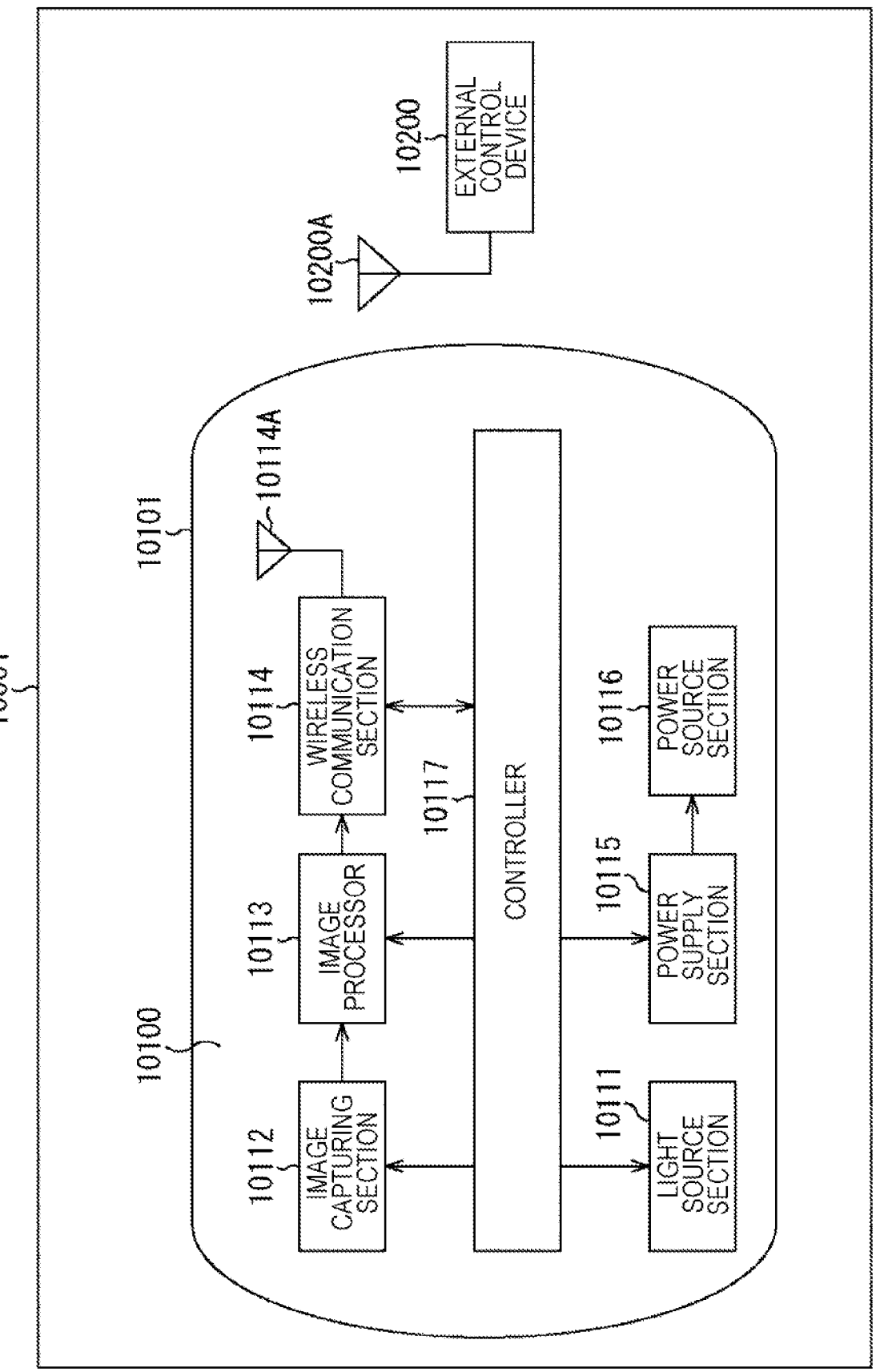
FIG. 51 is a block diagram showing an example of a schematic configuration of an internal information acquisition system.

FIG. 51 is a block diagram showing an example of a schematic configuration of a system for acquiring internal information of a patient using an endoscopic capsule, to which the technology (the present technology) according to the present disclosure may be applied.

An internal information acquisition system 10001 includes an endoscopic capsule 10100 and an external control device 10200.

The endoscopic capsule 10100 is swallowed by a patient during an inspection. The endoscopic capsule 10100 has an image capture function and a wireless communication function. The endoscopic capsule 10100 sequentially captures images (hereinafter also referred to as internal images) of the interior of organs such as the stomach and the intestines at predetermined intervals, and sequentially transmits information regarding the internal images to the external control device 10200 outside the body in a wireless manner, while moving through the interior of the relevant organs by peristaltic movement or the like until being excreted naturally from the patient.

The external control device 10200 centrally controls the operation of the internal information acquisition system 10001. Further, the external control device 10200 receives information about the internal images transmitted from the endoscopic capsule 10100, and generates image data for displaying the internal images on a display device (not illustrated) on the basis of the received information about the internal images.

In this way, with the internal information acquisition system 10001, images indicating the patient's internal conditions can be obtained continually from the time the endoscopic capsule 10100 is swallowed to the time the endoscopic capsule 10100 is excreted.

The configurations and functions of the endoscopic capsule 10100 and the external control device 10200 will be described in further detail.

The endoscopic capsule 10100 includes a capsule-shaped housing 10101, and includes a light source section 10111, an image capturing section 10112, an image processor 10113, a wireless communication section 10114, a power supply section 10115, a power source section 10116, and a controller 10117 which are housed in the capsule-shaped housing 10101.

The light source section 10111 includes a light source such as a light-emitting diode (LED), for example, and irradiates the imaging field of the image capturing section 10112 with light.

The image capturing section 10112 includes an imaging element, and an optical system including multiple lenses provided in front of the imaging element. Reflected light (hereinafter referred to as observation light) of light emitted toward a body tissue which is an observation target is condensed by the optical system and enters the imaging element. The image capturing section 10112 photoelectrically converts the observation light entering the imaging element, and generates an image signal corresponding to the observation light. The image signal generated by the image capturing section 10112 is provided to the image processor 10113.

The image processor 10113 includes a processor such as a central processing unit (CPU) or a graphics processing unit (GPU), and performs various kinds of signal processing on the image signal generated by the image capturing section 10112. The image processor 10113 provides the image signal subjected to signal processing to the wireless communication section 10114 as RAW data.

The wireless communication section 10114 performs a predetermined process such as a modulation process on the image signal that has been subjected to signal processing by the image processor 10113, and transmits the resultant image signal to the external control device 10200 via an antenna 10114A. In addition, the wireless communication section 10114 receives, from the external control device 10200, a control signal related to drive control of the endoscopic capsule 10100 via the antenna 10114A. The wireless communication section 10114 provides the control signal received from the external control device 10200 to the controller 10117.

The power supply section 10115 includes an antenna coil for receiving power, a power regeneration circuit for regenerating power from a current produced in the antenna coil, a booster circuit, and the like. In the power supply section 10115, the principle of what is called contactless charging is used to generate power.

The power source section 10116 includes a secondary battery, and stores power generated by the power supply section 10115. Although arrows or the like indicating the destination to which power from the power source section 10116 is supplied are not illustrated in FIG. 51 for preventing the illustration from being complex, power stored in the power source section 10116 is supplied to the light source section 10111, the image capturing section 10112, the image processor 10113, the wireless communication section 10114, and the controller 10117, and may be used to drive these sections.

The controller 10117 includes a processor such as a CPU, and appropriately controls drives of the light source section 10111, the image capturing section 10112, the image processor 10113, the wireless communication section 10114, and the power supply section 10115 in accordance with a control signal transmitted from the external control device 10200.

The external control device 10200 may be a processor such as a CPU or GPU, or a device such as a microcomputer or a control board on which a processor and a storage element such as a memory are mounted. The external control device 10200 controls the operation of the endoscopic capsule 10100 by transmitting a control signal to the controller 10117 of the endoscopic capsule 10100 via an antenna 10200A. In the endoscopic capsule 10100, for example, a light irradiation condition under which the light source section 10111 irradiates an observation target with light may be changed by a control signal from the external control device 10200. In addition, an image capturing condition (such as a frame rate and an exposure level in the image capturing section 10112, for example) may be changed by a control signal from the external control device 10200. In addition, the content of processing in the image processor 10113 and a condition (such as a transmission interval and the number of images to transmit, for example) under which the wireless communication section 10114 transmits the image signal may be changed by a control signal from the external control device 10200.

In addition, the external control device 10200 performs various types of image processing on the image signal transmitted from the endoscopic capsule 10100, and generates image data for displaying a captured internal image on a display device. As the image processing, various known signal processing may be performed, such as a development process (demosaicing process), an image quality-improving process (such as a band enhancement process, a super-resolution process, a noise reduction (NR) process, and/or a shake correction process), and/or an enlargement process (electronic zoom process). The external control device 10200 controls the drive of the display device, and causes the display device to display a captured internal image on the basis of the generated image data. Alternatively, the external control device 10200 may also cause a recording device (not shown) to record the generated image data, or cause a printing device (not shown) to make a printout of the generated image data.

An example of the internal information acquisition system to which the technology according to the present disclosure can be applied has been described above. The technology according to the present disclosure can be applied to the image capturing section 10112 in the configuration described above.

<Example of Application to Mobile Object>

The technology according to the present disclosure (present technology) can be applied to various products. For example, the technology according to the present disclosure may be implemented as a device to be mounted on any type of mobile objects such as vehicles, electric vehicles, hybrid electric vehicles, motorcycles, bicycles, personal mobilities, airplanes, drones, ships, and robots.

Figure 52:
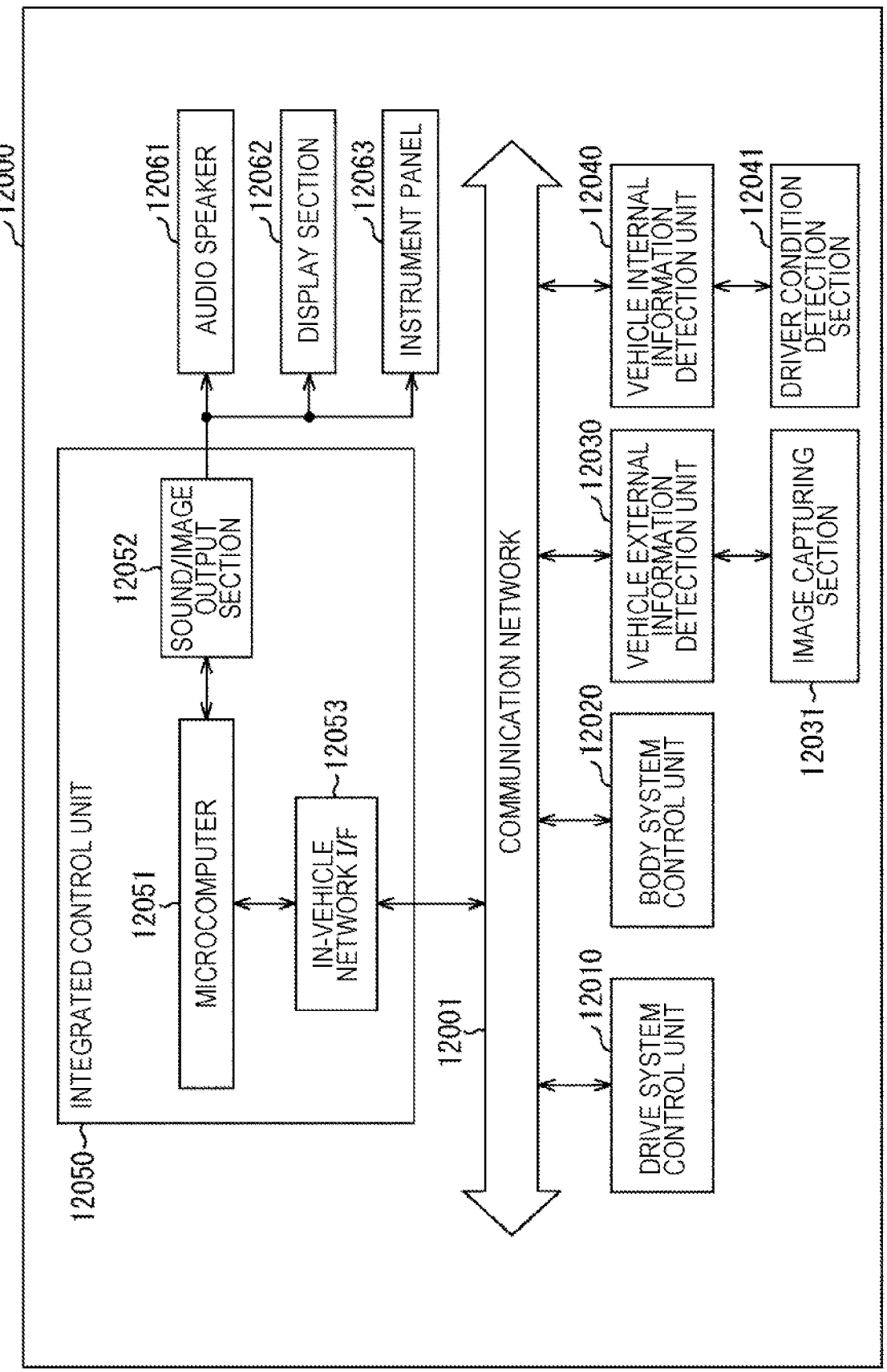
FIG. 52 is a block diagram showing an example of a schematic configuration of a vehicle control system.

FIG. 52 is a block diagram showing a schematic configuration example of a vehicle control system which is an example of a mobile object control system to which the technology according to the present disclosure can be applied.

The vehicle control system 12000 includes a plurality of electronic control units connected to each other via a communication network 12001. In the example shown in FIG. 52, the vehicle control system 12000 includes a drive system control unit 12010, a body system control unit 12020, a vehicle external information detection unit 12030, a vehicle internal information detection unit 12040, and an integrated control unit 12050. Further, as the functional configuration of the integrated control unit 12050, a microcomputer 12051, a sound/image output section 12052, and an in-vehicle network interface (I/F) 12053 are illustrated.

The drive system control unit 12010 controls the operation of devices related to a drive system of a vehicle according to various programs. For example, the drive system control unit 12010 functions as a control device over a driving force generating device such as an internal combustion engine or a driving motor for generating a driving force of the vehicle, a driving force transmission mechanism for transmitting the driving force to wheels, a steering mechanism for adjusting a steering angle of the vehicle, a braking device that generates a braking force of the vehicle, and the like.

The body system control unit 12020 controls operations of various devices mounted on the vehicle body according to various programs. For example, the body system control unit 12020 functions as a keyless entry system, a smart key system, a power window device, or a control device for various lamps such as a headlamp, a backup lamp, a brake lamp, a blinker, or a fog lamp. In this case, the body system control unit 12020 can receive radio waves transmitted from a portable device that can be used as a key or signals from various switches. The body system control unit 12020 receives input of these radio waves or signals, and controls a door lock device, power window device, lamps, and the like of the vehicle.

The vehicle external information detection unit 12030 detects information regarding the outside of the vehicle equipped with the vehicle control system 12000. For example, the vehicle external information detection unit 12030 is connected with an image capturing section 12031. The vehicle external information detection unit 12030 causes the image capturing section 12031 to capture an image outside the vehicle, and receives the captured image data. The vehicle external information detection unit 12030 may perform, on the basis of the received image, a process of detecting an object such as a person, a vehicle, an obstacle, a road sign, or a character on a road surface, or a process of detecting the distance thereto.

The image capturing section 12031 is an optical sensor that receives light and outputs an electric signal corresponding to the amount of received light. The image capturing section 12031 can output an electric signal as an image or as information for distance measurement. Further, the light received by the image capturing section 12031 may be visible light or invisible light such as infrared rays.

The vehicle internal information detection unit 12040 detects information regarding the inside of the vehicle. For example, the vehicle internal information detection unit 12040 is connected with a driver condition detection section 12041 that detects a condition of a driver. The driver condition detection section 12041 may include, for example, a camera that captures an image of the driver. On the basis of detection information input from the driver condition detection section 12041, the vehicle internal information detection unit 12040 may calculate a degree of fatigue of the driver or a degree of concentration of the driver, or may determine whether or not the driver is dozing.

The microcomputer 12051 can calculate a control target value for the driving force generating device, the steering mechanism, or the braking device on the basis of the information about the inside and outside of the vehicle obtained by the vehicle external information detection unit 12030 or the vehicle internal information detection unit 12040, and output a control command to the drive system control unit 12010. For example, the microcomputer 12051 may perform cooperative control intended to implement functions of an advanced driver assistance system (ADAS) which include collision avoidance or shock mitigation for the vehicle, following driving based on distance between vehicles, vehicle speed maintaining driving, a warning of collision of the vehicle, a warning of lane departure of the vehicle, or the like.

In addition, the microcomputer 12051 may perform cooperative control intended for automatic driving, which makes the vehicle to travel autonomously without the need of the operation of the driver, or the like, by controlling the driving force generating device, the steering mechanism, the braking device, or the like on the basis of the information about the surrounding situation of the vehicle obtained by the vehicle external information detection unit 12030 or the vehicle internal information detection unit 12040.

Further, the microcomputer 12051 can output a control command to the body system control unit 12020 on the basis of information about the outside of the vehicle acquired by the vehicle external information detection unit 12030. For example, the microcomputer 12051 may perform cooperative control including controlling the head lamps on the basis of the location of a preceding vehicle or an oncoming vehicle detected by the vehicle external information detection unit 12030 and changing high beams to low beams, for example, for the purpose of anti-glare.

The sound/image output section 12052 transmits at least one of a sound output signal and an image output signal to an output device, which is capable of notifying a passenger of the vehicle or a person outside the vehicle of information visually or auditorily. In the example in FIG. 52, an audio speaker 12061, a display section 12062, and an instrument panel 12063 are shown as examples of the output devices. For example, the display section 12062 may include at least one of an on-board display and a head-up display.

Figure 53:
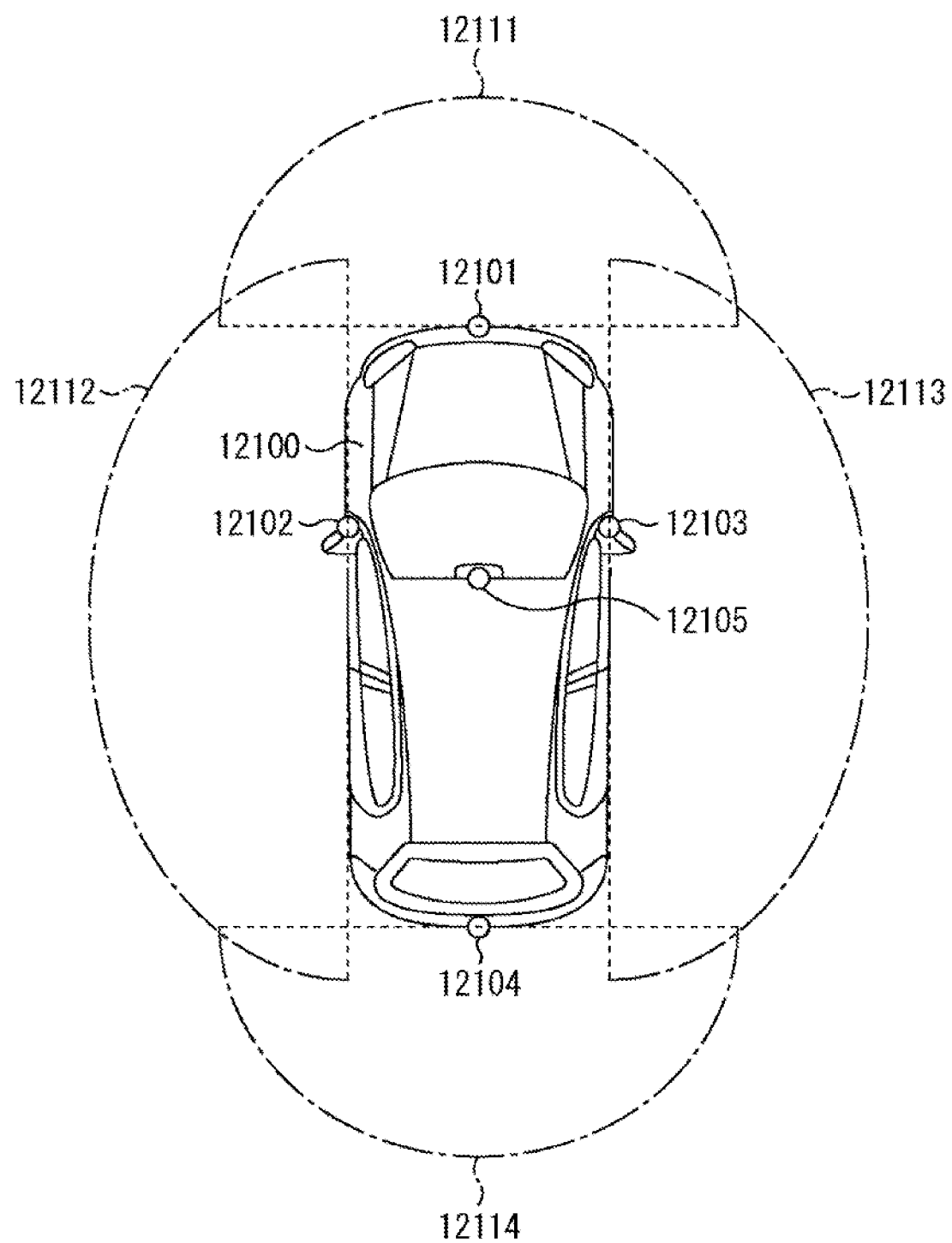
FIG. 53 is an explanatory view showing an example of mounting positions of a vehicle external information detection section and image capturing sections.

FIG. 53 is a diagram showing examples of mounting positions of the image capturing sections 12031.

In FIG. 53, a vehicle 12100 includes, as the image capturing sections 12031, image capturing sections 12101, 12102, 12103, 12104, and 12105.

For example, the image capturing sections 12101, 12102, 12103, 12104, and 12105 are provided at positions such as the front nose, the side-view mirrors, the rear bumper or the back door, and an upper part of the windshield in the cabin of the vehicle 12100. Each of the image capturing section 12101 on the front nose and the image capturing section 12105 on the upper part of the windshield in the cabin mainly obtains an image of an environment in front of the vehicle 12100. The image capturing sections 12102 and 12103 on the side-view mirrors mainly obtain an image of an environment on the side of the vehicle 12100. The image capturing section 12104 provided in the rear bumper or the back door mainly obtains an image of an environment behind the vehicle 12100. The images of the environment in front of the vehicle obtained by the image capturing sections 12101 and 12105 are mainly used for detecting a preceding vehicle, a pedestrian, an obstacle, a traffic light, a traffic sign, a lane, or the like.

Note that FIG. 53 shows examples of photographing ranges of the image capturing sections 12101 to 12104.

The imaging range 12111 indicates the imaging range of the image capturing section 12101 on the front nose, the imaging ranges 12112 and 12113 indicate the imaging ranges of the image capturing sections 12102 and 12103 on the side-view mirrors, respectively, and the imaging range 12114 indicates the imaging range of the image capturing section 12104 on the rear bumper or the back door. For example, a bird's-eye image of the vehicle 12100 as viewed from above can be obtained by superimposing image data captured by the image capturing sections 12101 to 12104.

At least one of the image capturing sections 12101 to 12104 may have a function of obtaining distance information. For example, at least one of the image capturing sections 12101 to 12104 may be a stereo camera including a plurality of imaging elements or an imaging element including pixels for phase difference detection.

For example, the microcomputer 12051 obtains the distance between the vehicle 12100 and each three-dimensional object in the imaging ranges 12111 to 12114 and the temporal change (relative speed to the vehicle 12100) of the distance on the basis of the distance information obtained from the image capturing sections 12101 to 12104, and may extract, as a preceding vehicle, especially a three-dimensional object which is the closest to the vehicle 12100 on the path on which the vehicle 12100 is traveling and which is traveling at a predetermined speed (e.g., 0 km/h or more) in the direction substantially the same as the traveling direction of the vehicle 12100. Further, the microcomputer 12051 may perform autobrake control (including follow-up stop control), automatic acceleration control (including follow-up start-driving control), and the like by presetting a distance to be secured between the vehicle 12100 and a preceding vehicle. In this way, it is possible to perform cooperative control intended to achieve autonomous driving without the need of drivers' operations, and the like.

For example, the microcomputer 12051 may sort three-dimensional object data of three-dimensional objects into motorcycles, standard-size vehicles, large-size vehicles, pedestrians, and the other three-dimensional objects such as utility poles on the basis of the distance information obtained from the image capturing sections 12101 to 12104, extract data, and use the data to automatically avoid obstacles. For example, the microcomputer 12051 sorts obstacles around the vehicle 12100 into obstacles that a driver of the vehicle 12100 can see and obstacles that it is difficult for the driver to see. Then, the microcomputer 12051 determines a collision risk, which indicates a hazard level of a collision with each obstacle. When the collision risk is equal to or higher than a preset value and thus there is a possibility of collision, the microcomputer 12051 may perform driving assistance to avoid a collision by outputting a warning to the driver via the audio speaker 12061 or the display section 12062, or by forcibly reducing the speed or performing collision-avoidance steering via the drive system control unit 12010.

At least one of the image capturing sections 12101 to 12104 may be an infrared camera that detects infrared light. For example, the microcomputer 12051 may recognize a pedestrian by determining whether or not images captured by the image capturing sections 12101 to 12104 include the pedestrian. The method of recognizing a pedestrian includes, for example, a step of extracting feature points in the images captured by the image capturing sections 12101 to 12104 being infrared cameras, and a step of performing a pattern matching process with respect to a series of feature points indicating an outline of an object, to thereby determine whether or not the object is a pedestrian. When the microcomputer 12051 determines that the images captured by the image capturing sections 12101 to 12104 include a pedestrian and recognizes the pedestrian, the sound/image output section 12052 controls the display section 12062 such that a rectangular contour is displayed overlaid on the recognized pedestrian to emphasize the pedestrian. Further, the sound/image output section 12052 may control the display section 12062 such that an icon or the like indicating a pedestrian is displayed at a desired position.

An example of the vehicle control system to which the technology according to the present disclosure can be applied has been described above. The technology according to the present disclosure can be applied to the image capturing section 12031 and the like in the configuration described above.

It should be noted that the embodiments of the present technology are not limited to the abovementioned embodiments, and various modifications can be made without departing from the gist of the present technology.

The present technology may also have the following configurations.

(1)

A solid-state imaging device including:

a photoelectric conversion section that performs photoelectric conversion;

a trench that penetrates a semiconductor substrate in a depth direction and that is formed between the photoelectric conversion sections provided in adjacent pixels; and a PN junction region formed on a sidewall of the trench, the PN junction region including a P-type region and an N-type region, in which the P-type region has a protruding region protruding to a lower side of the N-type region.

(2)

The solid-state imaging device according to (1) described above, in which the protruding region of the P-type region is located in a region between the N-type region and an interface of a substrate in which the photoelectric conversion section is formed.

(3)

The solid-state imaging device according to (1) or (2) described above, in which the P-type region and the N-type region are solid-phase diffusion layers.

(4)

The solid-state imaging device according to any one of (1) to (3) described above, in which a P-type region is also formed on a light entrance surface side of the photoelectric conversion section.

(5)

An electronic apparatus equipped with a solid-state imaging device, the solid-state imaging device including:

a photoelectric conversion section that performs photoelectric conversion;

a trench that penetrates a semiconductor substrate in a depth direction and that is formed between the photoelectric conversion sections provided in adjacent pixels; and a PN junction region formed on a sidewall of the trench, the PN junction region including a P-type region and an N-type region, in which the P-type region has a protruding region protruding to a lower side of the N-type region.

(6)

A solid-state imaging device including:

an inorganic photoelectric conversion section having a pn junction, and an organic photoelectric conversion section having an organic photoelectric conversion film, the inorganic photoelectric conversion section and the organic photoelectric conversion section being stacked in a depth direction from a light-receiving surface side within a same pixel; and a PN junction region formed on a sidewall of the inorganic photoelectric conversion section, the PN junction region including a P-type region and an N-type region.

(7)

The solid-state imaging device according to (6) described above, further including: a first color organic photoelectric conversion section; a second color inorganic photoelectric conversion section; and a third color inorganic photoelectric conversion section, the first color organic photoelectric conversion section, the second color inorganic photoelectric conversion section, and the third color inorganic photoelectric conversion section being stacked in a vertical direction, in which each of the second color inorganic photoelectric conversion section and the third color inorganic photoelectric conversion section includes the PN junction region.

(8)

The solid-state imaging device according to (7) described above, in which the P-type region formed in the second color inorganic photoelectric conversion section and the P-type region formed in the third color inorganic photoelectric conversion section are continuously formed, and the N-type region formed in the second color inorganic photoelectric conversion section and the N-type region formed in the third color inorganic photoelectric conversion section are individually formed in the corresponding inorganic photoelectric conversion sections.

(9)

An electronic apparatus equipped with a solid-state imaging device, the solid-state imaging device including:

an inorganic photoelectric conversion section having a pn junction, and an organic photoelectric conversion section having an organic photoelectric conversion film, the inorganic photoelectric conversion section and the organic photoelectric conversion section being stacked in a depth direction from a light-receiving surface side within a same pixel; and a PN junction region formed on a sidewall of the inorganic photoelectric conversion section, the PN junction region including a P-type region and an N-type region.

(10)

A solid-state imaging device including:

a photoelectric conversion section that performs photoelectric conversion;

a trench formed in a semiconductor substrate without penetrating the semiconductor substrate;

a PN junction region formed on a sidewall of the trench, the PN junction region including a first P-type region and an N-type region; and a second P-type region formed on a light-receiving surface side of the photoelectric conversion section.

(11)

The solid-state imaging device according to (10) described above, in which the first P-type region and the N-type region are solid-phase diffusion layers.

(12)

The solid-state imaging device according to (10) or (11) described above, in which an active region is formed between the trench and an interface of the semiconductor substrate.

(13)

The solid-state imaging device according to any one of (10) to (12) described above, further including a plurality of elements, in which a rectangular shape surrounding a region where the plurality of elements is disposed and a shape of the trench surrounding the photoelectric conversion section are shifted from each other by 45 degrees.

(14)

The solid-state imaging device according to any one of (10) to (13) described above, in which the photoelectric conversion section has a shape in which a side surface is increased, and the PN junction region is formed on the side surface.

(15)

An electronic apparatus equipped with a solid-state imaging device, the solid-state imaging device including:

a photoelectric conversion section that performs photoelectric conversion;

a trench formed in a semiconductor substrate without penetrating the semiconductor substrate;

a PN junction region formed on a sidewall of the trench, the PN junction region including a first P-type region and an N-type region; and a second P-type region formed on a light-receiving surface side of the photoelectric conversion section.

REFERENCE SIGNS LIST

10 Imaging device
12 Imaging element
41 Pixel array section
50 Pixel
70 Si substrate
71 PD
72 P-type region
74 Light-shielding film
76 OCL
77 Active region
75 Backside Si interface
78 STI
81 Vertical transistor trench
82 DTI
83 P-type solid-phase diffusion layer
84 N-type solid-phase diffusion layer 85 Sidewall film
86 Filler
101 Film
121 P-type region
122 N-type region
131 MOS capacitor
151 Well contact section
152 Contact
153 Cu wire
211 N-type region
231 Separation prevention region
301 Surface
302 Multi-layer wiring layer
303 organic photoelectric conversion section
304 Inorganic photoelectric conversion section
305 Inorganic photoelectric conversion section
306 Surface
307 Lower electrode
308 Upper electrode
309 Organic photoelectric conversion layer
310 Conductive plug
311 Conductive plug
312 Interlayer insulating film
313 Interlayer insulating film
314 Conductive plug
315 Conductive plug
316 Wiring layer
317 Wiring layer
318 Insulating film
319 Wiring layer
320 Protective film
321 P-type region
322 Contact metal layer
323 Green power storage layer
324 Silicon layer
351 Strong electric field region
352 N-type solid-phase diffusion layer
354 Protective resist
361 P-type solid-phase diffusion layer
362 N-type solid-phase diffusion layer
362-1 N-type solid-phase diffusion layer
362-2 N-type solid-phase diffusion layer
363 Filler
371 P-type vertical isolation region
381 PSG film
382 Impurity region
383 PSG film
384 Protective resist
385 Impurity region
386 BSG film
391 Stopper film
392 PSG film
393 Impurity region
411 Rectangle
421 BEOL substrate
422 FEOL substrate
423 Silicon substrate
424 Support substrate
431 Pwell region
451 Silicon substrate
452 Support substrate
453 FEOL substrate
454 BEOL substrate
455 Support substrate
471 Silicon substrate
472 Silicon film
473 FEOL substrate
474 BEOL substrate
475 Support substrate
501 AL pad extraction section
502 AL pad
503 Solid-phase diffusion trench
511 Peripheral circuit section
512 P+ diffusion layer
513 Pwell region
514 Backside contact
515 Hole layer
521 Peripheral circuit section
532 Pwell region
571 Peripheral circuit section
572 Boundary section
611 FD wire
612 Conversion efficiency switching transistor
613 MOS capacitor

The invention claimed is:

1. A solid-state imaging device comprising:
a photoelectric conversion section that performs photoelectric conversion;
a trench that penetrates a semiconductor substrate in a depth direction and that is formed between the photoelectric conversion sections provided in adjacent pixels; and
a PN junction region formed on a sidewall of the trench, the PN junction region including a P-type region and an N-type region,
wherein the P-type region has a protruding region protruding to a lower side of the N-type region.

2. The solid-state imaging device according to claim 1, wherein the protruding region of the P-type region is located in a region between the N-type region and an interface of a substrate in which the photoelectric conversion section is formed.

3. The solid-state imaging device according to claim 1, wherein the P-type region and the N-type region are solid-phase diffusion layers.

4. The solid-state imaging device according to claim 1, wherein a P-type region is also formed on a light entrance surface side of the photoelectric conversion section.

5. An electronic apparatus equipped with a solid-state imaging device,
the solid-state imaging device comprising:
a photoelectric conversion section that performs photoelectric conversion;
a trench that penetrates a semiconductor substrate in a depth direction and that is formed between the photoelectric conversion sections provided in adjacent pixels; and
a PN junction region formed on a sidewall of the trench, the PN junction region including a P-type region and an N-type region,
wherein the P-type region has a protruding region protruding to a lower side of the N-type region.

* * * * *